United States Patent
Xue et al.

(10) Patent No.: US 10,177,430 B2
(45) Date of Patent: Jan. 8, 2019

(54) APPARATUS AND A METHOD FOR ELECTROMAGNETIC SIGNAL TRANSITION

(71) Applicant: City University of Hong Kong, Kowloon (HK)

(72) Inventors: Quan Xue, New Territories (HK); Peng Wu, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 816 days.

(21) Appl. No.: 14/280,003

(22) Filed: May 16, 2014

(65) Prior Publication Data
US 2015/0333726 A1    Nov. 19, 2015

(51) Int. Cl.
| | |
|---|---|
| H01P 5/10 | (2006.01) |
| H01P 5/08 | (2006.01) |
| H03H 7/42 | (2006.01) |
| H03H 7/38 | (2006.01) |
| H01P 1/383 | (2006.01) |
| H01P 3/12 | (2006.01) |
| H01P 5/107 | (2006.01) |

(52) U.S. Cl.
CPC ............ *H01P 5/087* (2013.01); *H01P 1/383* (2013.01); *H01P 3/121* (2013.01); *H01P 5/10* (2013.01); *H01P 5/107* (2013.01); *H01P 5/1015* (2013.01); *H03H 7/38* (2013.01); *H03H 7/42* (2013.01)

(58) Field of Classification Search
CPC ........... H01P 5/107; H01P 5/182; H01P 3/121
USPC ............. 333/26, 112, 239; 343/767; 398/81
See application file for complete search history.

(56) References Cited

U.S. PATENT DOCUMENTS

| | | | |
|---|---|---|---|
| 2009/0220240 A1* | 9/2009 | Abhari | B82Y 20/00 398/81 |
| 2010/0245204 A1* | 9/2010 | Lee | H01Q 9/0407 343/860 |

OTHER PUBLICATIONS

J. F. Xu, et al, "140-GHz TE20-mode dielectricloaded SIW slot antenna array in LTCC," IEEE Trans. Antennas Propag., vol. 61, No. 4, pp. 1784-1793, 2013.
J. F. Xu, et al, "A single-layer SIW slot array antenna with TE20 mode," Proceedings of the Asia-Pacific Microware Conference, pp. 1330-1333, 2011.
Y. J. Cheng, et al, "Design of a monopulse antenna using a dual Vtype linearly tapered slot antenna (DVLTSA)," IEEE Trans. Antennas Propag., vol. 56, No. 9, pp. 2903-2909, Sep. 2008.
(Continued)

*Primary Examiner* — Benny Lee
*Assistant Examiner* — Hafizur Rahman
(74) *Attorney, Agent, or Firm* — Renner Kenner Greive Bobak Taylor & Weber

(57) ABSTRACT

An apparatus and a method for electromagnetic signal transition, comprising the steps of receiving an electromagnetic signal having a first physical characteristic arranged to be compatible for the electromagnetic signal to be transmitted on a transmission structure, and transmitting the electromagnetic signal to a substrate integrated waveguide, wherein during the transmission of the electromagnetic signal to the substrate integrated waveguide, the first physical characteristic is converted to a second physical characteristic arranged to be compatible for the electromagnetic signal to be transmitted on the substrate integrated waveguide.

35 Claims, 56 Drawing Sheets
(17 of 56 Drawing Sheet(s) Filed in Color)

(56) References Cited

OTHER PUBLICATIONS

A. Suntives, et al. "Design and application of multimode substrate integrated waveguides in parallel multichannel signaling system," IEEE Trans, Microw. Theory Tech., vol. 57 No. 6, pp. 1563-1571, Jun. 2009.

F. Xu, et al, "Periodic leaky-wave antenna for millimeter wave applications based on substrate integrated waveguide," IEEE Trans, Microw. Theory Tech., vol. 58, No. 2, pp. 340-347, Feb. 2010.

X. Y. Cheng, "Hybrid mode radiation in patch antenna loaded with corrugated electric via arrays," 2011 IEEE International Symposium on Antennas and Propagation, pp. 2080-2082, 2011.

S. Matsumoto, et al, "A TE10-TE20 mode transducer utilizing a ring-angled corner and its application to a compact H-plane outof-phase power divider," 2009 Asia-Pacific Microwave Conf Proc. pp. 1008-1011, Dec. 2009.

Y. Kokubo, "Frequency range dependent TE10 to TE20 mode converter," Microware and Optical Technology Letters, vol. 52, No. 1, pp. 169-171, Jan. 2010.

H. Ikeuchi, et al, "A novel TE10-TE20 mode transducer utilizing vertical cross-excitation," 2010 IEEE MTT-S International, pp. 1564-1567, 2010.

\* cited by examiner

APPARATUS AND A METHOD FOR ELECTROMAGNETIC SIGNAL TRANSITION

TECHNICAL FIELD

The present invention relates to an apparatus and a method for electromagnetic signal transition, and particular, although not exclusively, to a method and an apparatus for electromagnetic signal transition for a substrate integrated waveguide higher order modes.

BACKGROUND

A waveguide is a structure that guides waves, such as electromagnetic waves. These electromagnetic waves may be transmitted as an electromagnetic signal in an electronic device or between two or more electronic devices in a communication network.

Substrate integrated waveguide (SIW), alternatively named laminated waveguide, or post-wall waveguide, exhibits many good features in the various applications of filters, power dividers/combiners, couplers and antennas. The transition between SIW and other transmission lines is a very important for SIW component because of measurement purpose and component integration requirements.

SUMMARY

In accordance with a first aspect of the present invention, there is provided a method for electromagnetic signal transition, comprising the steps of:
  receiving an electromagnetic signal having a first physical characteristic arranged to be compatible for the electromagnetic signal to be transmitted on a transmission structure; and
  transmitting the electromagnetic signal to a substrate integrated waveguide, wherein during the transmission of the electromagnetic signal to the substrate integrated waveguide, the first physical characteristic is converted to a second physical characteristic arranged to be compatible for the electromagnetic signal to be transmitted on the substrate integrated waveguide.

In an embodiment of the first aspect, the first physical characteristic and the second physical characteristic is a polarization and/or a field distribution of the electromagnetic signal.

In an embodiment of the first aspect, the electromagnetic signal is excited and/or transmitted in a higher-order transverse electric mode.

In an embodiment of the first aspect, the polarization of the electromagnetic signal is converted from a first polarization to a second polarization perpendicular to the first polarization.

In an embodiment of the first aspect, the substrate integrated waveguide comprises a first metal sheet positioned at a first side of a substrate, and a second metal sheet positioned at a second side opposite to the first side of the substrate.

In an embodiment of the first aspect, the first metal sheet comprises at least one slot thereon.

In an embodiment of the first aspect, the at least one slot is positioned along a mid line in a longitudinal direction of the first metal sheet.

In an embodiment of the first aspect, the at least one slot includes a slot length less than or equals to two wave-lengths of a center frequency of the electromagnetic field.

In an embodiment of the first aspect, the first metal sheet and the second metal sheet are connected with at least one metal vias through first side and the second side of the substrate.

In an embodiment of the first aspect, a distance between an adjacent pair of the at least one metal vias is associated with an impedance matching of the electromagnetic signal transition.

In an embodiment of the first aspect, the electromagnetic signal is excited by and received from a microstrip line coupled to the at least one slots of the substrate integrated waveguide.

In an embodiment of the first aspect, the electromagnetic signal is excited by and received from a fundamental mode substrate integrated waveguide coupled to the at least one slots of the substrate integrated waveguide.

In an embodiment of the first aspect, the electromagnetic signal is excited by and received from a slotline feed.

In an embodiment of the first aspect, the slotline feed is connected to the first metal sheet of the substrate integrated waveguide.

In an embodiment of the first aspect, the at least one slot extends from the substrate integrated waveguide to an entire length of the slotline feed.

In an embodiment of the first aspect, the at least one slots are positioned at one end of the first metal sheet.

In an embodiment of the first aspect, the electromagnetic signal at opposite sides of each of the at least one slots are 180° out-of-phase.

In an embodiment of the first aspect, the electromagnetic signal is excited and/or transmitted in a Transverse Electric ($TE_{m0}$) mode, and m equals to a positive even number.

In an embodiment of the first aspect, the electromagnetic signal is excited by an N-way divider, and N equals to m divided by two.

In an embodiment of the first aspect, the substrate integrated waveguide is embedded in a substrate.

In accordance with a second aspect of the present invention, there is provided an apparatus for electromagnetic signal transition, comprising:
  a signal receiving structure arranged to receive an electromagnetic signal having a first physical characteristic arranged to be compatible for the electromagnetic signal to be transmitted on a transmission structure; and
  a substrate integrated waveguide arranged to receive the electromagnetic signal transmitted from the signal receiving structure, wherein during the transmission of the electromagnetic signal to the substrate integrated waveguide, the first physical characteristic is converted to a second physical characteristic arranged to be compatible for the electromagnetic signal to be transmitted on the substrate integrated waveguide.

In an embodiment of the second aspect, the first physical characteristic and the second physical characteristic is a polarization and/or a field distribution of the electromagnetic signal.

In an embodiment of the second aspect, the electromagnetic signal is excited and/or transmitted in a higher-order transverse electric mode.

In an embodiment of the second aspect, the polarization of the electromagnetic signal is converted from a first polarization to a second polarization perpendicular to the first polarization.

In an embodiment of the second aspect, the substrate integrated waveguide comprises a first metal sheet positioned at a first side of a substrate, and a second metal sheet positioned at a second side opposite to the first side of the substrate.

In an embodiment of the second aspect, the first metal sheet comprises at least one slot thereon.

In an embodiment of the second aspect, the at least one slot is positioned along a mid line in a longitudinal direction of the first metal sheet.

In an embodiment of the second aspect, the at least one slot includes a slot length less than or equals to two wave-lengths of a center frequency of the electromagnetic field.

In an embodiment of the second aspect, the first metal sheet and the second metal sheet are connected with at least one metal vias through first side and the second side of the substrate.

In an embodiment of the second aspect, a distance between an adjacent pair of the at least one metal vias is associated with an impedance matching of the electromagnetic signal transition.

In an embodiment of the second aspect, the signal receiving structure is a microstrip line coupled to the at least one slot of the substrate integrated waveguide, and the electromagnetic signal is excited by and received from the microstrip line.

In an embodiment of the second aspect, the signal receiving structure is a fundamental mode substrate integrated waveguide coupled to the at least one slot of the substrate integrated waveguide, and the electromagnetic signal is excited by and received from the fundamental mode substrate integrated waveguide.

In an embodiment of the second aspect, the signal receiving structure is a slotline feed, and the electromagnetic signal is excited by and received from the slotline feed.

In an embodiment of the second aspect, the slotline feed is connected to the first metal sheet of the substrate integrated waveguide.

In an embodiment of the second aspect, the at least one slot extends from the substrate integrated waveguide to an entire length of the slotline feed.

In an embodiment of the second aspect, the at least one slots are positioned at one end of the first metal sheet.

In an embodiment of the second aspect, the electromagnetic signal at opposite sides of each of the at least one slots are 180° out-of-phase.

In an embodiment of the second aspect, the electromagnetic signal is excited and/or transmitted in a Transverse Electric ($TE_{m0}$) mode, and m equals to a positive even number.

In an embodiment of the second aspect, the electromagnetic signal is excited by an N-way divider, and N equals to m divided by two.

In an embodiment of the second aspect, the substrate integrated waveguide is embedded in a substrate.

In accordance with a third aspect of the present invention, there is provided a balun device, comprising:

an apparatus for electromagnetic signal transition in accordance with any embodiment of the second aspect; and at least two output terminals connected with the substrate integrated waveguide arranged to transmit a converted electromagnetic signal.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

The inventors have, through their own research, trials and experiments, devised that, the transition between substrate integrated waveguides (SIW) and other transmission lines plays a very important role in the SIW component because of measurement purpose and component integration requirements. With the growing applications in using the SIW to electronic systems, SIW higher order mode components are attracting more and more research interests. Higher order mode SIW has advantages in the applications, including but not limited to, simplifying the structure with reduced fabrication cost and enhancing the stability of performance by relaxed fabrication tolerance. Some of the old higher order mode excitation technologies have limitations of complex structure or narrow bandwidth.

Figure 1A:
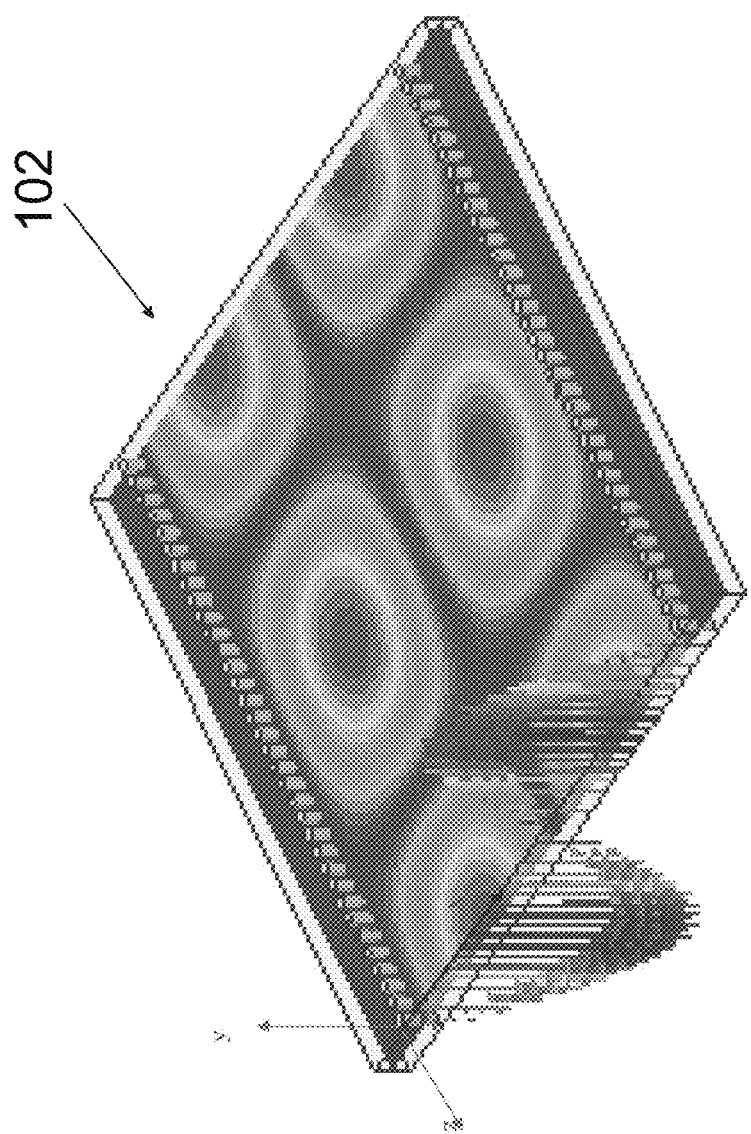
FIG. 1A is a combined illustration of a substrate integrated waveguide (SIW) and an electric field distribution plot of the SIW $TE_{20}$ mode.

Referring to FIG. 1A, there is shown an SIW 102, and the SIW 102 can be considered as an equivalent rectangular waveguide with effective width of a. According the waveguide theory, for a waveguide working at $TE_{20}$ mode, the electric field distribution in the waveguide can be obtained as follows:

$$E_x = 0 \tag{1}$$

$$E_y = -\frac{j\omega\mu a H_{20}}{2\pi}\sin\left(\frac{2\pi}{a}x\right)e^{j(\omega t - \beta z)} \tag{2}$$

$$E_z = 0 \tag{3}$$

$$\beta = \sqrt{4\pi^2 f^2 \mu\varepsilon_0\varepsilon_r(1 - j\tan\delta) - \frac{4\pi^2}{a^2}} \tag{4}$$

$\varepsilon_r$ and $\tan\delta$ are the relative permittivity and the dielectric loss tangent of the substrate, respectively. $H_{20}$ presents the amplitude constant.

The electric field only has the y-axis vector and reduces to zero at $x=a/2$ (the symmetrical plane). According to formula (2), the electric field is with the same amplitude and reversed phase along the symmetrical plane of the waveguide.

The electric current distribution on the bottom wide-side plane is obtained by $$\vec{J}_s|_{y=0} = \left[\vec{x}\left(\cos\left(\frac{2\pi}{a}x\right)\right) - \vec{z}\left(\frac{j\beta a}{2\pi}\sin\left(\frac{2\pi}{a}x\right)\right)\right]H_{20}e^{j(\omega t - \beta z)} \tag{5}$$

$$\text{When } x = \frac{a}{2}, \vec{J}_s\Big|_{y=0} = -\vec{x}H_{20}e^{j(\omega t - \beta z)} \tag{6}$$

At the symmetrical line (x=a/2), the current only has the x-axis vector and the current amplitude along the symmetrical line shows regular distribution with the cycle of a half waveguide wavelength.

Figure 1B:
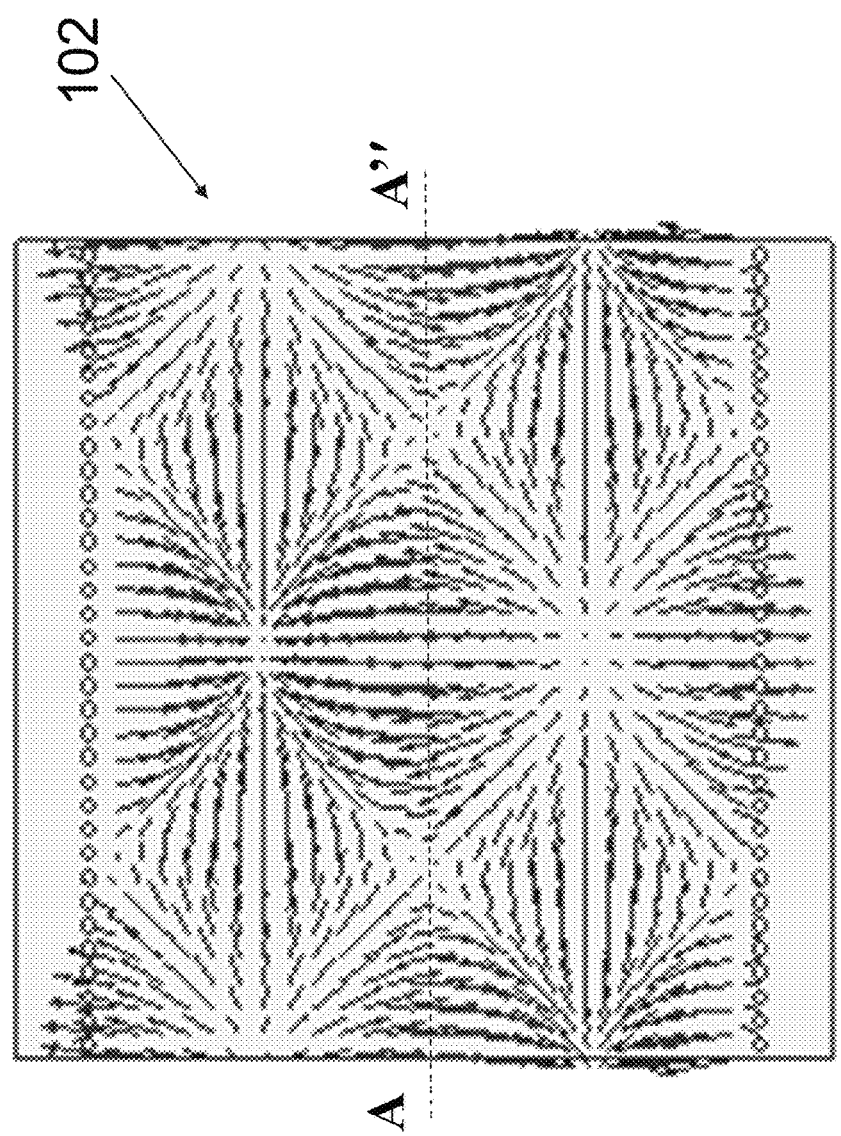
FIG. 1B is an illustration of a current distribution on the bottom wide-side plane of a SIW of FIG. 1A.

All the theoretical analysis above is verified by using Ansoft HFSS 13. FIGS. 1A and 1B show the electric field and current distributions for the $TE_{20}$ mode SIW 102. It is an odd mode field pattern, with the electric field having the same amplitude and reversed phase along A-A' middle plane. The current lines are perpendicular to the A-A' plane and they are continuous across the A-A' plane. The particular electric field and the current distributions provide an approach to excite the $TE_{20}$ mode in the SIW 102. With this consideration, in some example embodiments, a slot is inserted along the mid line of the SIW (A-A') on a metallic sheet to excite the $TE_{20}$ mode, the slot would induce magnetic current along the slot and result in an odd mode field pattern in the waveguide.

Figure 2A:
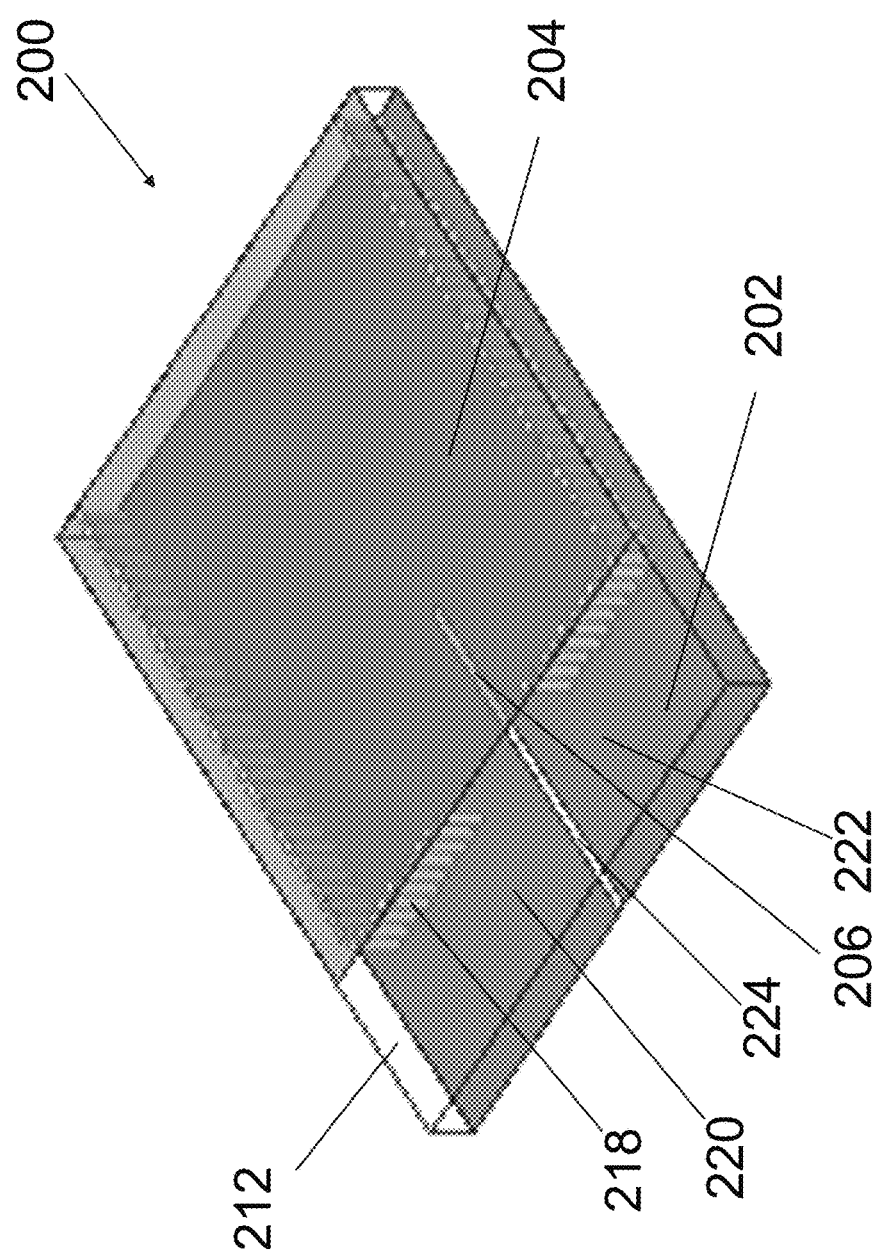
FIG. 2A is a perspective view of an apparatus for electromagnetic signal transition in accordance with an embodiment of the present invention.
Figure 2B:
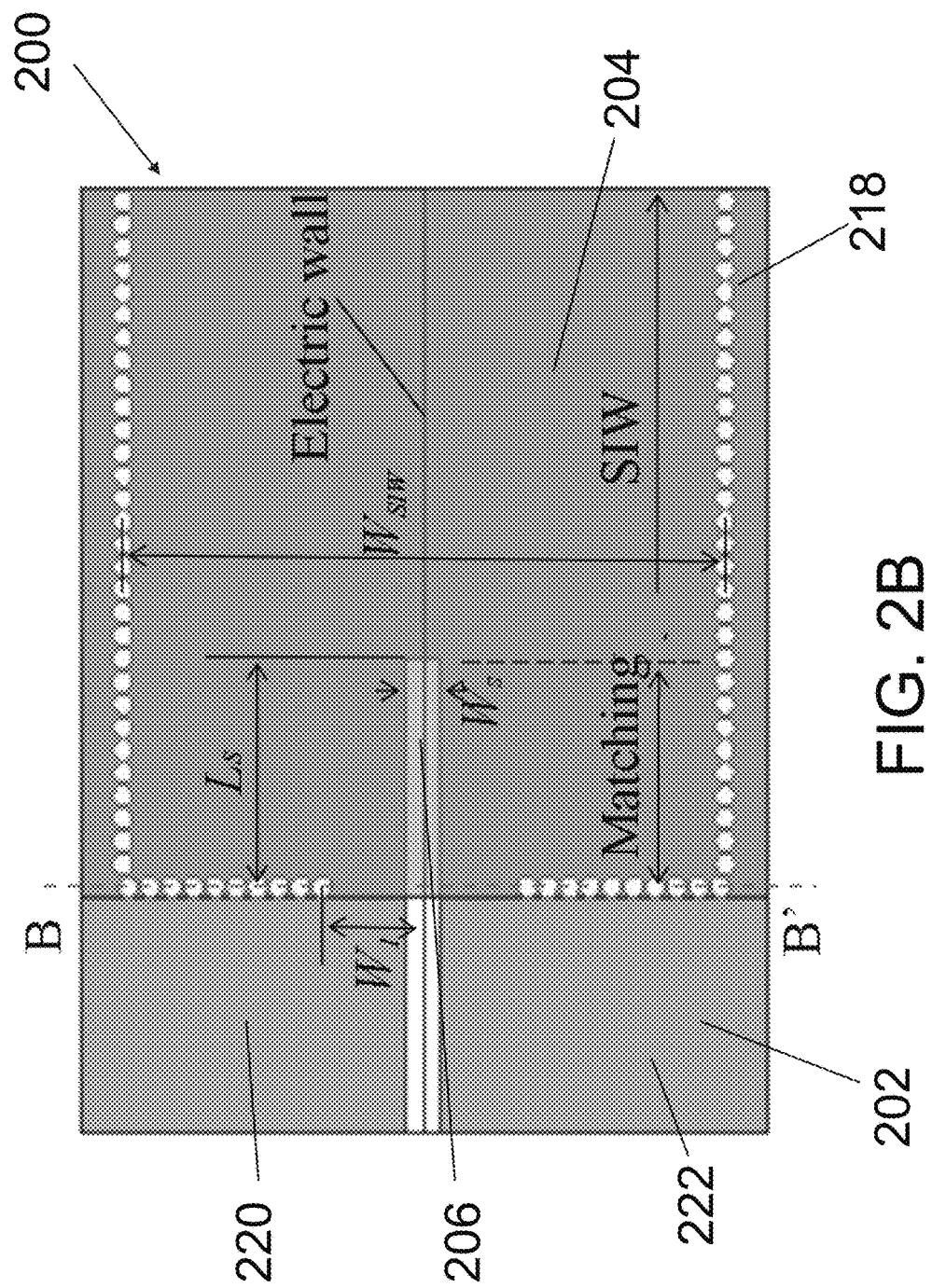
FIG. 2B is a top view of an apparatus for electromagnetic signal transition of FIG. 2A.
Figure 2C:
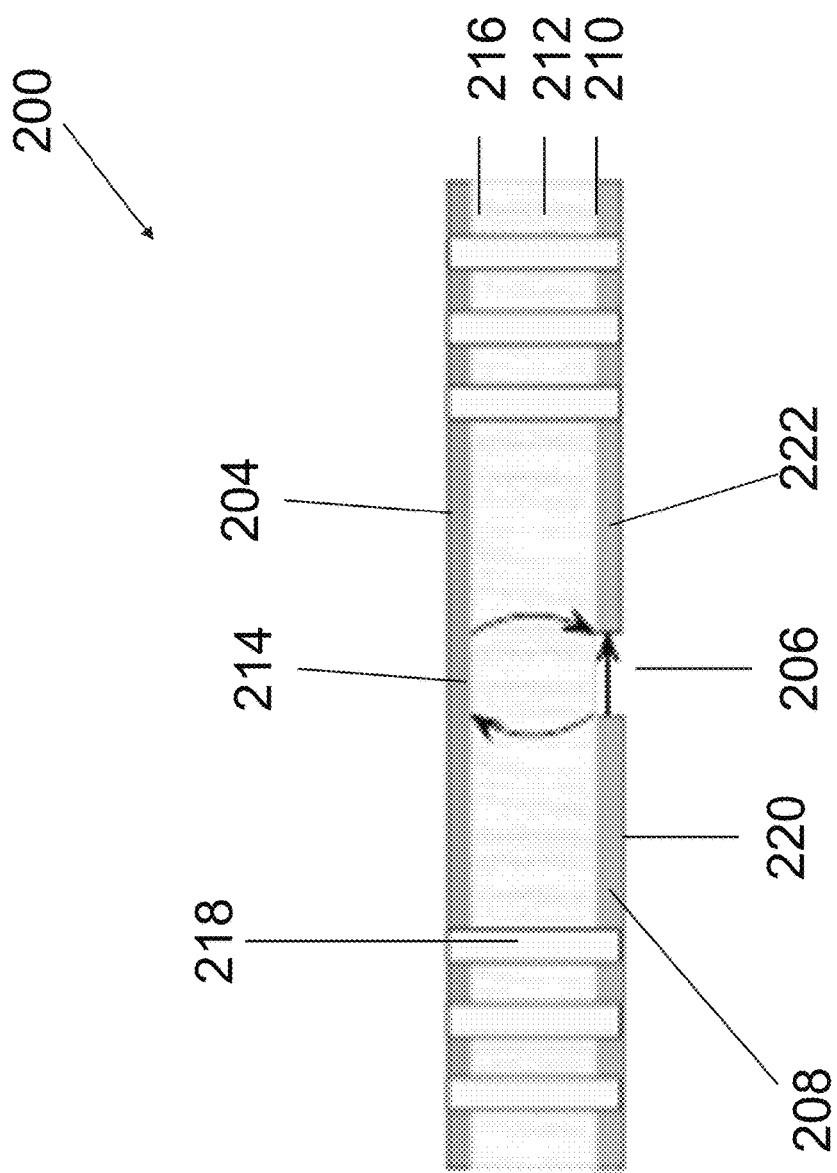
FIG. 2C is a cross-section view at the BB' plane of an apparatus for electromagnetic signal transition of FIG. 2B.

Referring to FIGS. 2A to 2C, there is provided an apparatus for electromagnetic signal transition, comprising:
- a signal receiving structure 202 arranged to receive an electromagnetic signal having a first physical characteristic arranged to be compatible for the electromagnetic signal to be transmitted on a transmission structure; and
- a substrate integrated waveguide 204 arranged to receive the electromagnetic signal transmitted from the signal receiving structure 202, wherein during the transmission of the electromagnetic signal to the substrate integrated waveguide 204, the first physical characteristic is converted to a second physical characteristic arranged to be compatible for the electromagnetic signal to be transmitted on the substrate integrated waveguide 204.

Preferably, the electromagnetic signal having a first physical characteristic is compatible for the electromagnetic signal to be transmitted on a planar transmission structure, the first physical characteristic and the second physical characteristic is a polarization and/or a field distribution of the electromagnetic signal, and the polarization (field distribution) of the electromagnetic signal is converted from a first polarization to a second polarization perpendicular to the first polarization.

In this embodiment, the apparatus 200 for electromagnetic signal transition includes a SIW 204 and a mode converter between a signal receiving structure 202 and the SIW 204. In this example embodiment, the mode converter is a slot 206 on one side of the SIW 204. The SIW 204 comprises a first metal sheet 208 positioned at a first side 210 of a substrate 212, and a second metal sheet 214 positioned at a second side 216 opposite to the first side 210 of the substrate 212. Preferably, the slot 206 is provided on the first metal sheet 208, or the slot 206 can be positioned on the second metal sheet 214, as long as the at least one slot 206 is provided on any side of the substrate 212 of the SIW 204.

Preferably, the signal receiving structure 202 is a slotline feed, and the electromagnetic signal is excited by and received from the slotline feed 202. In this embodiment, the slotline feed 202 is connected to the first metal sheet 214 of the SIW 204, and the slotline feed 202 includes a slot line 224 positioned along a mid line of the apparatus 200 along a longitudinal axis. Preferably, the slot line 224 of the slotline feed aligns with the slot 206 of on the SIW 204, such that the slot 206 extends from the SIW 204 to an entire length of the slotline feed 202, and the slot 206 is positioned at one end of the first metal sheet 214.

When an electromagnetic field or an electromagnetic signal is incident to SIW 204 from the slotline feed 202, the horizontally polarized electric field of the slotline would be converted to the vertically-polarized field of SIW 204. Alternatively, the vertically-polarized electric field of the slotline would be converted to the horizontally-polarized field of SIW 204. Such conversion is based on electromagnetic induction and the microwave theory.

Simultaneously, electric fields at opposite sides (220, 222) of the slot 206 in the apparatus 200 are 180° out-of-phase, so that an odd mode field pattern has been excited. This symmetrical plane is considered as an electric wall, and the electric wall is an equivalent grounded plane of the SIW 204. In the slot, the electric potential is zero at the plane and the electric field is with a relatively same amplitude but reversed phase. Hence only the electromagnetic field distributions of higher order modes, $TE_{m0}$ (where m=2, 4, ... 2*n, n is a natural number) modes, can be excited. The electric field distribution at the cross section of the B-B' plane is shown in FIG. 2C.

In the SIW excited by one embodiment of an apparatus 200 as shown in FIG. 2A, the $TE_{20}$ mode is with the lowest cutoff frequency, and thus the $TE_{20}$ mode could be considered as the "dominant mode" in the substrate integrated waveguide 204. Only the electromagnetic field distribution of $TE_{20}$ mode can be excited and transmitted in the SIW 204, if the effective width of the SIW 204, $W_{eff}(f_{c(TE_{20})}$, satisfies the following relationship, $$W_{eff}(f_{c(TE_{20})}') \leq W_{eff}(f_{(TE_{20})}) < W_{eff}(f_{c(TE_{40})}'') \quad (7)$$

$$f''=2f' \quad (8)$$

where $W_{eff}(f_{c(TE_{20})}')$ is the effective width of the $TE_{20}$ mode at cutoff frequency f' and $W_{eff}(f_{c(TE_{40})}'')$ presents the effective width of the $TE_{40}$ mode at cutoff frequency f''. According to (7), it can be concluded that the maximum single mode ($TE_{20}$) relative bandwidth is 66.7%.

With reference to FIG. 2B, the length of the mode converter or the transition part, $L_s$, is defined to be about a half wavelength for effective impedance and field pattern matching, thus the length of the slot 206 inserted in the apparatus 200 depends on the working frequency. The apparatus 200 includes at least one metal vias 218 connecting the first metal sheet 208 and the second metal sheet 214 through first side 210 and the second side 216 of the substrate 212, and $W_1$ is the distance between the slot 206 and the shorted vias 218. The shorted vias 218 are used to improve the impedance matching of the transition and is chosen at a quarter-wavelength of the center frequency. The location of the metallic vias can be considered as an impedance transformer. Although there are no limitations about the positions of the vias, the vias may improve the transition performance by improving the impedance matching of the transition.

Preferably, the slot 206 is in rectangular shape, and alternatively, the slot 206 may be in other shapes such as a tapered slot, or any other shapes as known by a person skilled in the art. The slot 206 may also be defined to be longer or shorter than half wavelength, with no impacts on the excitation performance.

Figure 3:
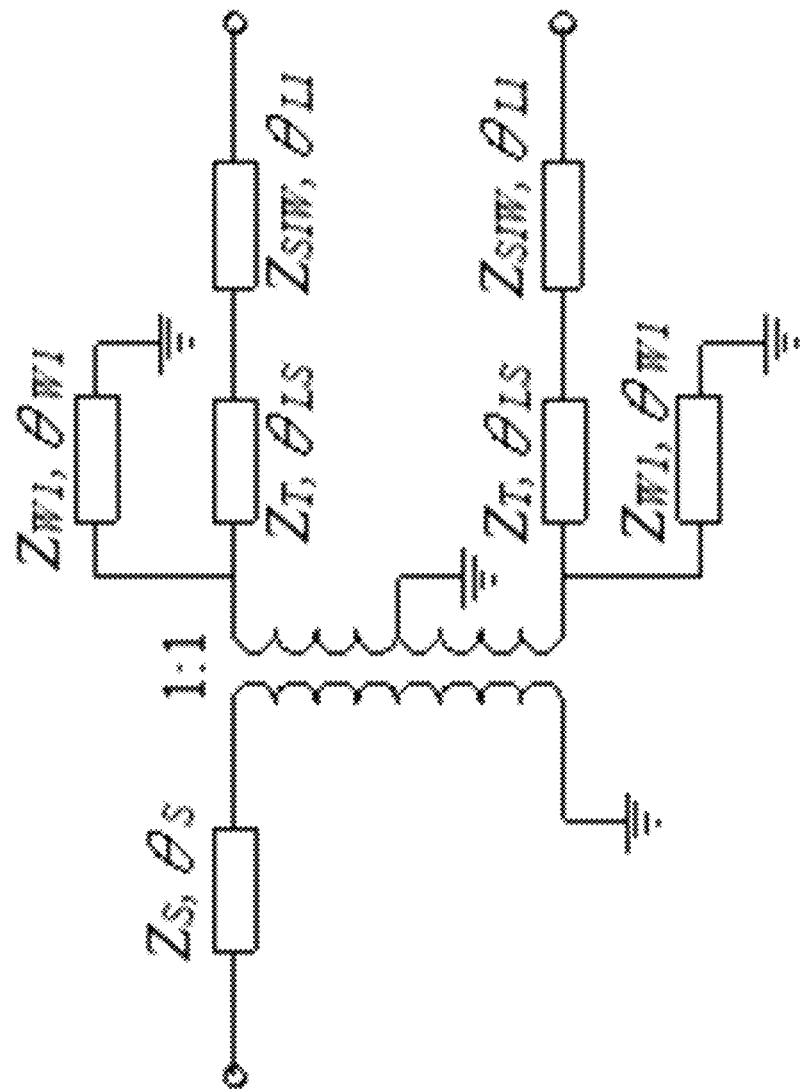
FIG. 3 is a schematic diagram of an equivalent circuit model of an apparatus for electromagnetic signal transition of FIG. 2A.

In another example embodiment, a $TE_{20}$ mode SIW can be taken as two parallel out-of-phase $TE_{10}$ mode SIWs, so the equivalent circuit model of an embodiment of the apparatus for electromagnetic signal transition can be attained as shown in FIG. 3, which illustrates the operating mechanism of the transition. Preferably, the circuit model consists of a transformer, two short-circuited branches, transition matching parts, and two parallel out-phase SIWs. $Z_S$, $Z_T$, and $Z_{SIW}$ stand for the characteristic impedances of slotline, transition part, and SIW, respectively.

Figure 4:
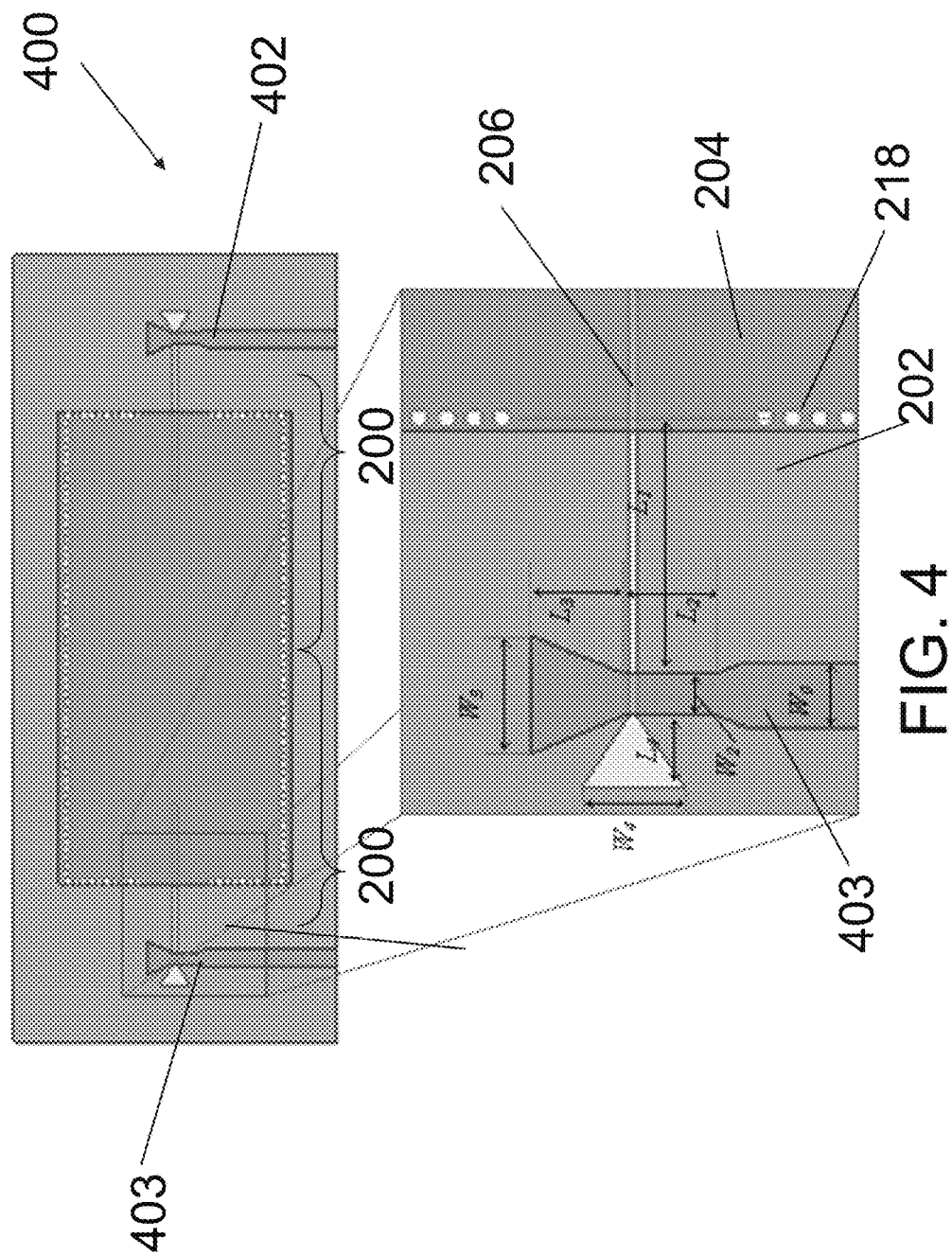
FIG. 4 is a top view of an apparatus for electromagnetic signal transition in accordance with an embodiment of the present invention.

Referring to FIG. 4, there is provided an embodiment of an apparatus 400 for electromagnetic signal transition. In this embodiment, two apparatus 200 for electromagnetic signal transition as shown in FIG. 2A are placed back-to-back, such that electromagnetic signal is converted from a planar transmission line to a SIW and then converted back to a planar transmission line. In addition, two additional microstrip 403 to slotline feed 202 transitions are employed for the purpose of measurements. The transition is designed around X-band to experimentally verify the transition performance. To obtain a compact structure, the width of the SIW ($W_{SIW}$) is chosen based on the lower $TE_{20}$ mode cutoff frequency. The relationship between the width of $TE_{20}$ mode SIW and frequency is provided as follows:

$$W_{SIW} = \frac{c_o}{f_{c(TE_{20})}\sqrt{\varepsilon_r}} + \frac{d^2}{1.1p} + \frac{d^3}{6.6p^2} \quad (9)$$

where $c_o$ is the speed of light in free space, d is the diameter of vias, p is the distance between two adjacent vias, and $W_{SIW}$ stands for the width of SIW.

The distance, $W_1$, and the slot length, $L_S$, as shown in FIG. 2B, are set as a quarter-wave length and a half wave length, respectively, of the center frequency. In this embodiment, a possible minimum width of the slotline ($W_S$) is chosen to be 0.2 mm to minimize any potential radiation loss while transmitting electromagnetic power from slotline to the $TE_{20}$ mode SIW.

Figure 5A:
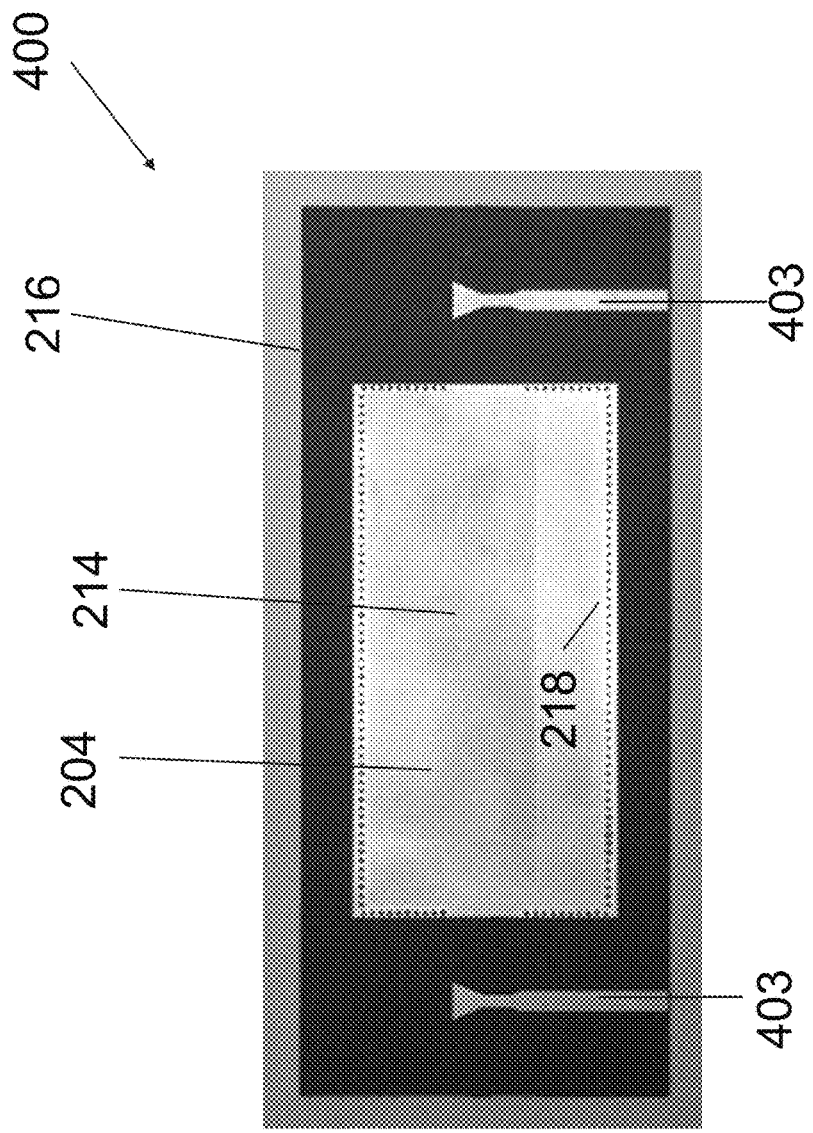
FIG. 5A is a photographic image showing a top view of a fabricated apparatus for electromagnetic signal transition of FIG. 4.
Figure 5B:
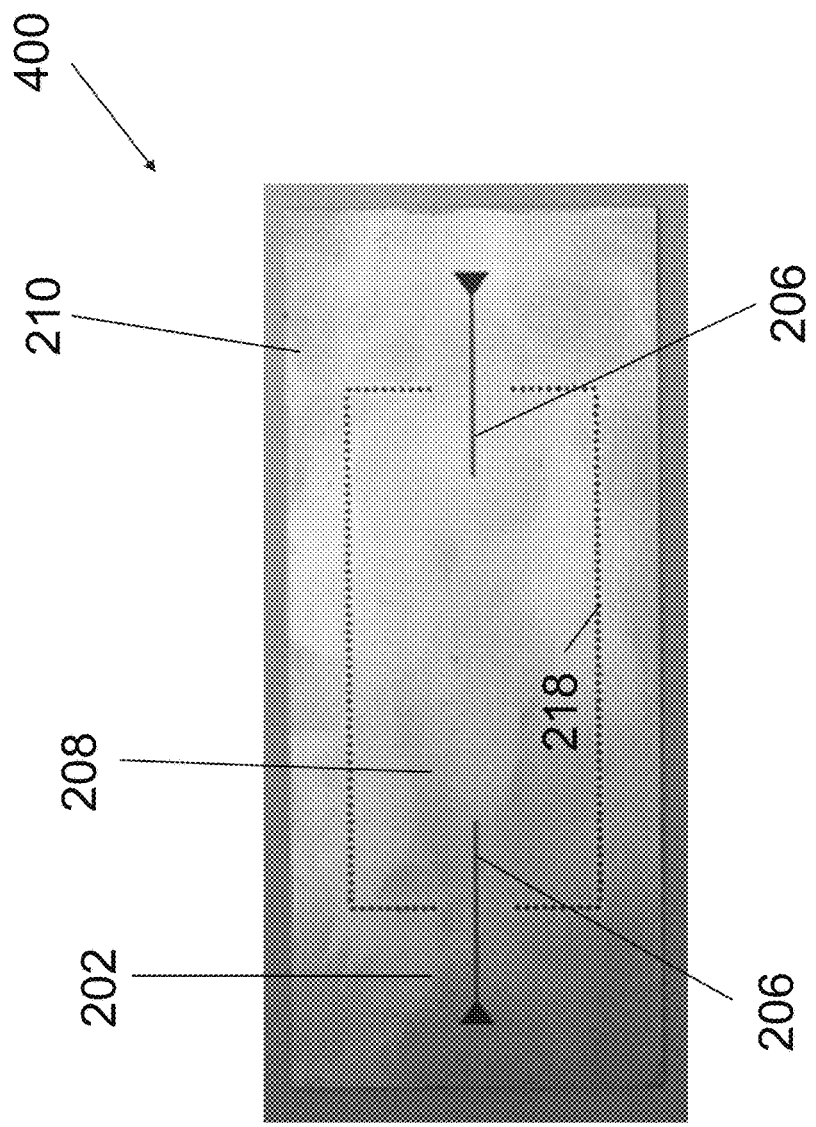
FIG. 5B is a photographic image showing a bottom view of a fabricated apparatus for electromagnetic signal transition of FIG. 4.

With reference to FIGS. 5A to 5B, there is shown photographic images of a top view and a bottom view of a fabricated apparatus 400 for electromagnetic signal transition of FIG. 4. In one example embodiment, the apparatus 400 is fabricated on a Rogers RT/duroid 5870 dielectric substrate with a relative dielectric constant of 2.33, a thickness of 0.785 mm, and dielectric loss tangent of 0.0012, and the dimensions of the fabricated transition are as follows: $W_{SIW}$=28 mm, $L_S$=10 mm, $W_1$=4.75 mm, $W_S$=0.2 mm, d=0.6 mm, p=1 mm, $L_1$=9.25 mm, $W_0$=2.3 mm, $W_2$=1.5 mm, $L_2$=3.3 mm, $W_3$=4.3 mm, $L_3$=3.4 mm, $W_4$=3.8 mm, $L_4$=2.6 mm.

Higher order mode SIW has the advantageous with simple structures, with reduced fabrication cost and processes. The stability of performance of higher-order mode SIW is also enhanced by the replaced fabrication tolerance.

These embodiments are advantageous in that the transition structure between a higher order mode SIW and other planar transmission lines has a simple and a compact structure with wide bandwidth performance. The transition structure may be provided in a printed circuit board of an electronic device. Alternatively the apparatus or the SIW may also be embedded in a circuit board, such as a multi-layer printed circuit board, which does not occupy a significant volume of space in an electronic device. The SIW can be connected to a microstrip line, a slotline or another SIW. In some embodiments, some slots arrays can be designed on the SIW to realize antenna arrays.

Figure 6:
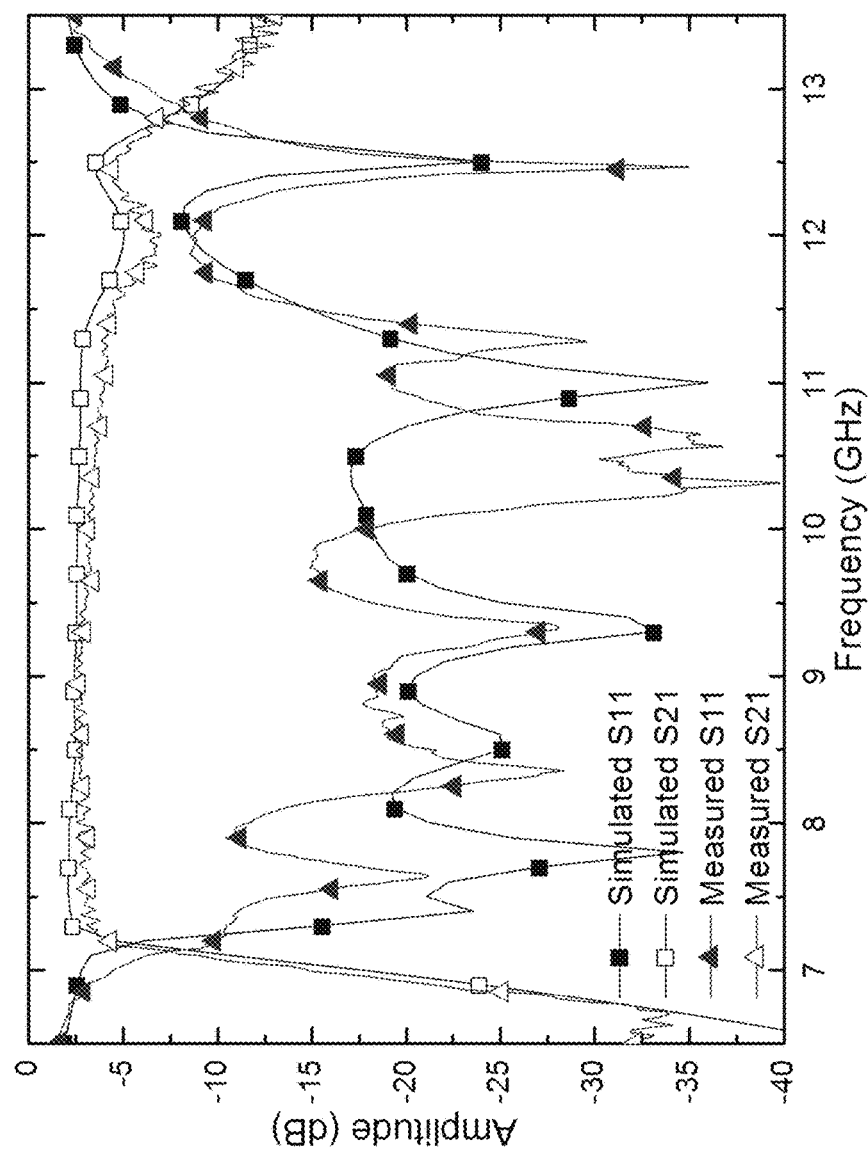
FIG. 6 is a plot showing simulated and measured S-parameters of an apparatus for electromagnetic signal transition of FIG. 4.

FIG. 6 shows the measured and EM simulated return loss $S_{11}$ and insertion loss $S_{21}$. It can be seen that the transition has broad bandwidth. The measured $S_{11}$ is better than 10 dB, in the frequency range from 7.3 GHz to 11.6 GHz with a fractional bandwidth of 45. 5%. According to the simulated results, $S_{11}$ is better than 15 dB, from 7.3 GHz to 11.4 GHz with a relative bandwidth of 43.85%. The differences are as a result of the fabrication error. The measured insertion loss is higher than the simulations. This is due to the substrate and metal loss as well as the loss from the connection between microstrip and SMA test connector.

The measured results agree well with the simulations except at the lower frequency range. The deteriorated return loss at lower frequency and high insertion loss in the operation band are mainly caused by the microstrip-to-slotline transition, and it can be concluded that the average measured insertion loss (including two transition losses of slotline to the SIW, the substrate loss, and the metallic loss) of the back-to-back transition between the slotline and the $TE_{20}$ mode SIW is about 1.5 dB in the operation band.

Figure 7A:
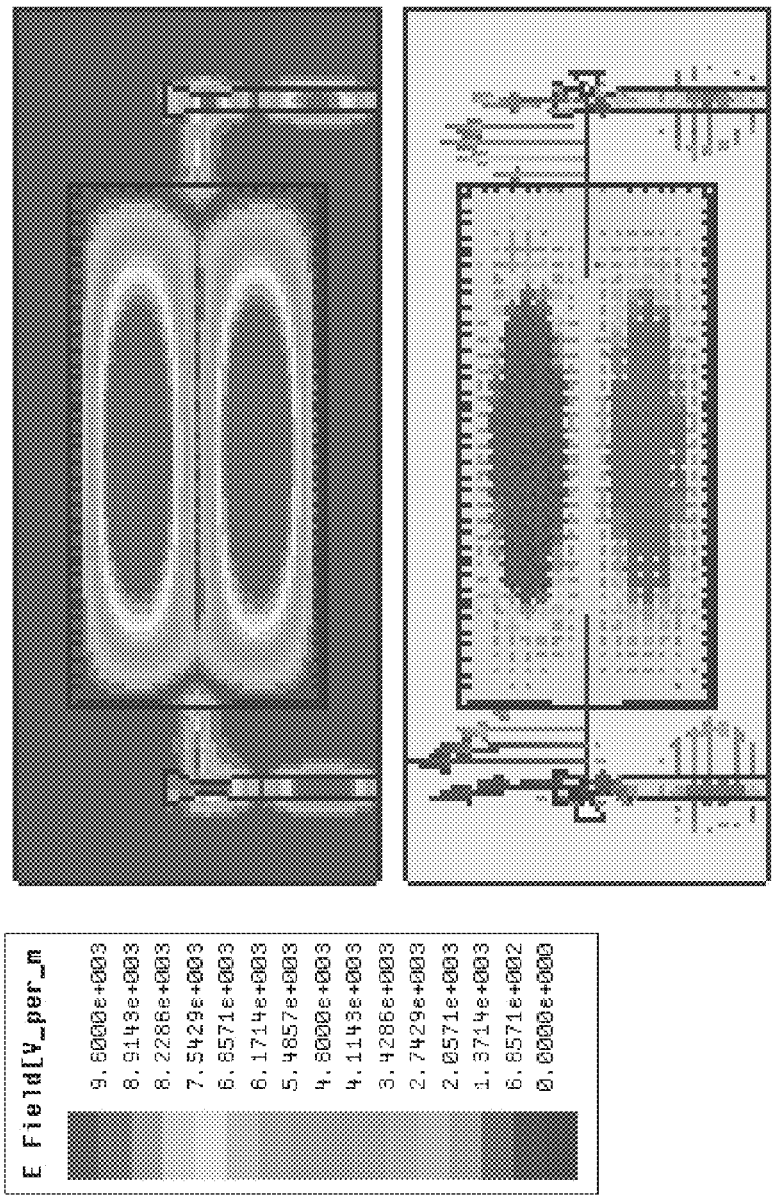
FIG. 7A is a plot showing electric distributions in an SIW of an apparatus for electromagnetic signal transition of FIG. 4 at 7.3 GHz.
Figure 7B:
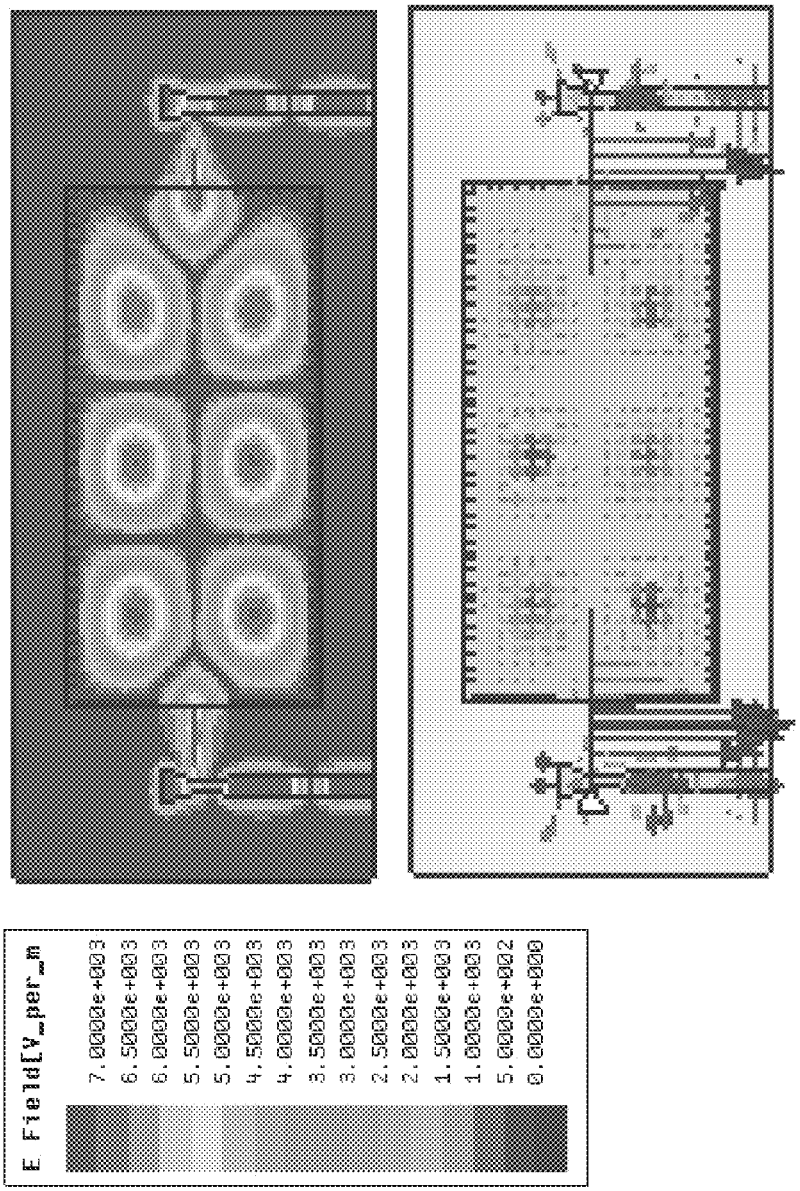
FIG. 7B is a plot showing electric distributions in an SIW of an apparatus for electromagnetic signal transition of FIG. 4 at 9 GHz.
Figure 7C:
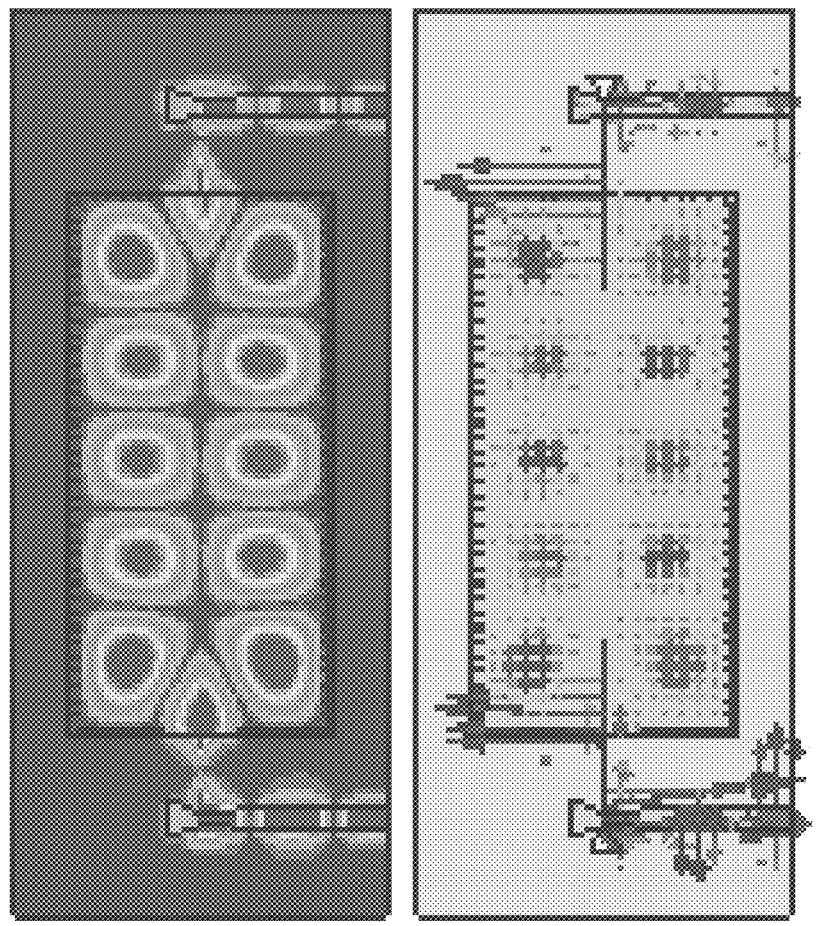
FIG. 7C is a plot showing electric distributions in an SIW of an apparatus for electromagnetic signal transition of FIG. 4 at 11.4 GHz.
Figure 7C:
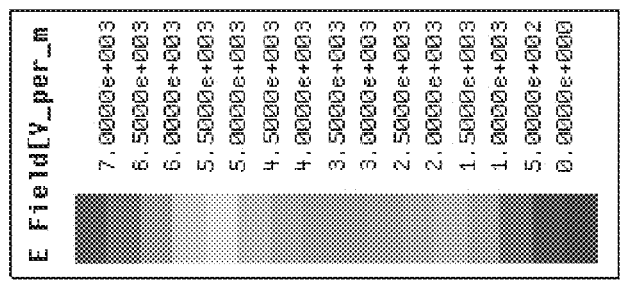

FIGS. 7A, 7B and 7C show the electric field distributions at the frequency of 7.3 GHz, 9.2 GHz, and 11.4 GHz respectively. The excellent performance of the transition has been demonstrated directly. Only the $TE_{20}$ mode has been excited and transmitted in the SIW within a broad bandwidth.

Figure 8:
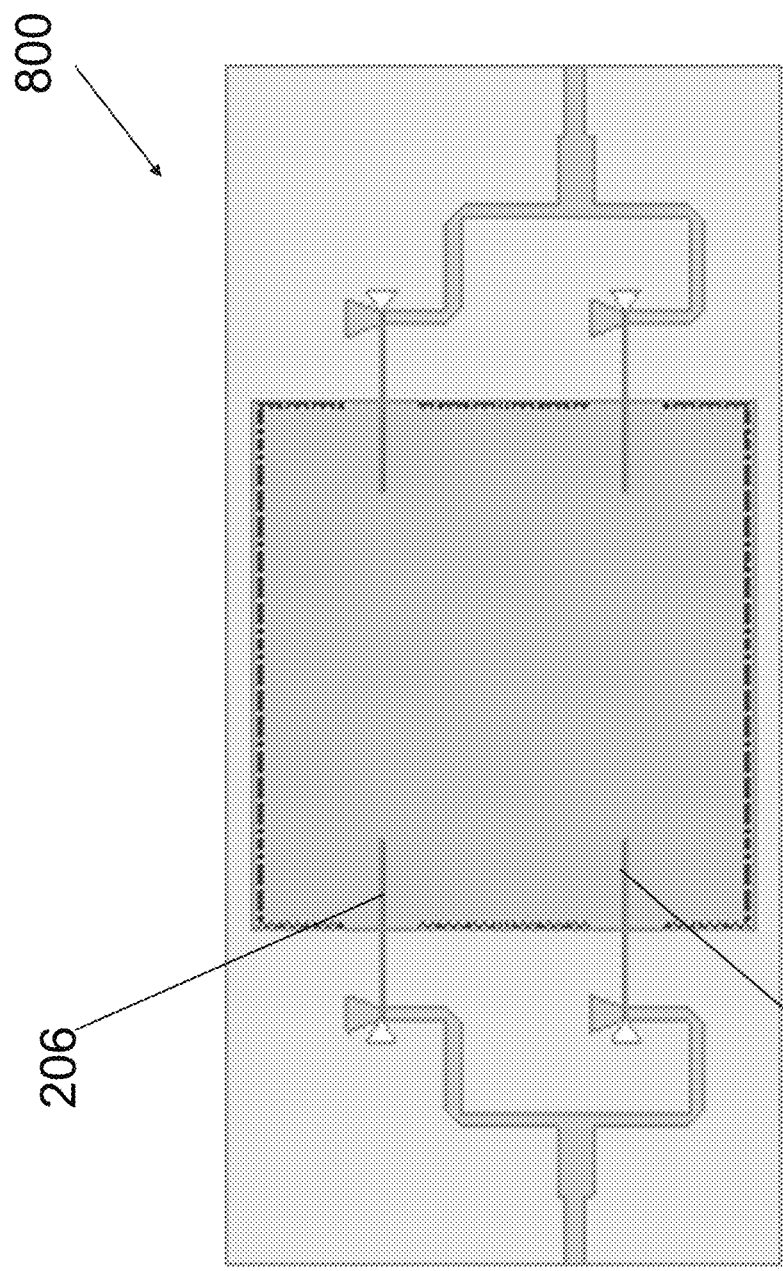
FIG. 8 is a top view of an apparatus for $TE_{40}$ mode electromagnetic signal transition in accordance with an embodiment of the present invention.
Figure 9:
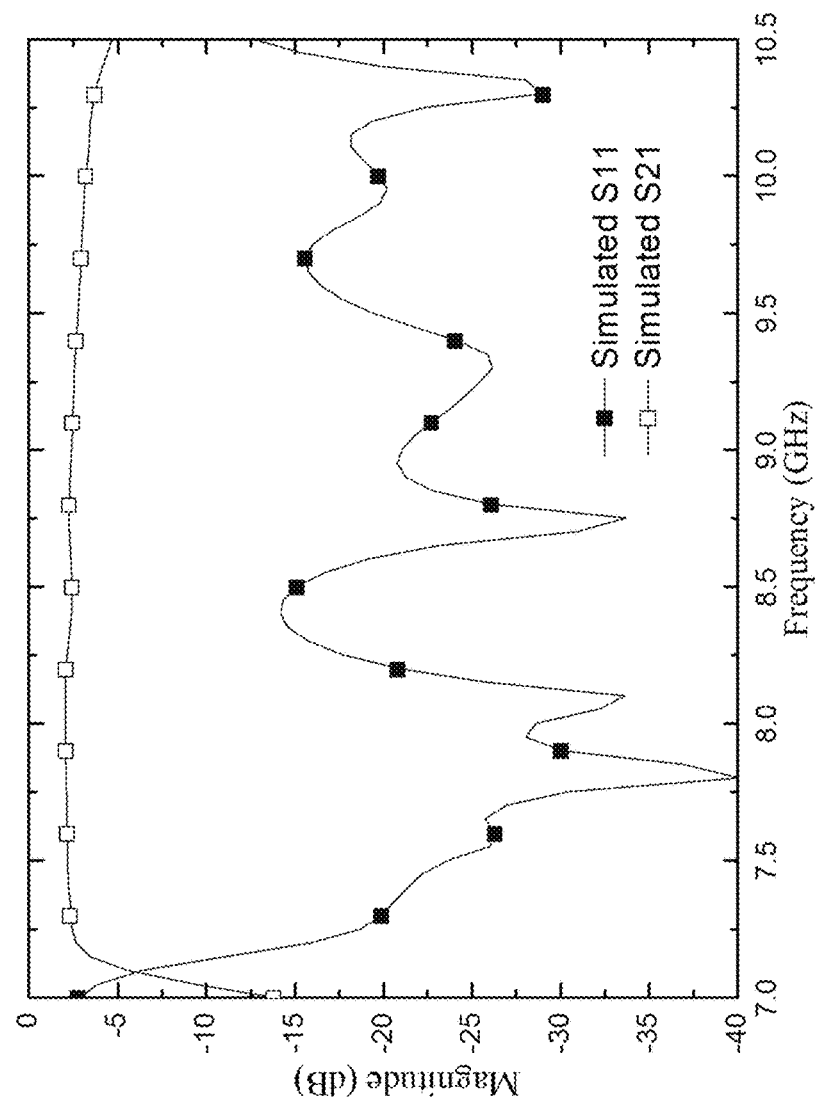
FIG. 9 is a plot showing simulated S-parameters of an apparatus for electromagnetic signal transition of FIG. 8.

With reference to FIG. 8, there is shown an embodiment of an apparatus 800 for $TE_{40}$ mode SIW excitation. In this embodiment, two slot lines 206 are used to excite the $TE_{40}$ SIW mode, and two apparatus for $TE_{40}$ mode SIW excitation are placed back-to-back similar to the apparatus 400 as shown in FIG. 4. The simulated results are shown in FIG. 9. The simulated $S_{11}$ is better than 14 dB, in the frequency range from 7.18 GHz to 10.4 GHz with a fractional bandwidth of 36.6%. In 7.12-10 GHz, the insertion loss $S_{21}$ is better than 3.2 dB.

Figure 10A:
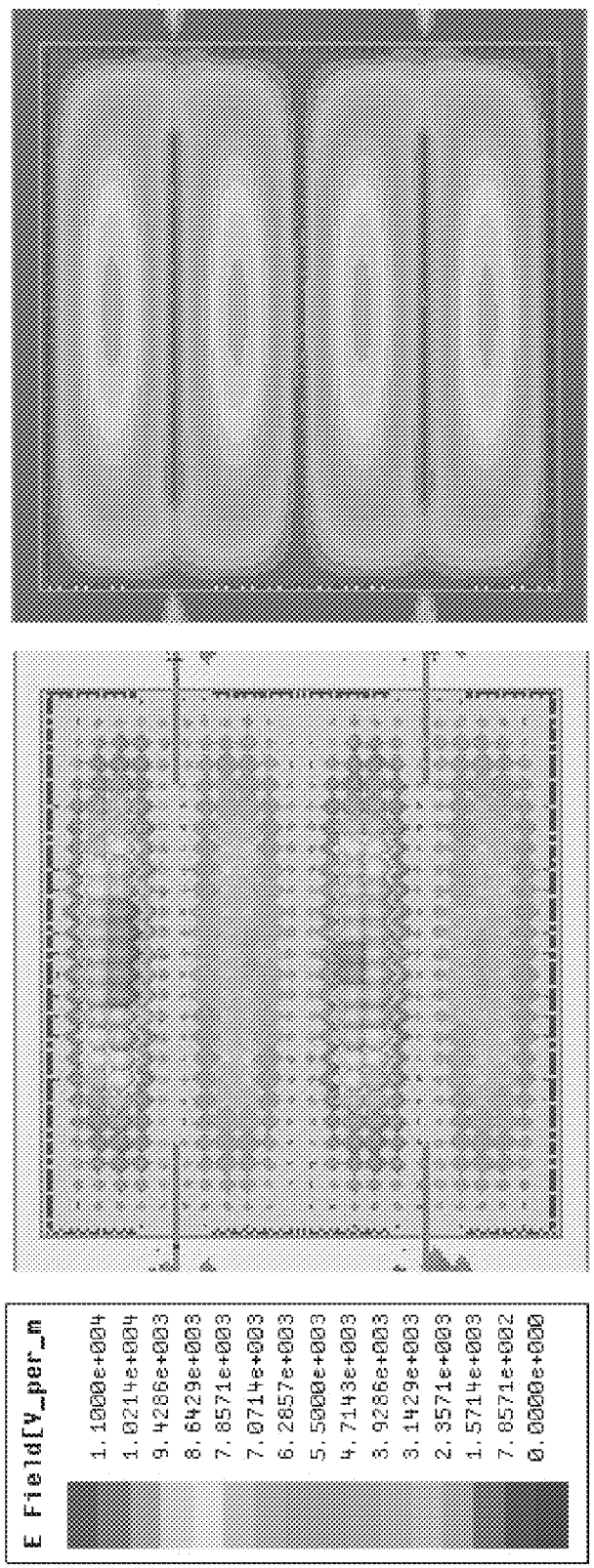
FIG. 10A is a plot showing electric distributions in an SIW of an apparatus for electromagnetic signal transition of FIG. 8 at 7.2 GHz.
Figure 10B:
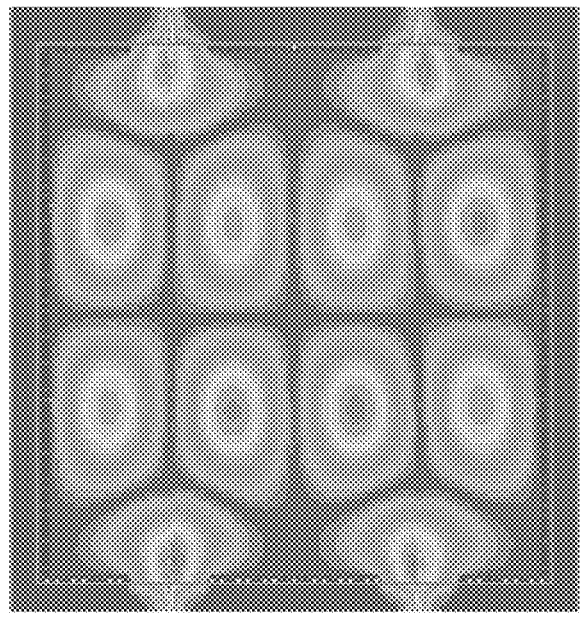
FIG. 10B is a plot showing electric distributions in an SIW of an apparatus for electromagnetic signal transition of FIG. 8 at 8.5 GHz.
Figure 10B:
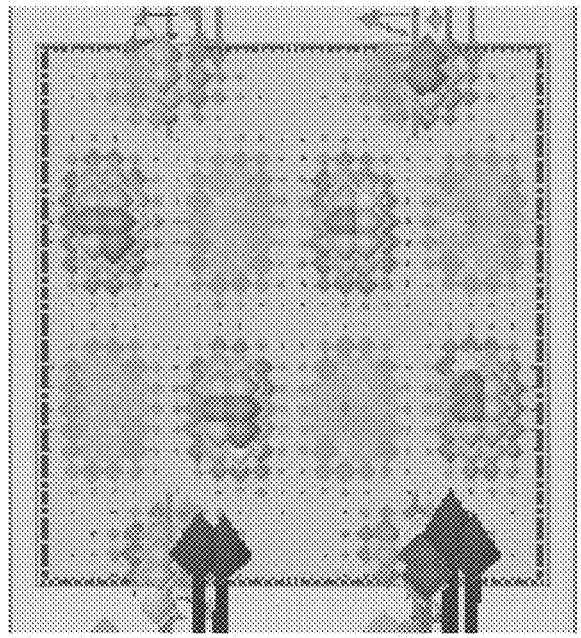
Figure 10B:
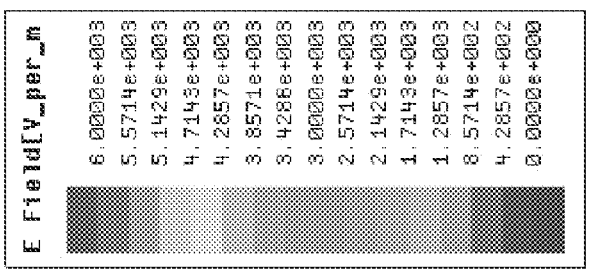
Figure 10C:
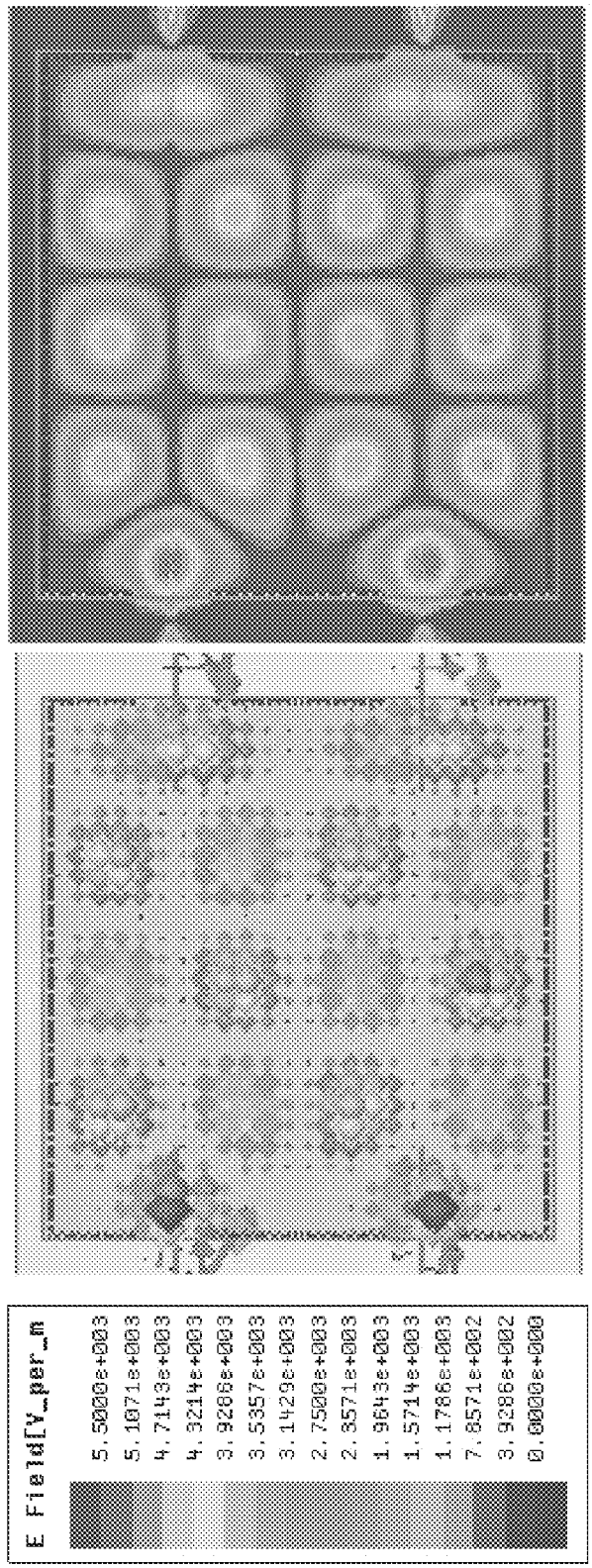
FIG. 10C is a plot showing electric distributions in an SIW of an apparatus for electromagnetic signal transition of FIG. 8 at 10 GHz.

FIGS. 10A, 10B and 10C show the electric field distributions at the frequency of 7.2 GHz, 8.5 GHz, and 10 GHz respectively. The excellent performance of the transition has been demonstrated directly. Only the $TE_{40}$ mode has been excited and transmitted in the SIW within a broad bandwidth.

Figure 11A:
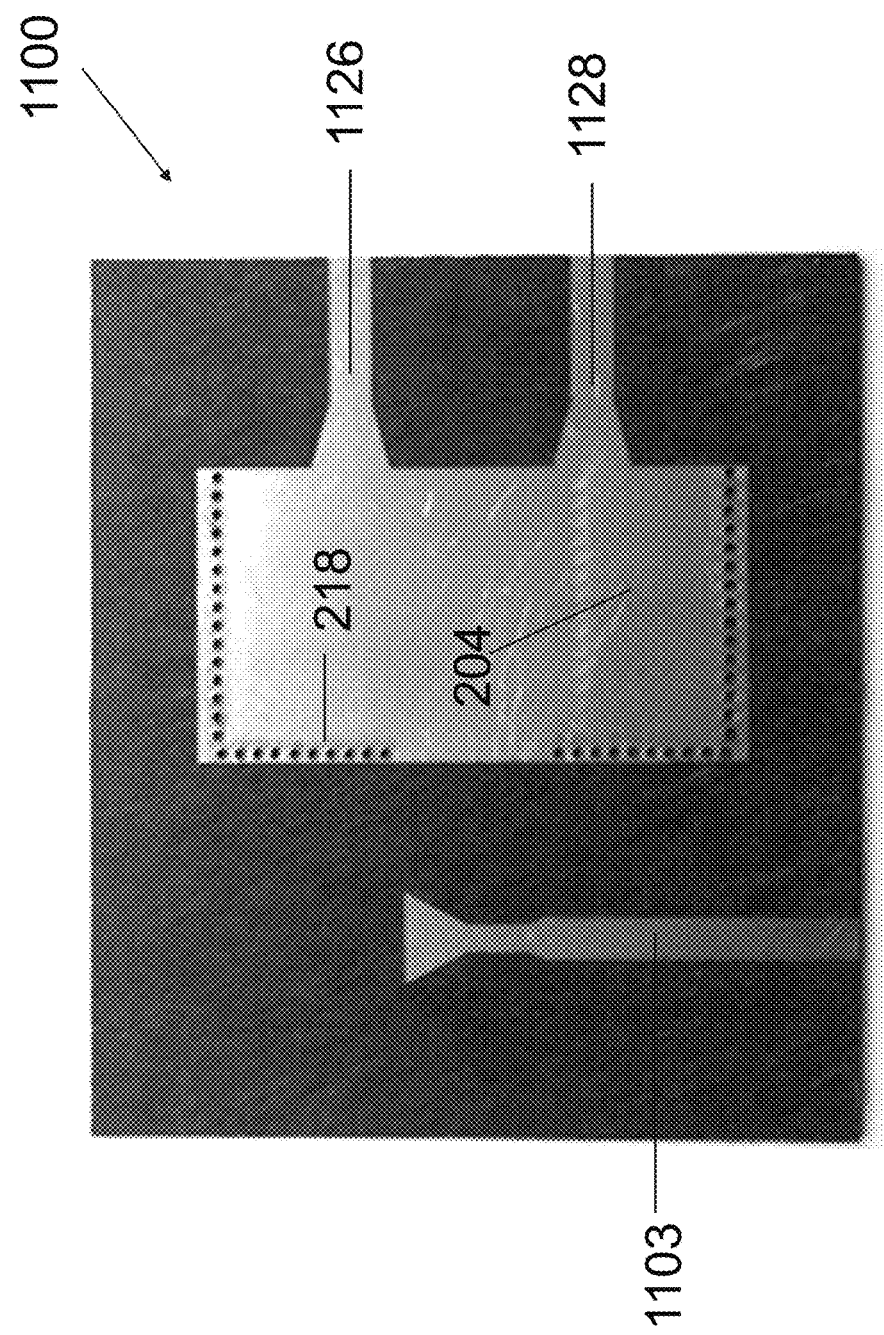
FIG. 11A is a photographic image showing a top view of a fabricated balun in accordance with an embodiment of the present invention.
Figure 11B:
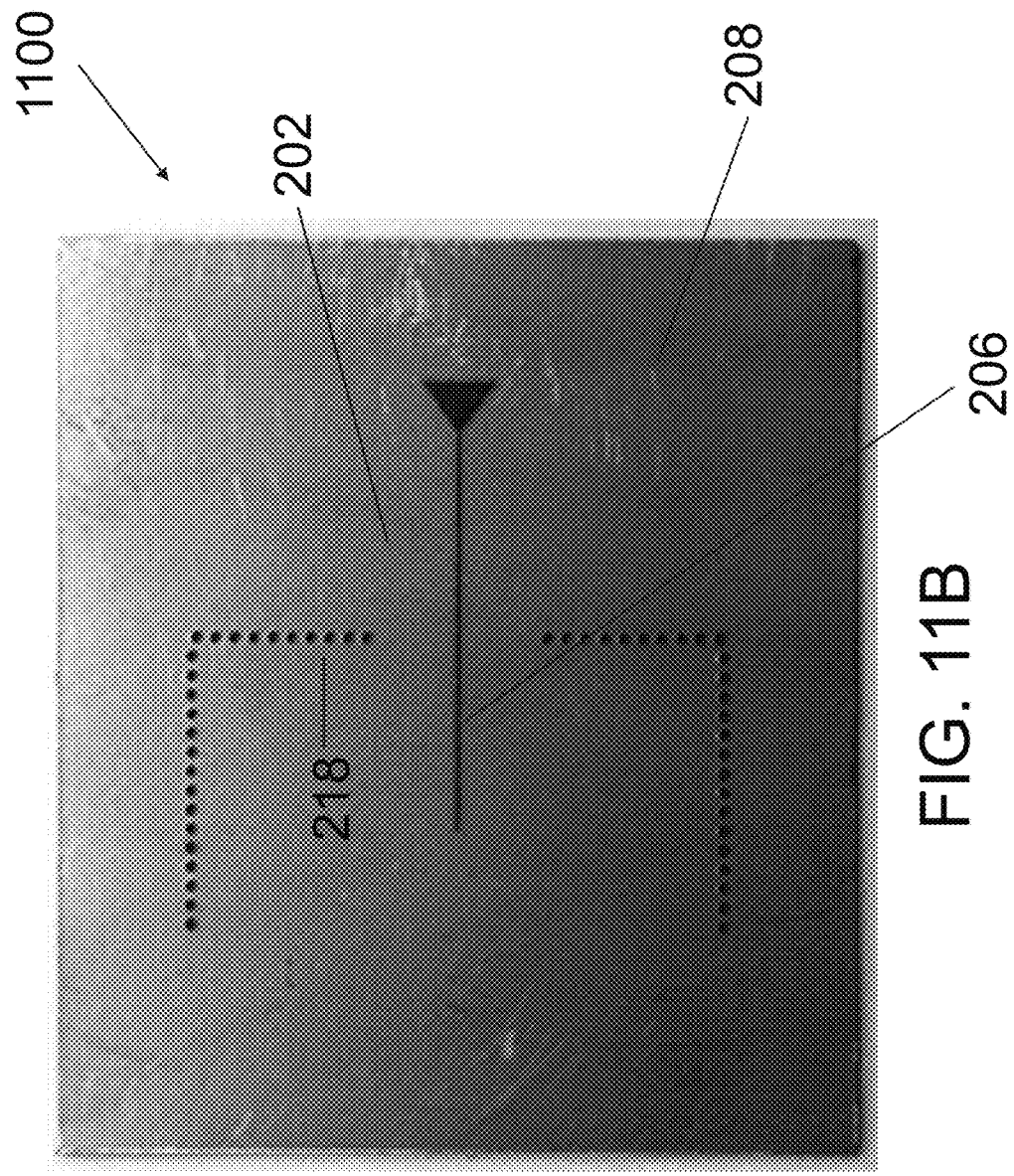
FIG. 11B is a photographic image showing a bottom view of a fabricated balun of FIG. 11A.

With reference to FIGS. 11A and 11B, there is provided an embodiment of a balun device 1100, comprising: an apparatus for electromagnetic signal transition in accordance with any one of the previous embodiments; at least two output terminals (1126, 1128) connected with the substrate integrated waveguide 204 arranged to transmit the converted electromagnetic signal.

In this embodiment, the balun device 1100 includes a slotline feed 202, a substrate integrated waveguide 204 and a mode converter between the slotline feed 202 and the SIW 204. A microstrip 1103 is included as an input port in a microstip-to-slotline transition similar to the previous embodiments. The mode converter is a slot 206 on one side of the substrate of a SIW 204 extending to the slotline feed 202. Two output ports (1126, 1128) are connected to the $TE_{20}$ mode SIW 204 directly. Unlike the apparatus as described in the previous embodiments, vias 218 are not needed in the longitudinal mid plane to separate electromagnetic power.

Figure 12:
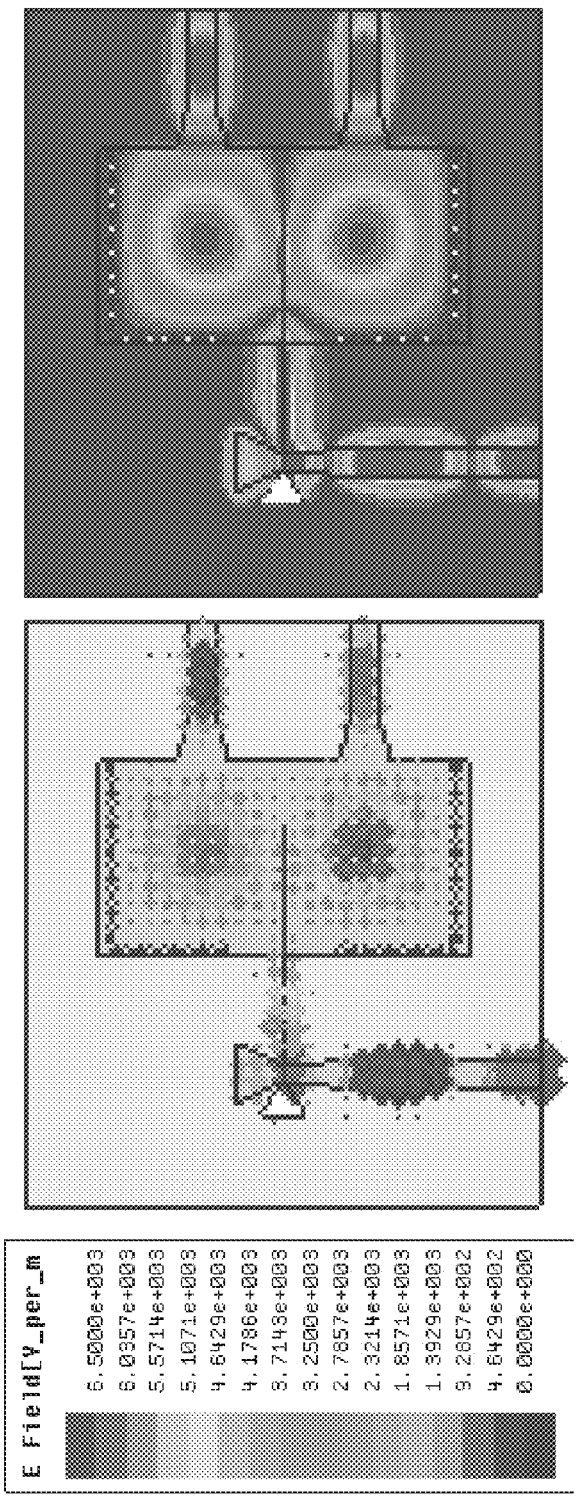
FIG. 12 is a plot showing electric distributions in a balun of FIG. 11A at 9 GHz.

Electric vector and magnitude distributions at 9 GHz in the balun are shown in FIG. 12. It can be seen that a compact SIW balun with good phase and amplitude imbalance performance is obtained.

Figure 13A:
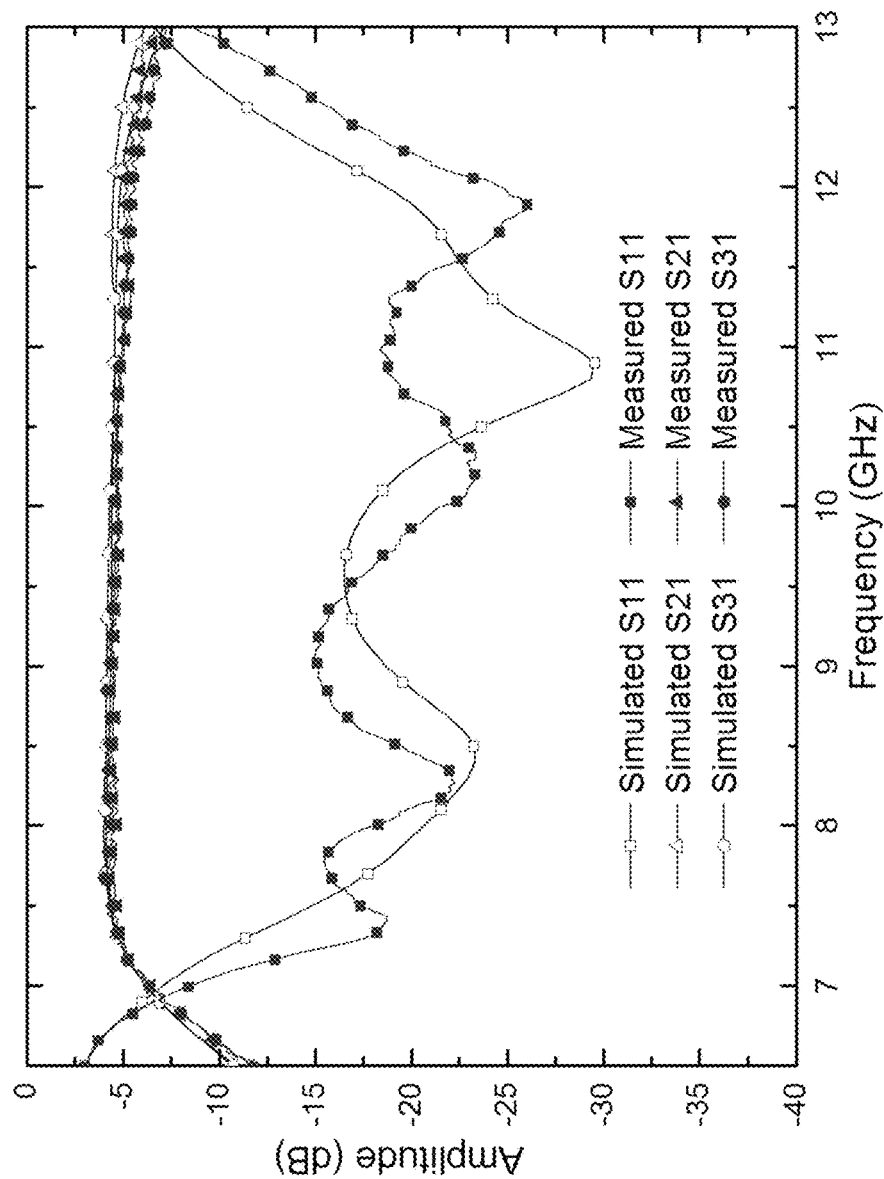
FIG. 13A is a plot showing simulated and measured results of a balun of FIG. 11A.
Figure 13B:
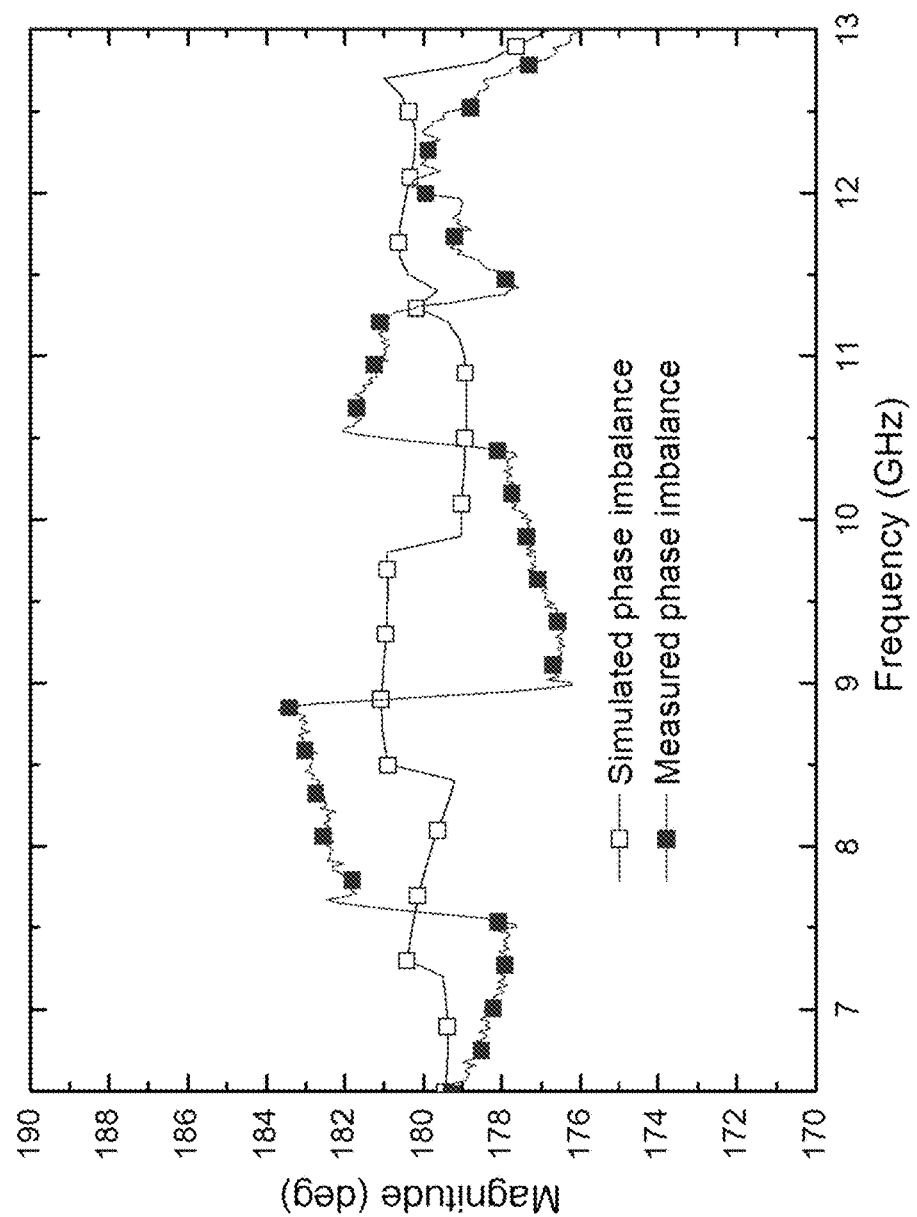
FIG. 13B is a plot showing simulated and measured results of phase imbalance of a balun of FIG. 11A.
Figure 13C:
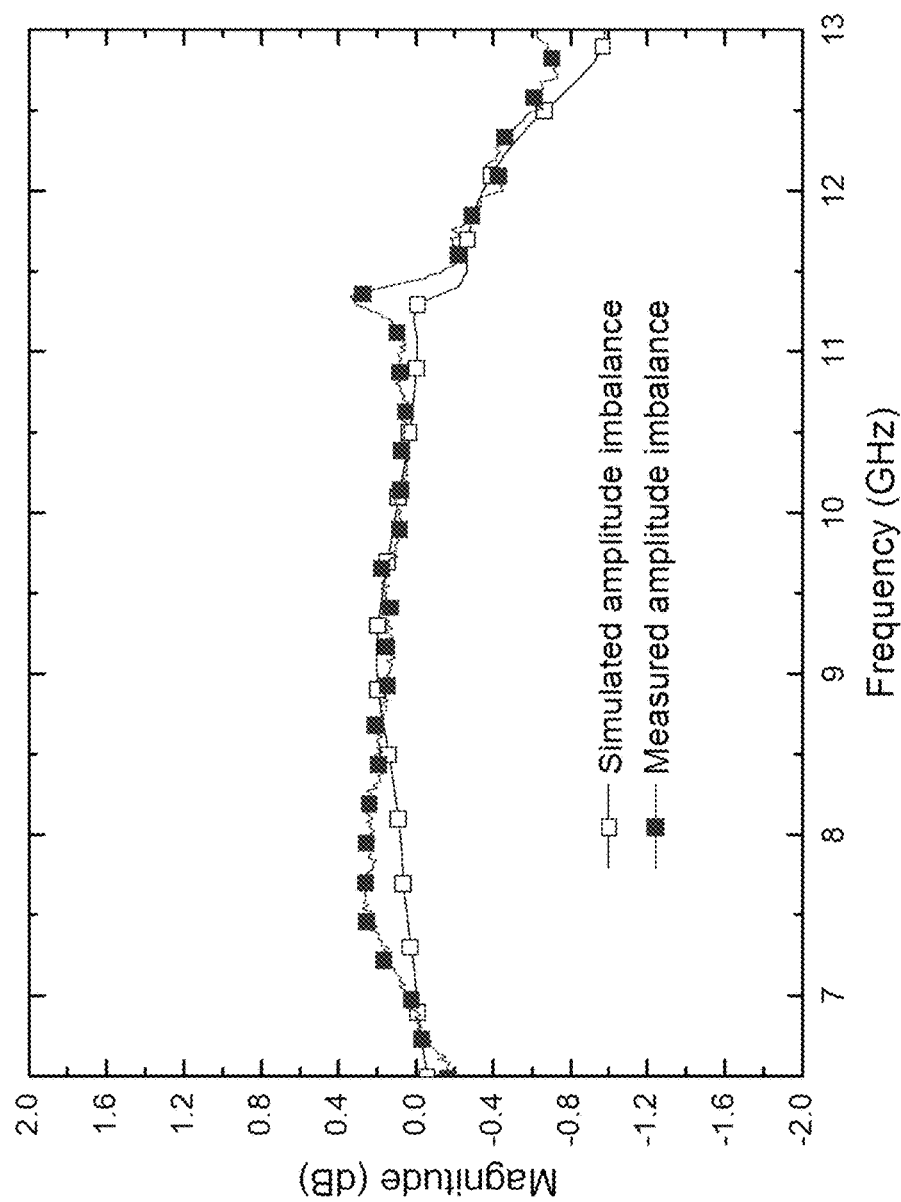
FIG. 13C is a plot showing simulated and measured results of amplitude imbalance a balun of FIG. 11A.

Referring to FIGS. 13A, 13B and 13C, there is shown the measured and simulated results. According to the simulation, the balun 1100 has return loss (FIG. 13A), amplitude imbalance (FIG. 13C), and phase imbalance (FIG. 13B) better than 15 dB, 0.45 dB, and 1.1°, respectively, with an 47.7% bandwidth from 7.5 GHz to 12.2 GHz. In this frequency range, the measured return loss, amplitude imbalance, and phase imbalance are better than 15 dB, 0.45 dB, and 3.8°. The differences between measured and simulated results are mainly due to the fabrication error. The average measured insertion loss is about 4.67 dB, which is mainly as a result of the microstrip-to-slotline transition loss. A fractional bandwidth of 52.9% (7.23-12.5 GHz) has been achieved with measured return loss, amplitude imbalance, and phase imbalance better than 15 dB, 0.6 dB, and 3.8°, respectively. The balun 1100 shows excellent performance with broad bandwidth, verifies the existence of the $TE_{20}$ mode in the SIW, and demonstrates the wideband transition for the $TE_{20}$ mode SIW.

Advantageously, the number of vias 218 is reduced which will decrease the fabrication cost as well as enhance the stability of performance against the worsen fabrication tolerance. The balun 1100 does no need phase shifters at all, and the structure is compact and simple. The balun 1100 has wide bandwidth as well as good phase and amplitude imbalance.

Figure 14A:
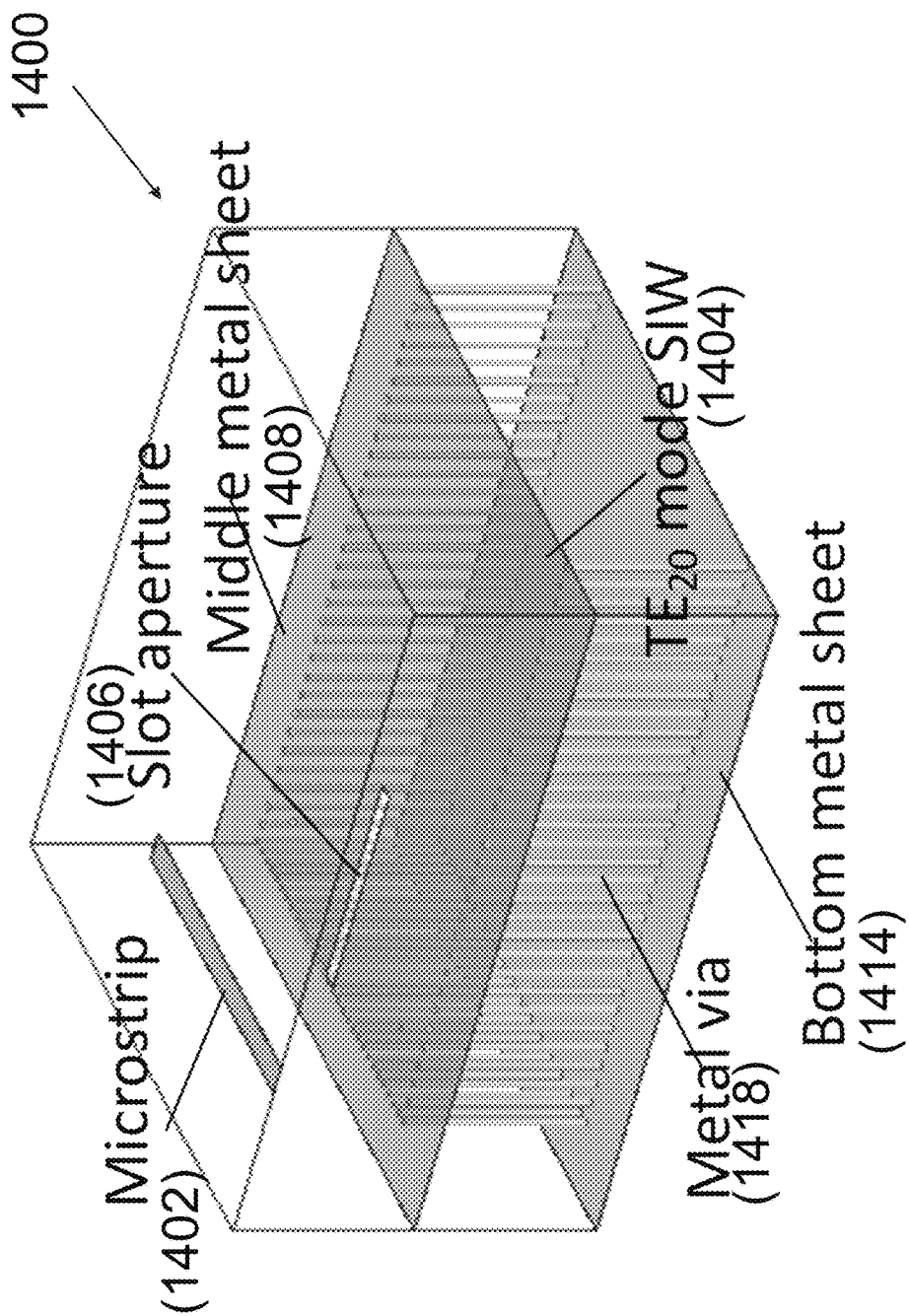
FIG. 14A is a perspective view of an apparatus for electromagnetic signal transition in accordance with an embodiment of the present invention.
Figure 14B:
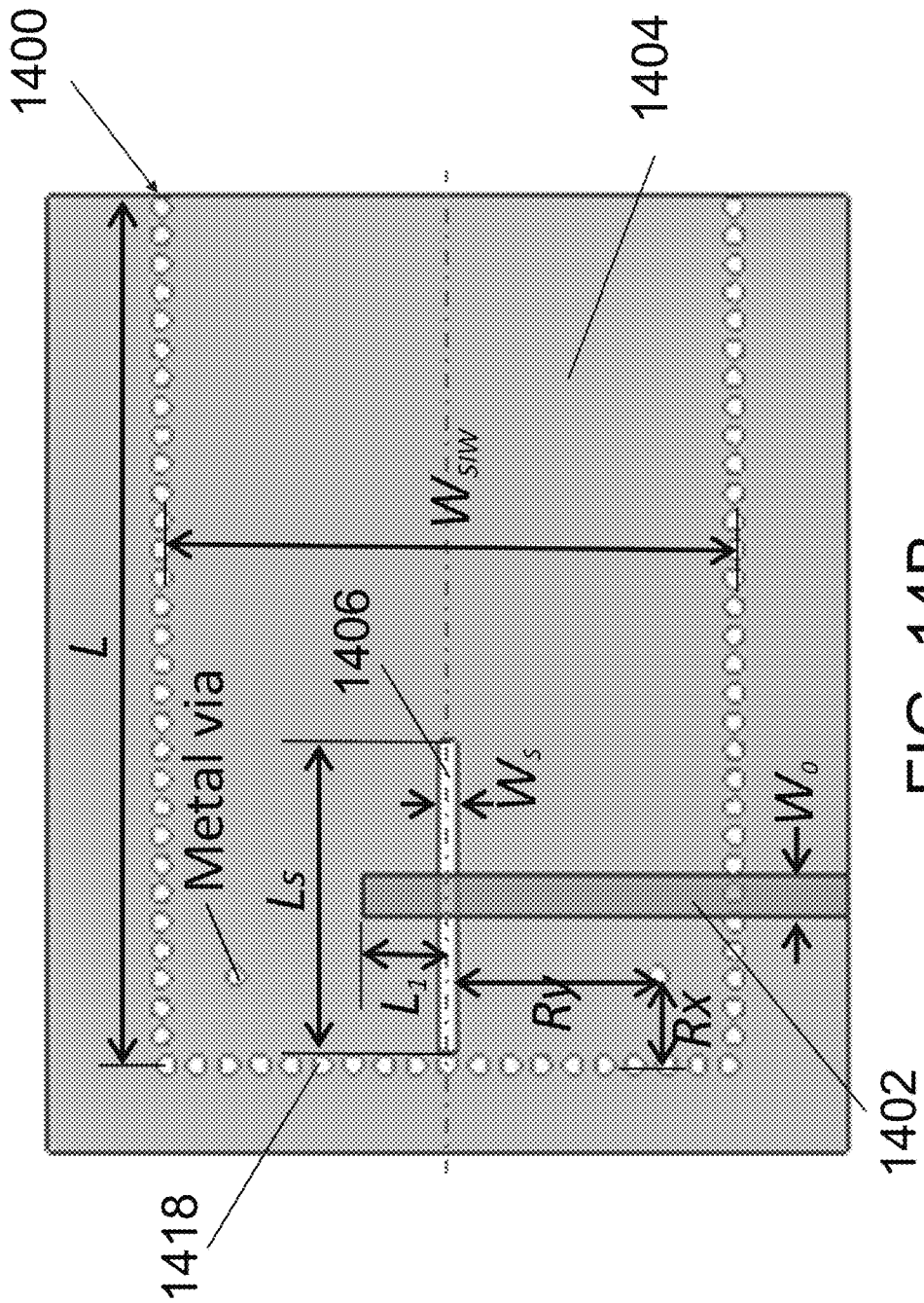
FIG. 14B is a top view of the apparatus for electromagnetic signal transition of FIG. 14A.

In some other example embodiments, the electromagnetic wave may be feed directly to the slots of the SIW for electromagnetic signal transition. With reference to FIGS. 14A and 14B, the signal receiving structure of the apparatus 1400 is a microstrip line 1402 coupled to the at least one slot 1406 of the substrate integrated waveguide 1404, and the electromagnetic signal is excited by and received from the microstrip line 1402. With the excitation of microstrip line 1402, the slot aperture would induce the magnetic current in the longitudinal direction and result in an odd mode field pattern in the below SIW 1404.

In this embodiment, the transition is based on the slot aperture coupling and excited directly by microstrip line 1402. The transition is built on a three-metal layer substrate as shown in FIGS. 14A and 14B. The middle metal sheet 1408 and bottom metal sheet 1414 and the metal vias 1418 are used to form the $TE_{20}$ mode substrate integrated waveguide 1404. The width of $TE_{20}$ mode SIW 1404, $W_{SIW}$, is determined by formula (9). The slot aperture 1406 (which is equivalent to the slot 206 in the previous embodiments) is located in the longitudinal symmetrical plane and the width, $W_S$, is chosen to be 0.2 mm and the length, $L_S$, is set to be a half wavelength of the electromagnetic signal. The aperture 1406 is fed by microstrip line 1402 with an open stub loaded and the length of the open microstrip stub, $L_1$, is a quarter of wavelength of the electromagnetic signal. Two metal vias 1418 are installed in the corner of the SIW 1404 to improve the impedance matching and achieve a wideband transition for the $TE_{20}$ mode SIW.

Figure 15A:
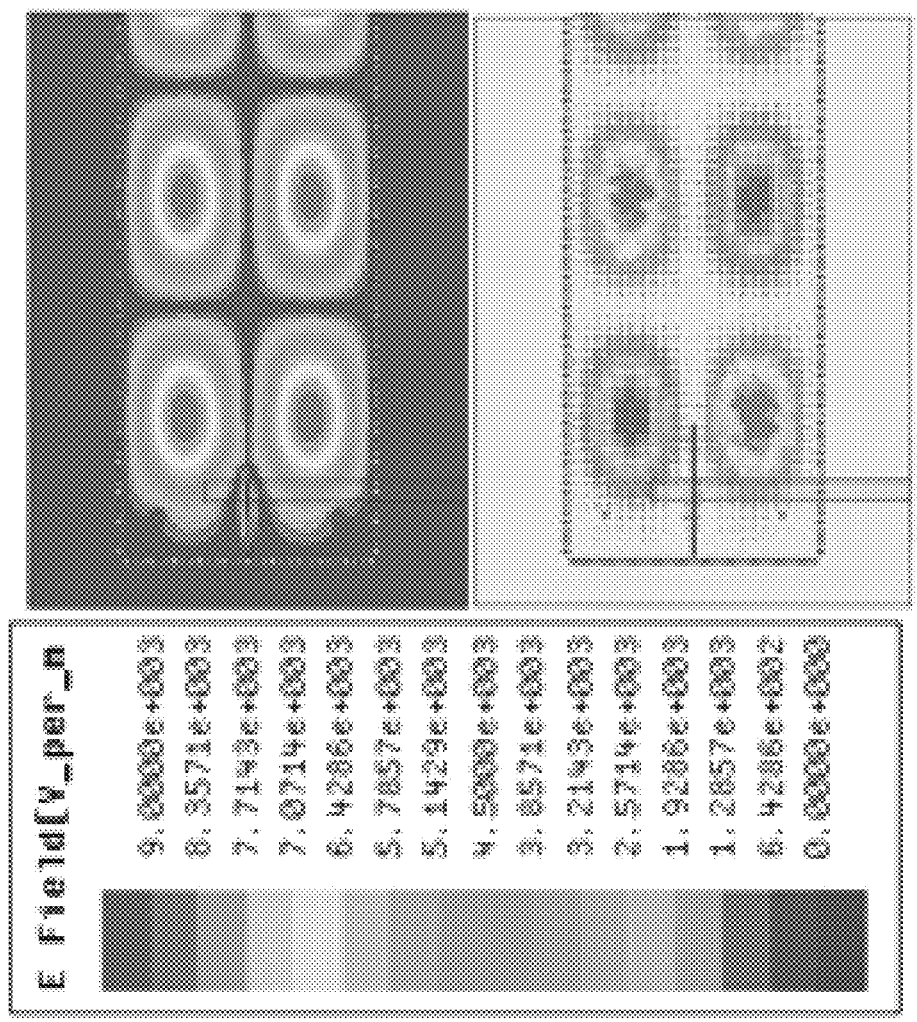
FIG. 15A is a plot showing electric distributions in an SIW of an apparatus for electromagnetic signal transition of FIG. 14A at 8.2 GHz.
Figure 15B:
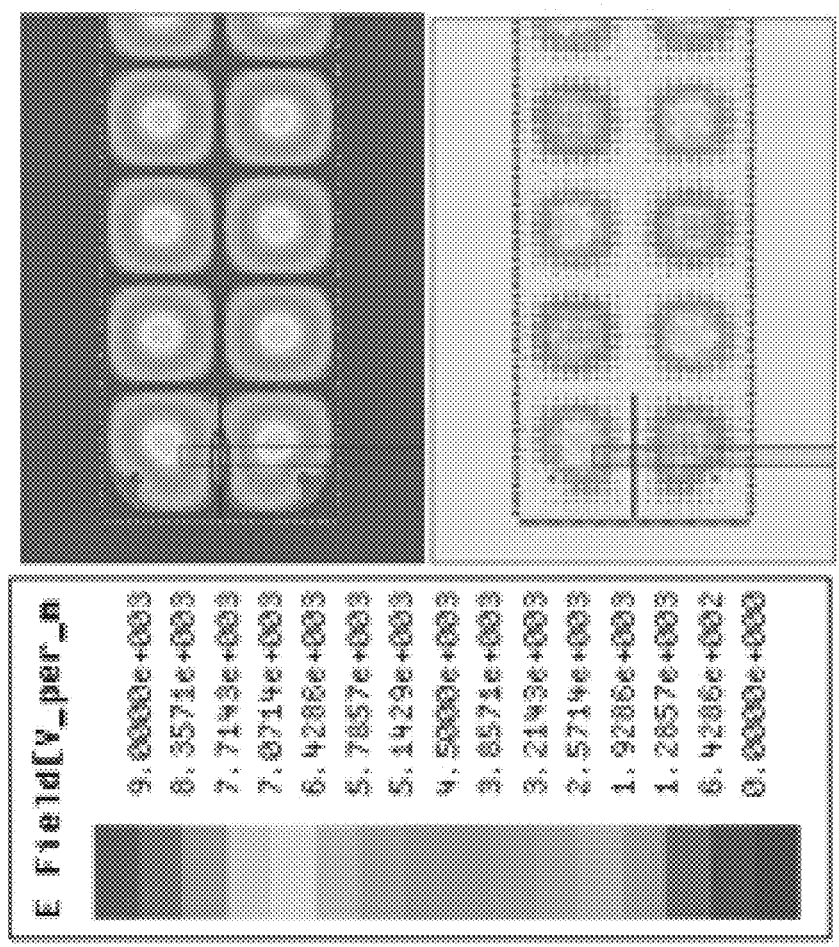
FIG. 15B is a plot showing electric distributions in an SIW of an apparatus for electromagnetic signal transition of FIG. 14A at 10.5 GHz.
Figure 15C:
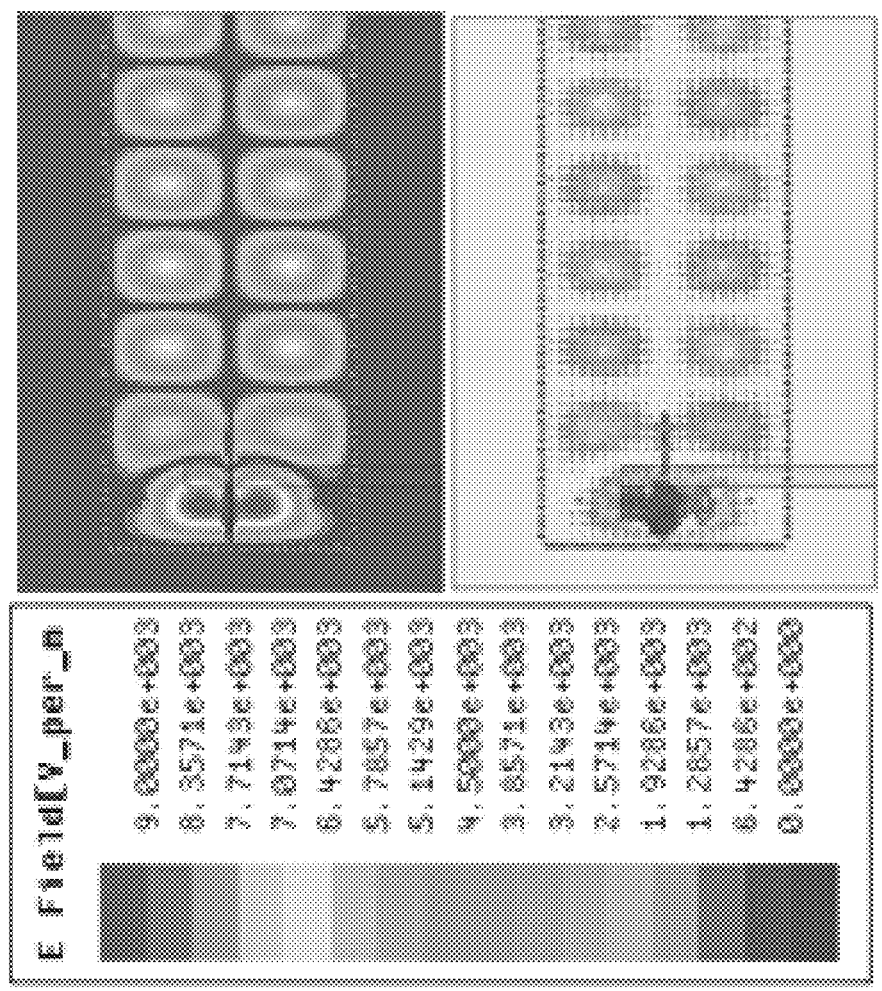
FIG. 15C is a plot showing electric distributions in an SIW of an apparatus for electromagnetic signal transition of FIG. 14A at 12.9 GHz.

Referring to FIGS. 15A to 15C, the electric field distributions of the apparatus 1400 exhibited at the frequency of 8.2 GHz, 10.5 GHz, and 12.9 GHz respectively. The excellent performance of the transition of the apparatus 1400 has been demonstrated. As shown in the Figures, only the $TE_{20}$ mode has been excited and transmitted in the SIW within a broad bandwidth.

Figure 16A:
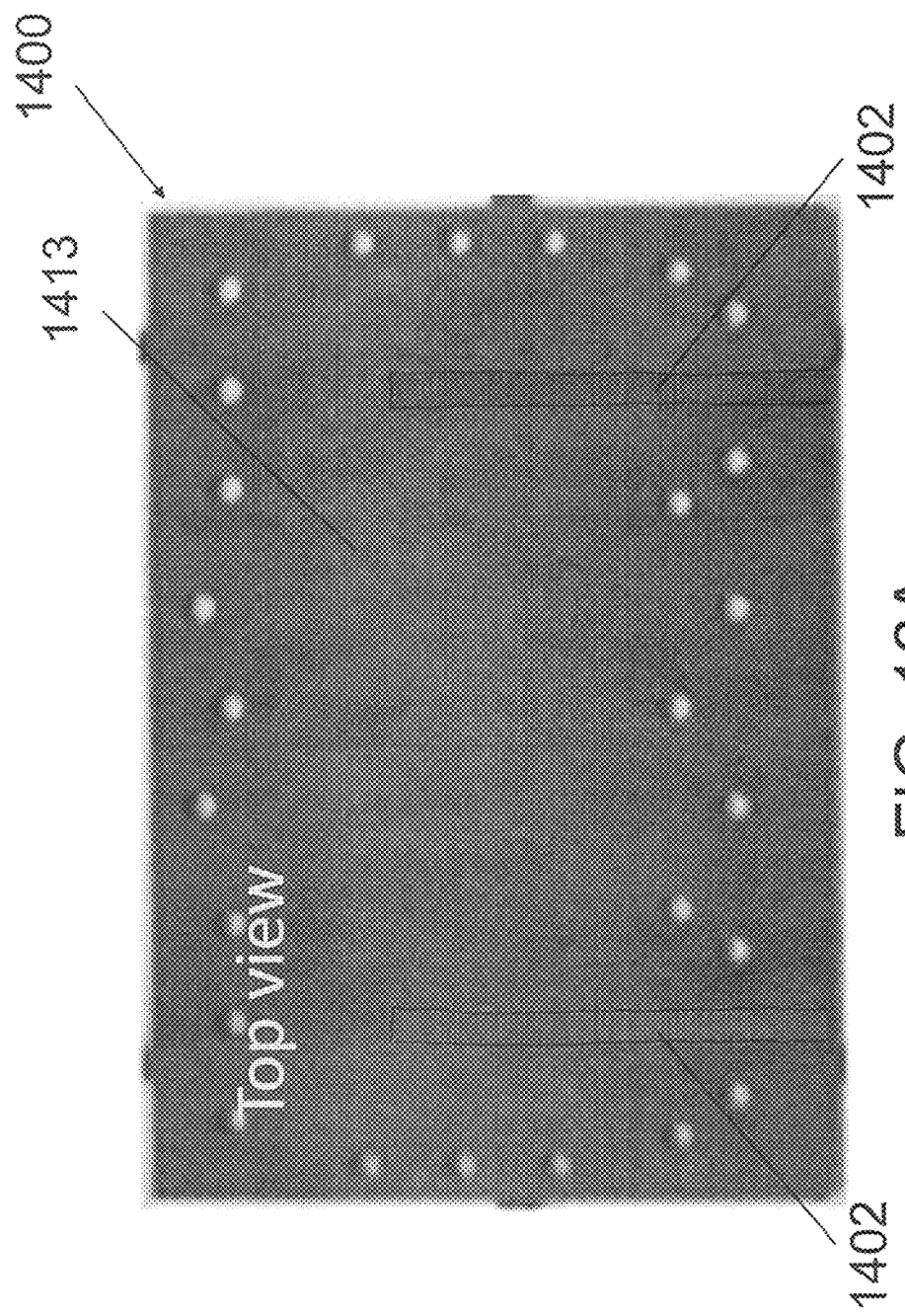
FIG. 16A is a photographic image showing a top view of a substrate board I of a fabricated apparatus for a back-to-back electromagnetic signal transition of FIG. 14A.
Figure 16B:
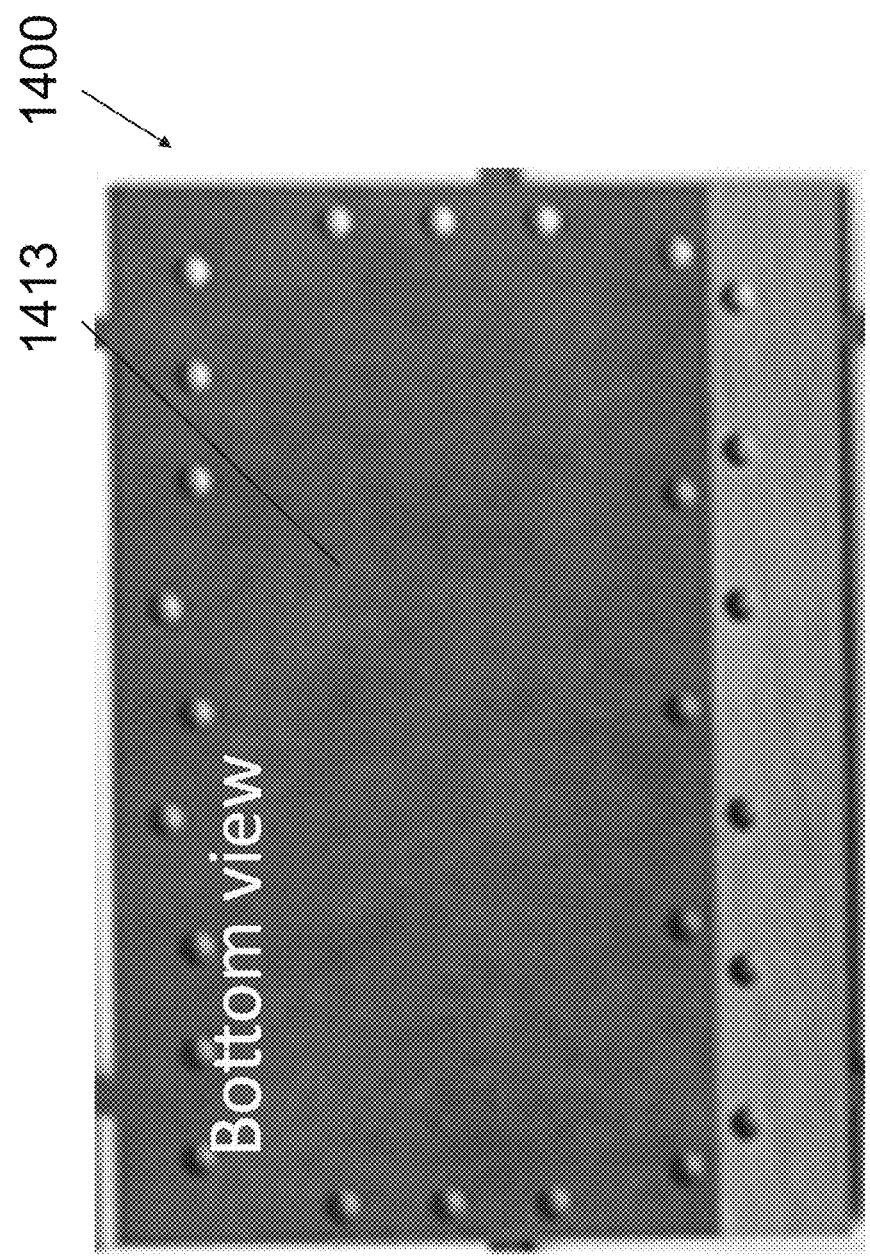
FIG. 16B is a photographic image showing a bottom view of a substrate board I of a fabricated apparatus for a back-to-back electromagnetic signal transition of FIG. 14A.
Figure 16C:
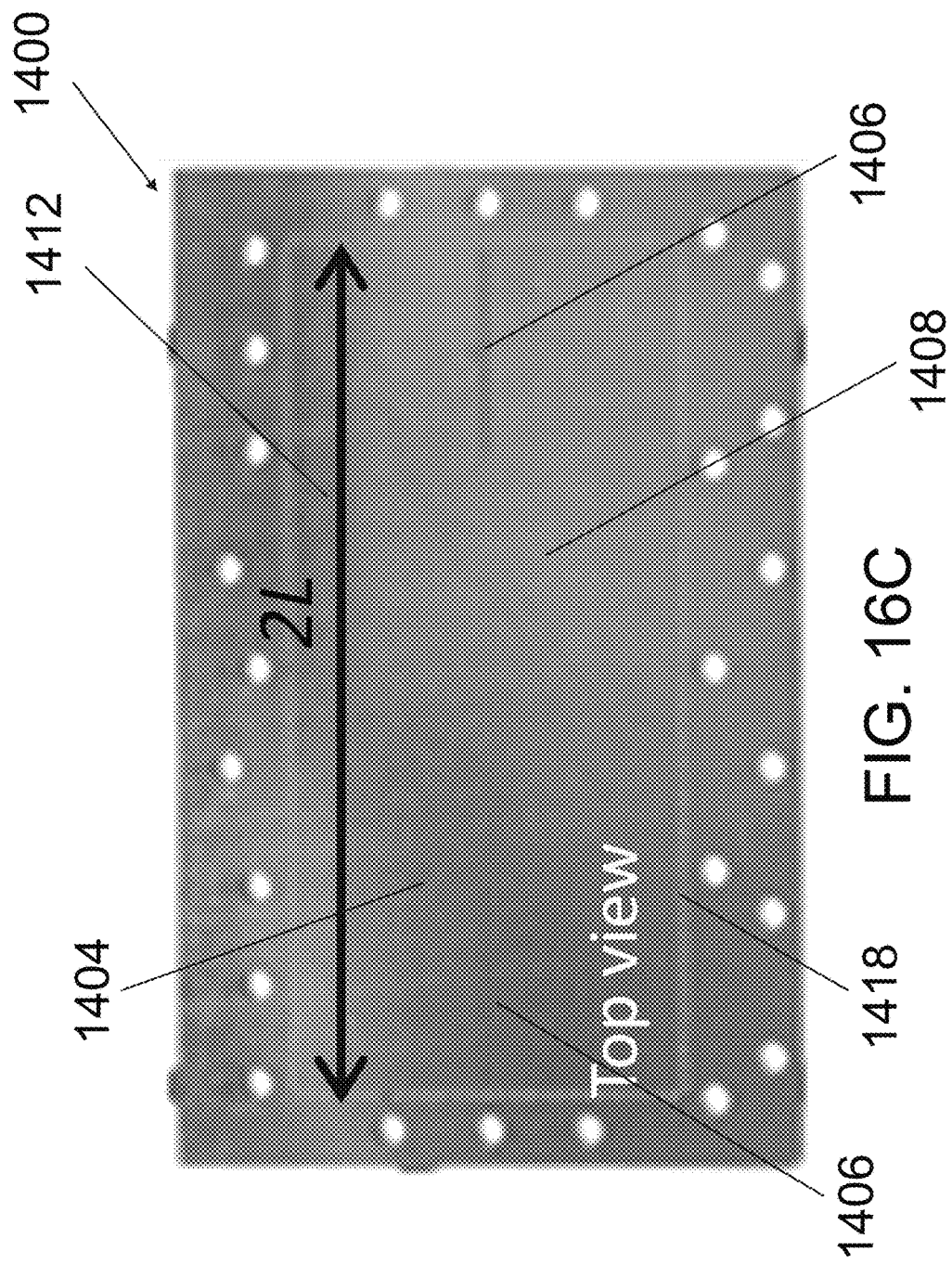
FIG. 16C is a photographic image showing a top view of a substrate board II of a fabricated apparatus for a back-to-back electromagnetic signal transition of FIG. 14A.
Figure 16D:
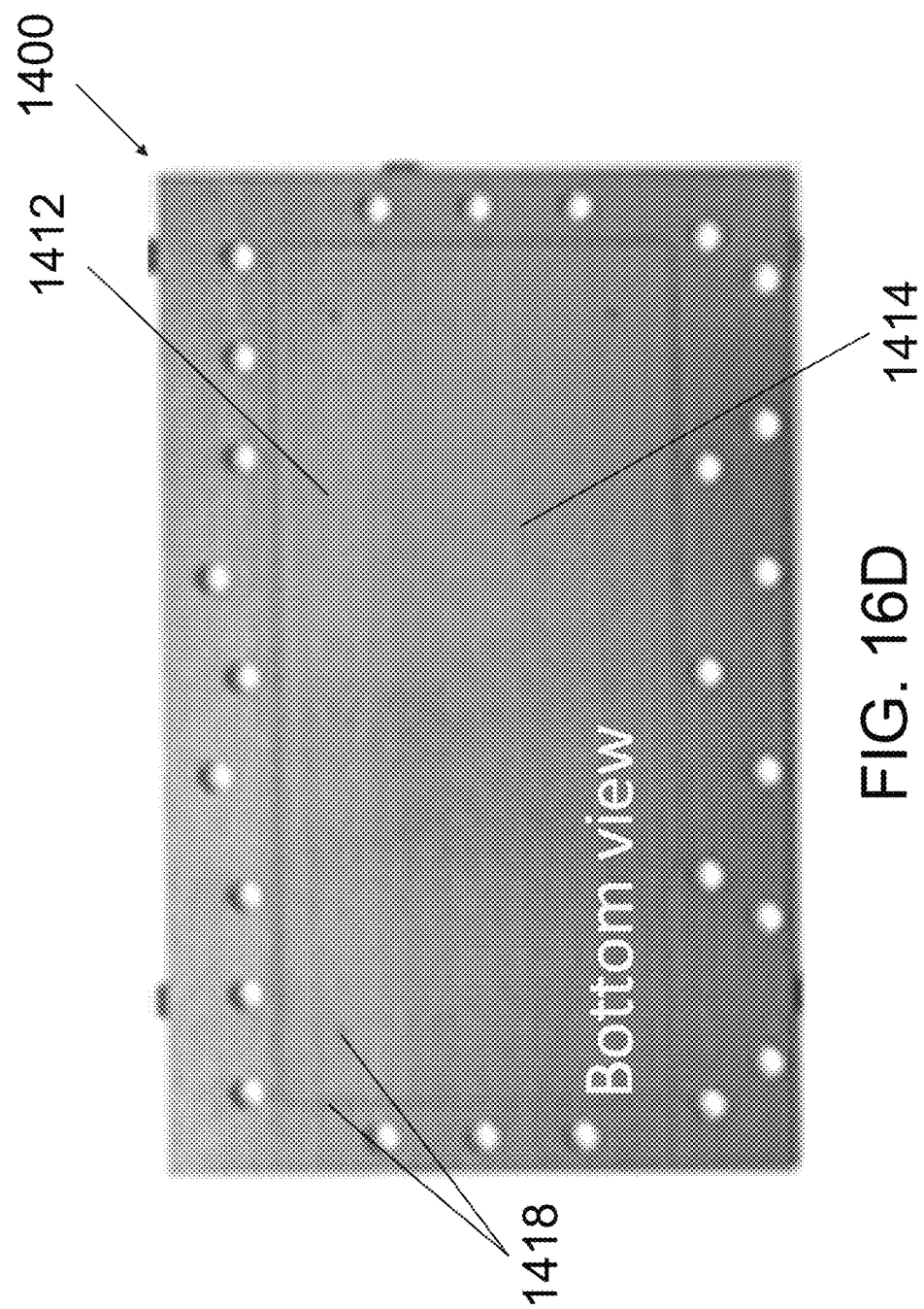
FIG. 16D is a photographic image showing a bottom view of a substrate board II of a fabricated apparatus for a back-to-back electromagnetic signal transition of FIG. 14A.

In order to experimentally demonstrate the transition performance, a back-to-back transition is designed in an example embodiment. As shown in FIGS. 16A to 16D, two layers of the Rogers RT/duroid 5870 dielectric substrate (relative dielectric constant of 2.33 and thickness of 0.79 mm) are used to fabricate the transition. The top microstrip line 1402 is printed on substrate board I 1413 (FIGS. 16A and 16B), the middle metal layer 1408 and bottom metal layer 1414 and the metal vias 1418 are fabricated on substrate board II 1412 (FIGS. 16C and 16D). At last, the two substrate boards (1412, 1413) are stacked and fixed together by screws.

Figure 17:
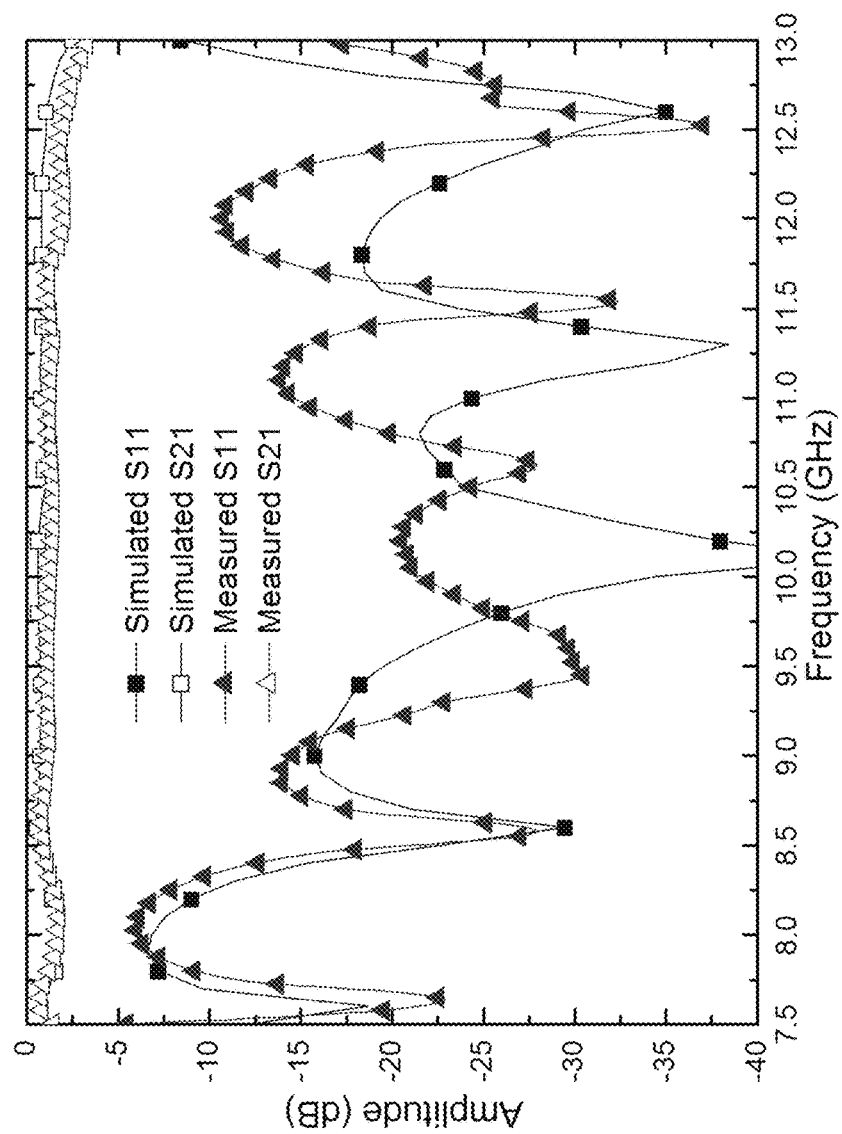
FIG. 17 is a plot showing simulated and measured S-parameters of an apparatus for electromagnetic signal transition of FIG. 16A with back-to-back transition structure.

The measured and EM simulated return loss $S_{11}$ and insertion loss $S_{21}$ are compared in FIG. 17. It can be seen that the transition has a broad bandwidth and the measured results agree with the simulations. The measured $S_{11}$ and $S_{21}$ are better than 10.1 dB and 2.1 dB in the frequency range from 8.34 GHz to 12.58 GHz with a fractional bandwidth of 40.5%. In particular, from 8.4 GHz to 11.8 GHz (36.6%), the measured $S_{11}$ and $S_{21}$ are better than 13.8 dB and 1.5 dB. According to the simulation results, $S_{11}$ and $S_{21}$ are better than 15 dB and 1 dB, respectively, from 8.38 GHz to 12.6 GHz. In this frequency range, the insertion loss for a single transition can concluded to be better than 0.5 dB. The differences between measured and simulated results are mainly due to the fabrication error and the multi-layer substrate assemblage error.

Figure 18A:
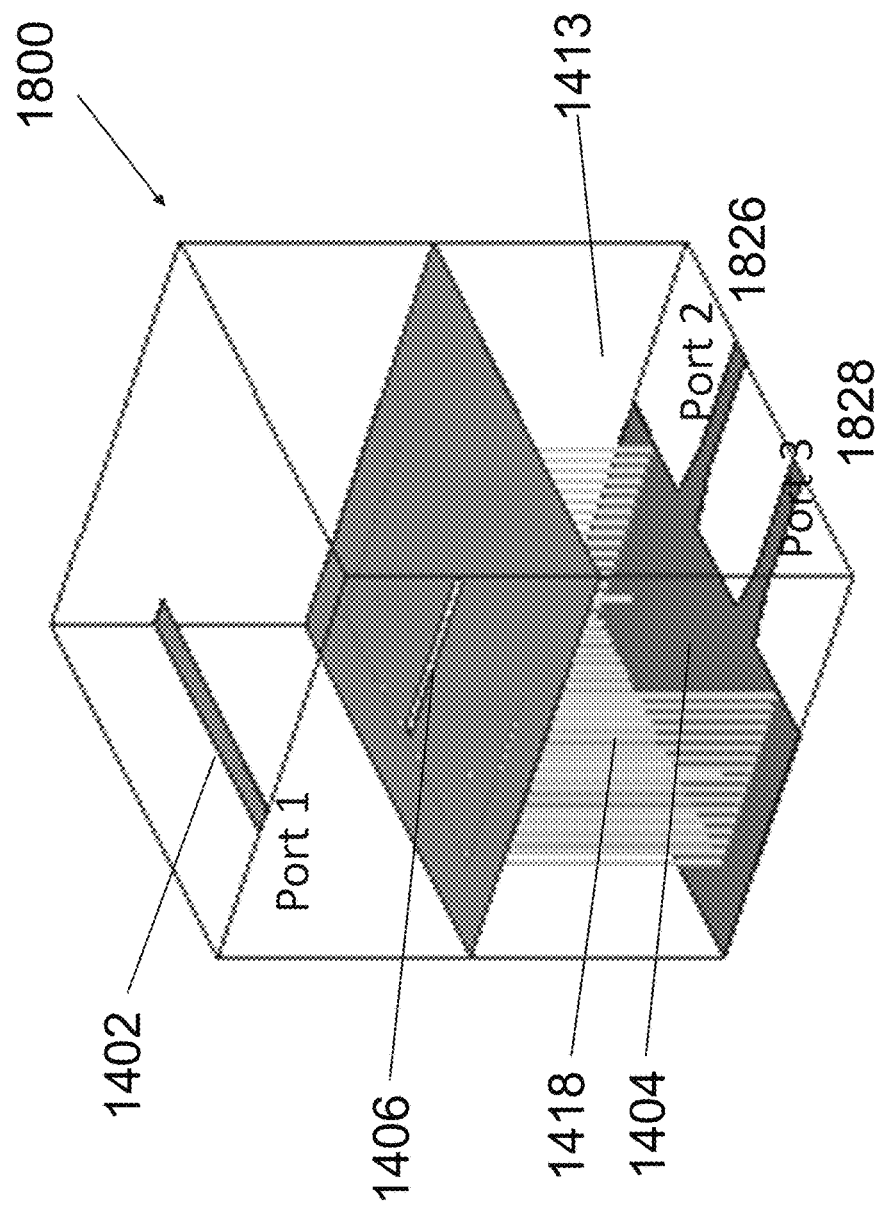
FIG. 18A is a perspective view of a balun in accordance with an embodiment of the present invention.
Figure 18B:
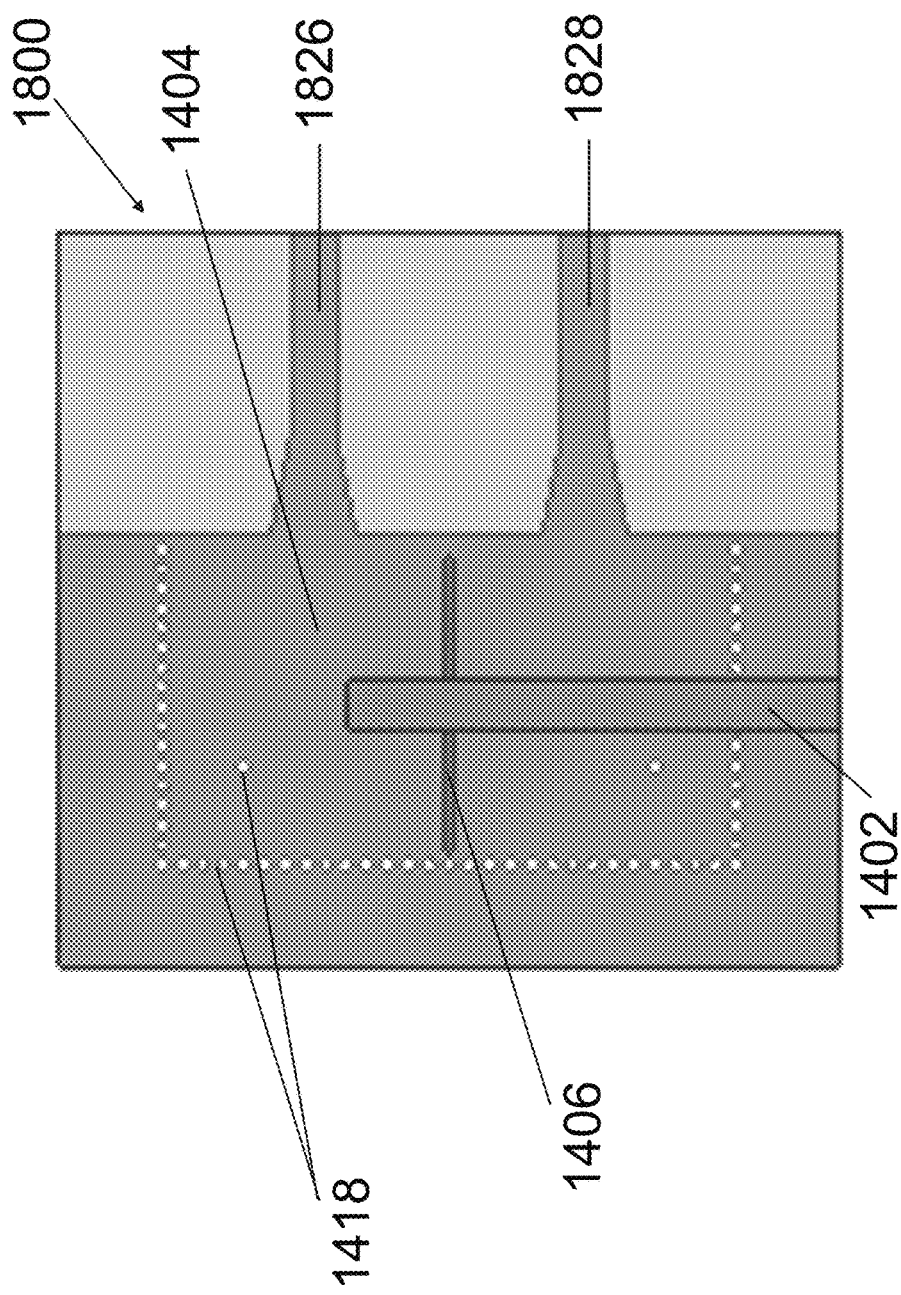
FIG. 18B is a top view of the balun of FIG. 18A.

With reference to FIGS. 18A and 18B, there is shown an example embodiment of a balun device 1800. The balun based on the aperture coupling as described in FIGS. 14A and 14B, and it has three ports. Port 1 (1402) is on the top and the other two ports—Port 2 (1826) and Port 3 (1828) are on the bottom metal sheet. A metal sheet is located in the middle of the structure with a slot aperture to couple electromagnetic signals. The operation scheme is similar to the balun 1100 based on slotline feed.

When the electromagnetic field is incident to the slot aperture 1406 from the top microstrip line 1402, the electric field would be converted to the vertically-polarized field of the $TE_{20}$ mode in the below substrate layer 1413, as shown in FIG. 18A. The electric fields in the SIW 1404 are automatically 180° out-of-phase at opposite sides of the slot. After the SIW 1404 is connected with two microstrip lines (1826, 1828) along the longitudinal direction, the electromagnetic field would be guided out separately with reversed phase but equal amplitude. Then, 180° out-of-phase outputs are achieved.

Figure 19A:
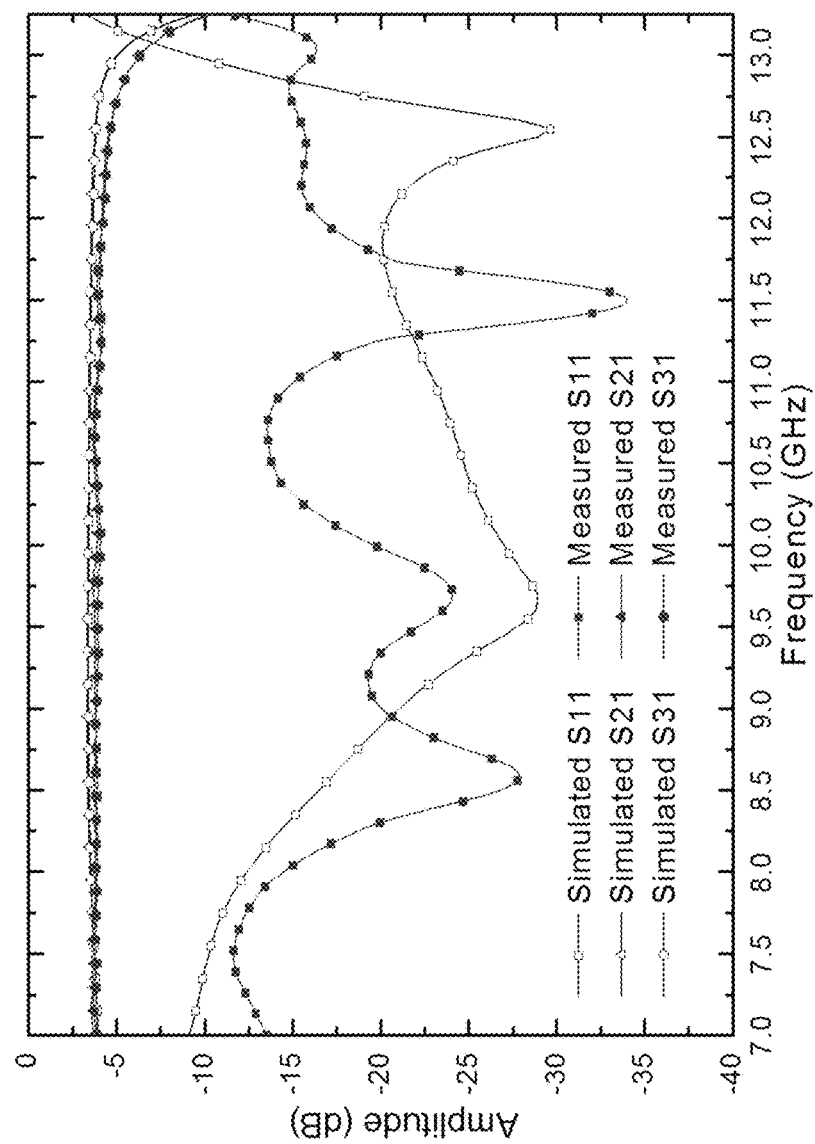
FIG. 19A is a plot showing simulated and measured S-parameters of the balun of FIG. 18A.
Figure 19B:
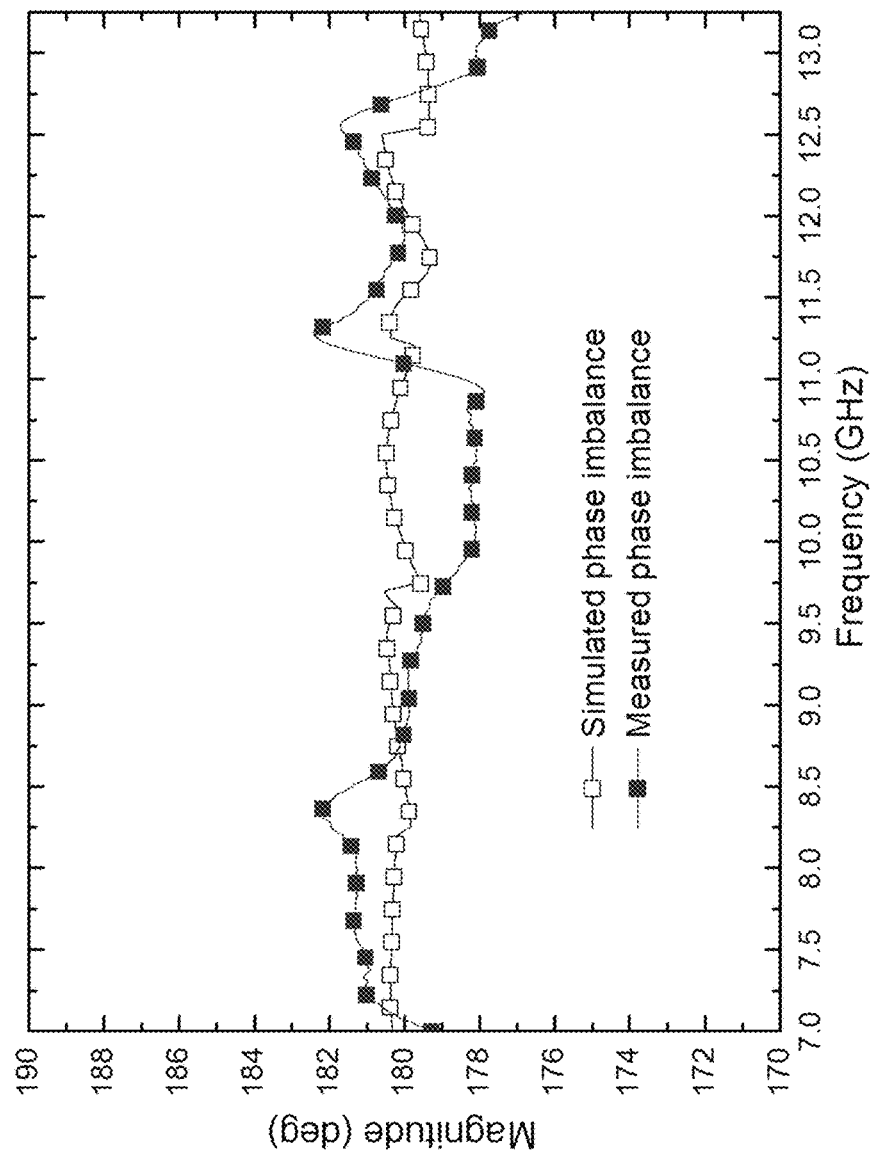
FIG. 19B is a plot showing simulated and measured phase imbalance of the balun of FIG. 18A.
Figure 19C:
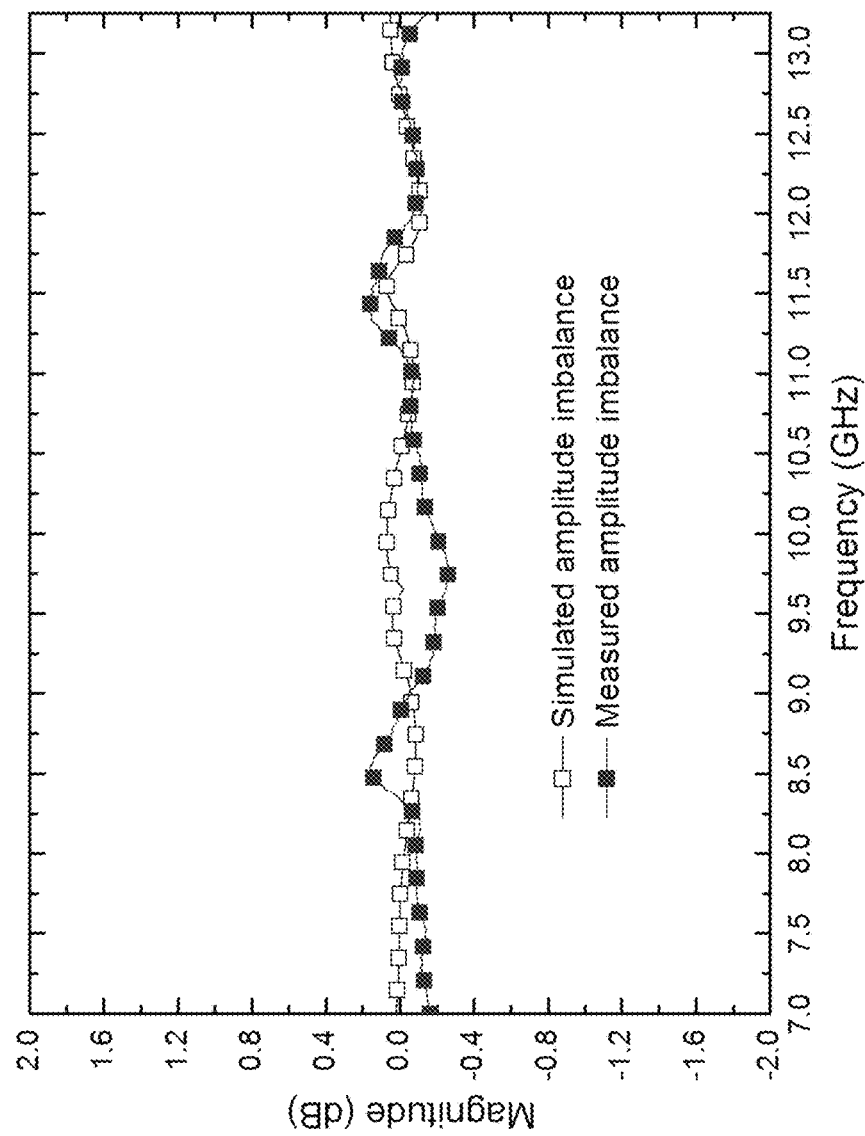
FIG. 19C is a plot showing simulated and measured amplitude imbalance of the balun of FIG. 18A.

The measured and EM simulated results are shown in FIGS. 19A to 19C. According to the simulation of the balun 1800, the balun 1800 has return loss, amplitude imbalance, and phase imbalance better than 15 dB, 0.45 dB, and 1.1°, respectively, with an 47.7% bandwidth from 7.5 GHz to 12.2 GHz. In this frequency range, the measured return loss, amplitude imbalance, and phase imbalance are better than 15 dB, 0.45 dB, and 3.8°. The differences between measured and simulated results are mainly due to the fabrication error. The average measured insertion loss is about 4.67 dB, which is mainly as a result of the microstrip-to-slotline transition loss in the balun 1800.

Overall, a fractional bandwidth of 52.9% (7.23-12.5 GHz) has been achieved with measured return loss, amplitude imbalance, and phase imbalance better than 15 dB, 0.6 dB, and 3.8°, respectively. The balun 1800 shows good amplitude/phase imbalance performance, verifies the existence of the $TE_{20}$ mode in the SIW 1404, and demonstrates the wideband transition in the balun 1800.

Figure 20A:
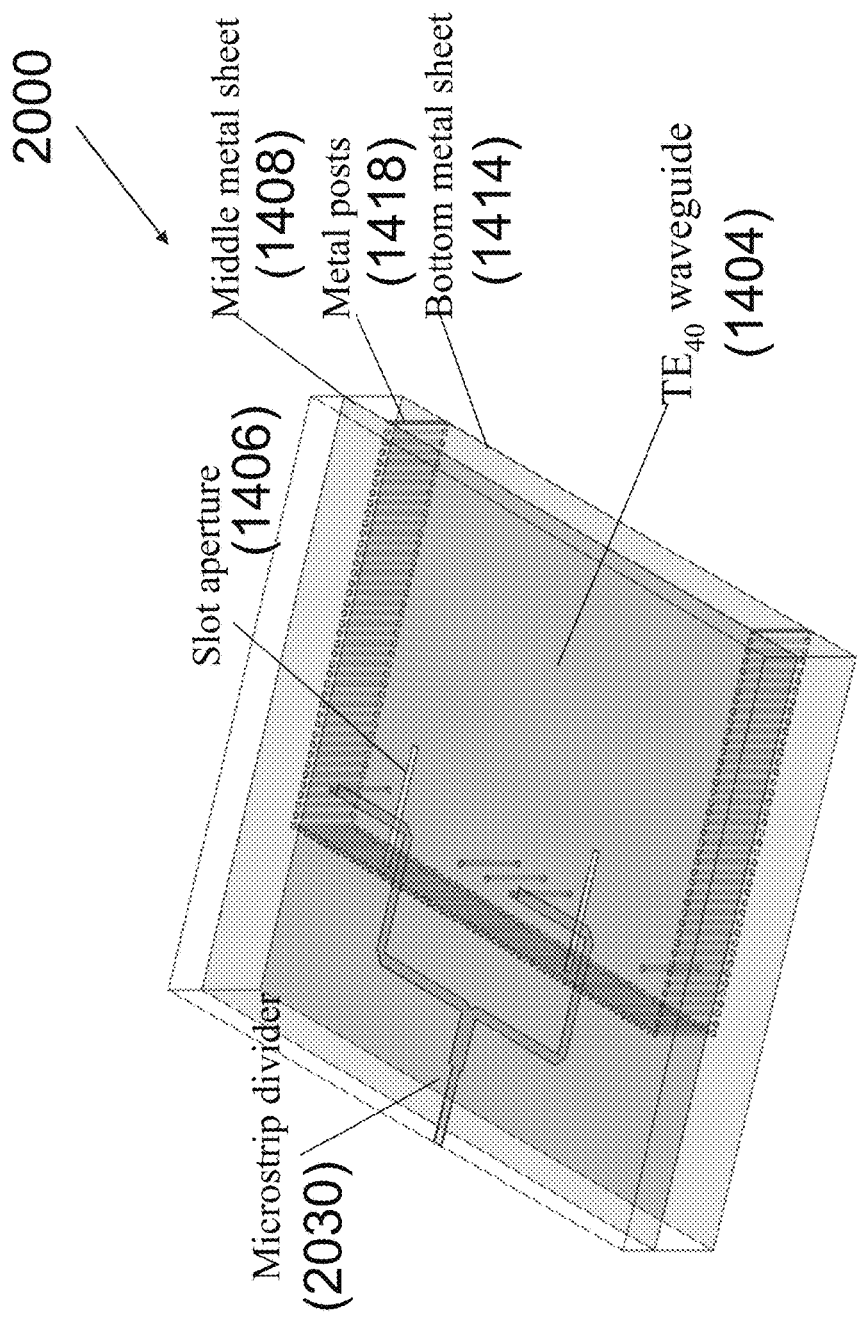
FIG. 20A is a perspective view of an apparatus for electromagnetic signal transition in accordance with an embodiment of the present invention.
Figure 20B:
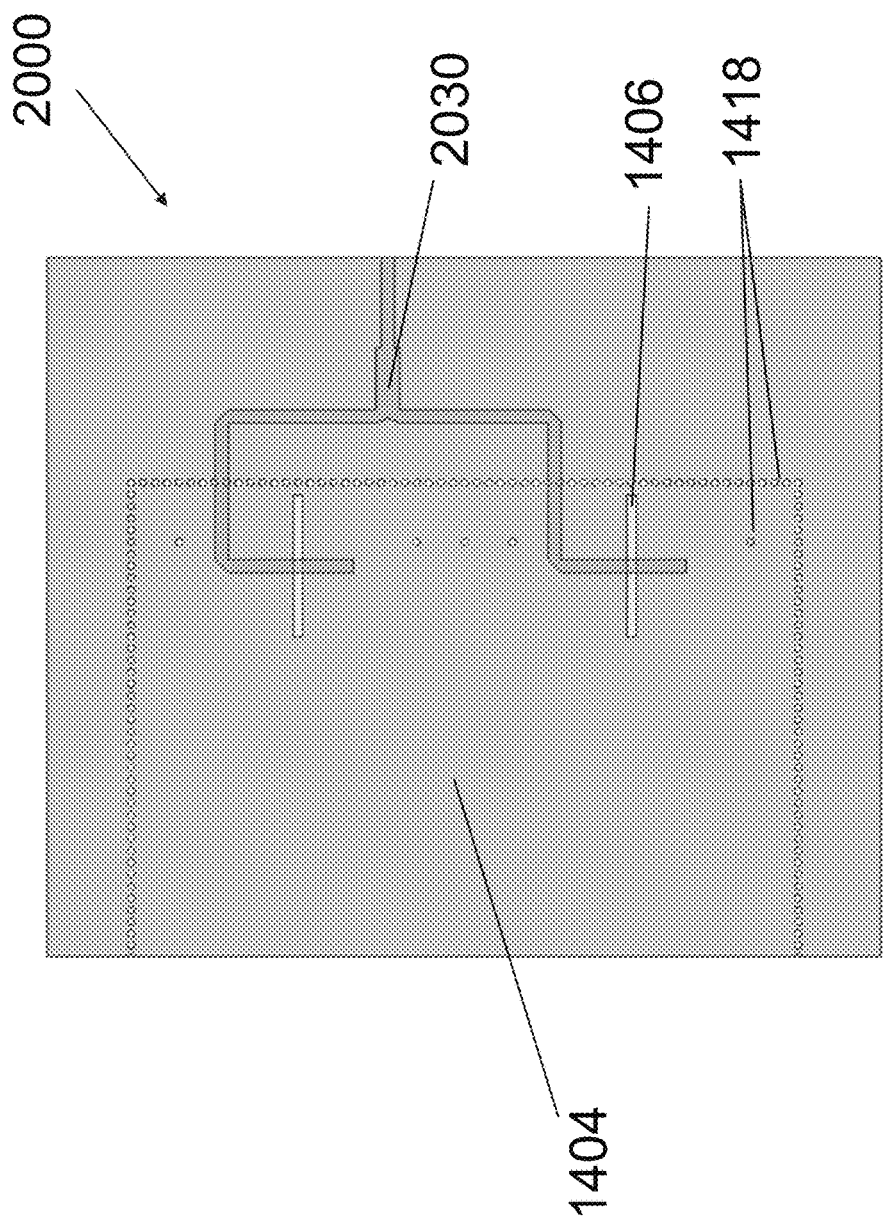
FIG. 20B is a top view of the apparatus for electromagnetic signal transition of FIG. 20A.

Preferably, the $TE_{2N,0}$ SIW mode can be excited by a N-Way divider 2030. With reference to FIGS. 20A to 20B, the $TE_{40}$ SIW mode is excited by using a 2-Way microstrip divider 2030 in the apparatus 2000. Such structure may be considered as two parallel transitions apparatus as shown in the previous embodiments working with $TE_{20}$ SIW mode.

Figure 21:
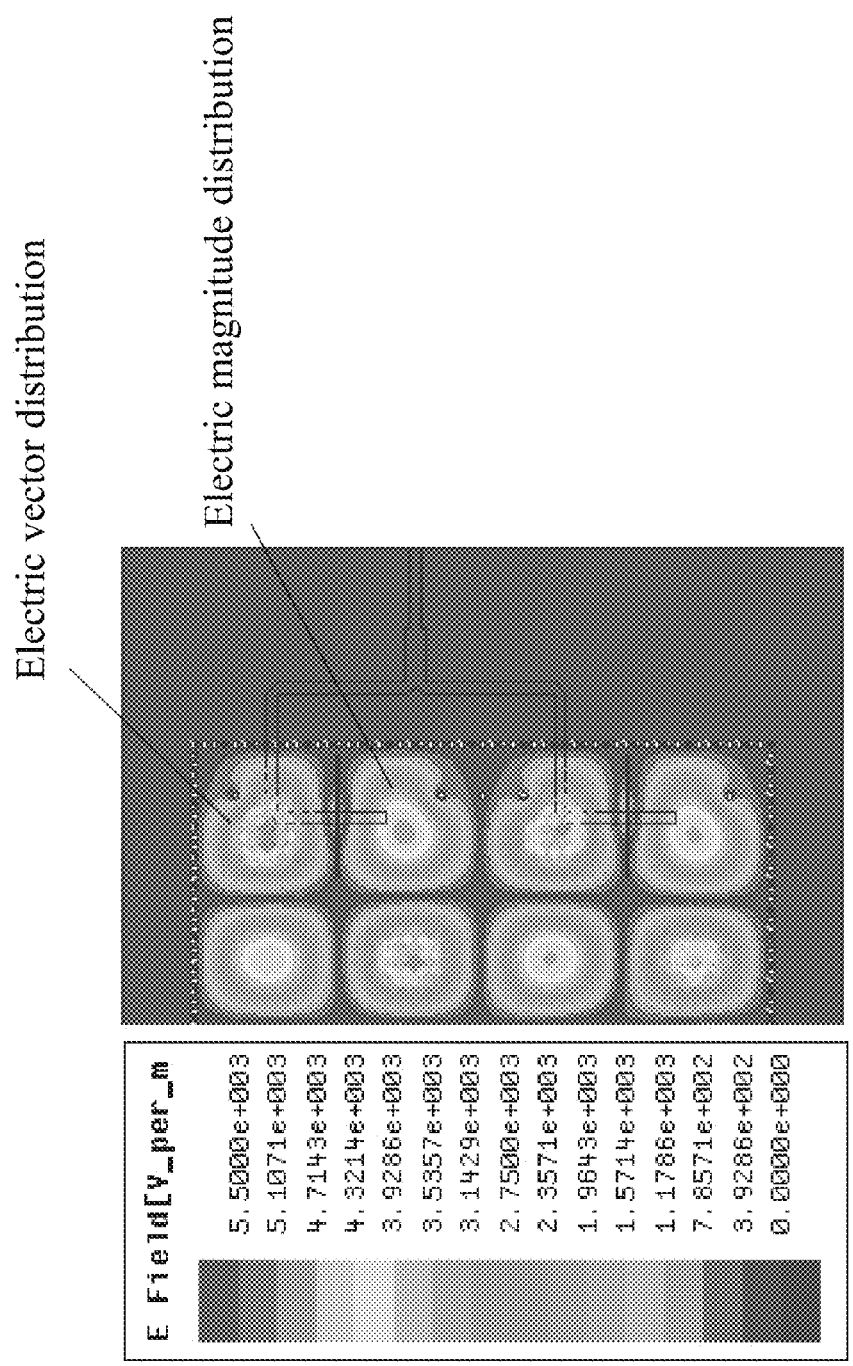
FIG. 21 is a plot showing electric distributions in an SIW of an apparatus for electromagnetic signal transition of FIG. 20A at 9 GHz.

With reference to FIG. 21, there is provided the electric field distributions of the apparatus 2000 at the frequency of 9 GHz. The excellent performance of the transition has been demonstrated directly. Only the $TE_{40}$ mode has been excited and transmitted in the SIW 2004 within a broad bandwidth.

Figure 22A:
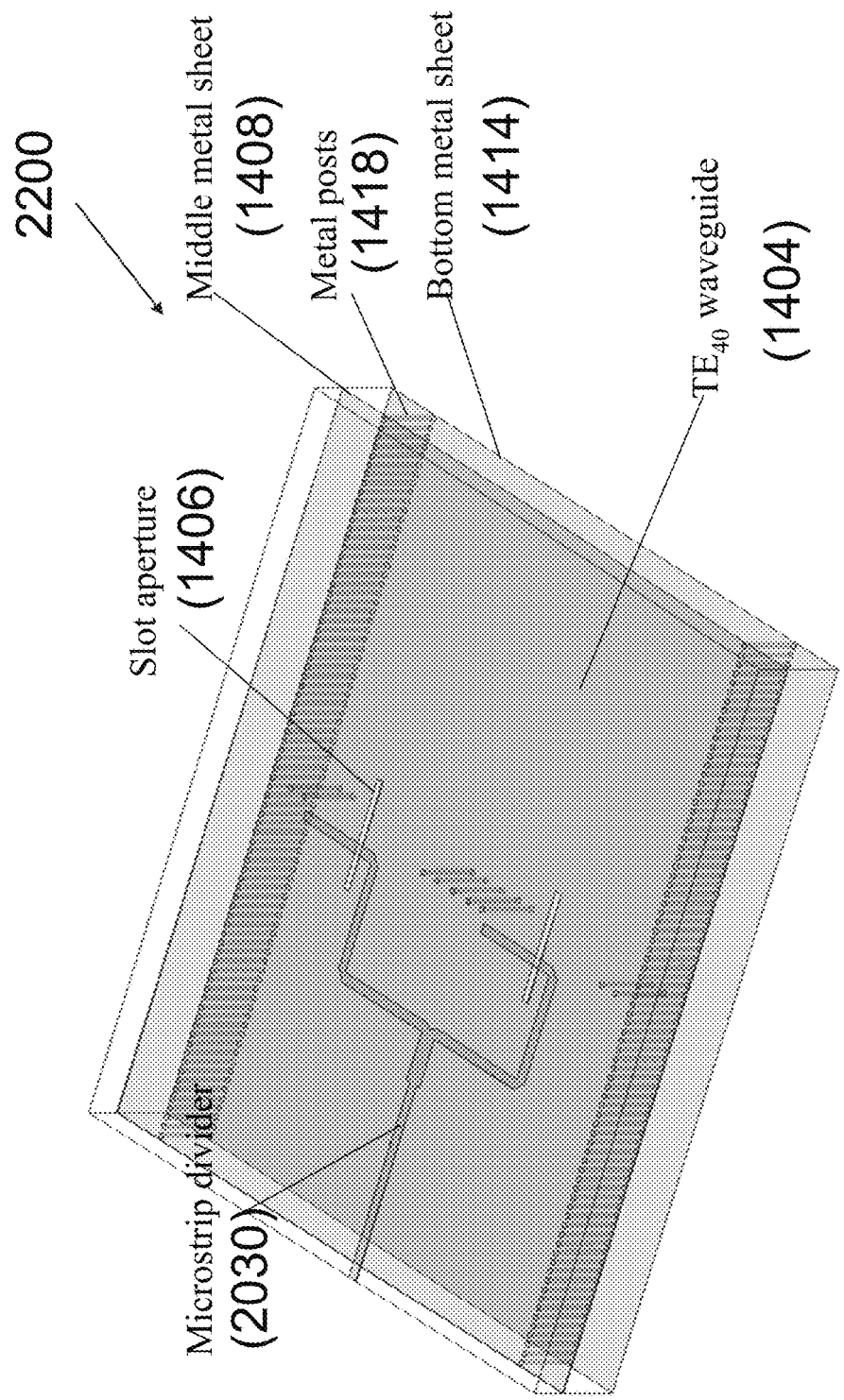
FIG. 22A is a perspective view of an apparatus for electromagnetic signal transition in accordance with an embodiment of the present invention.
Figure 22B:
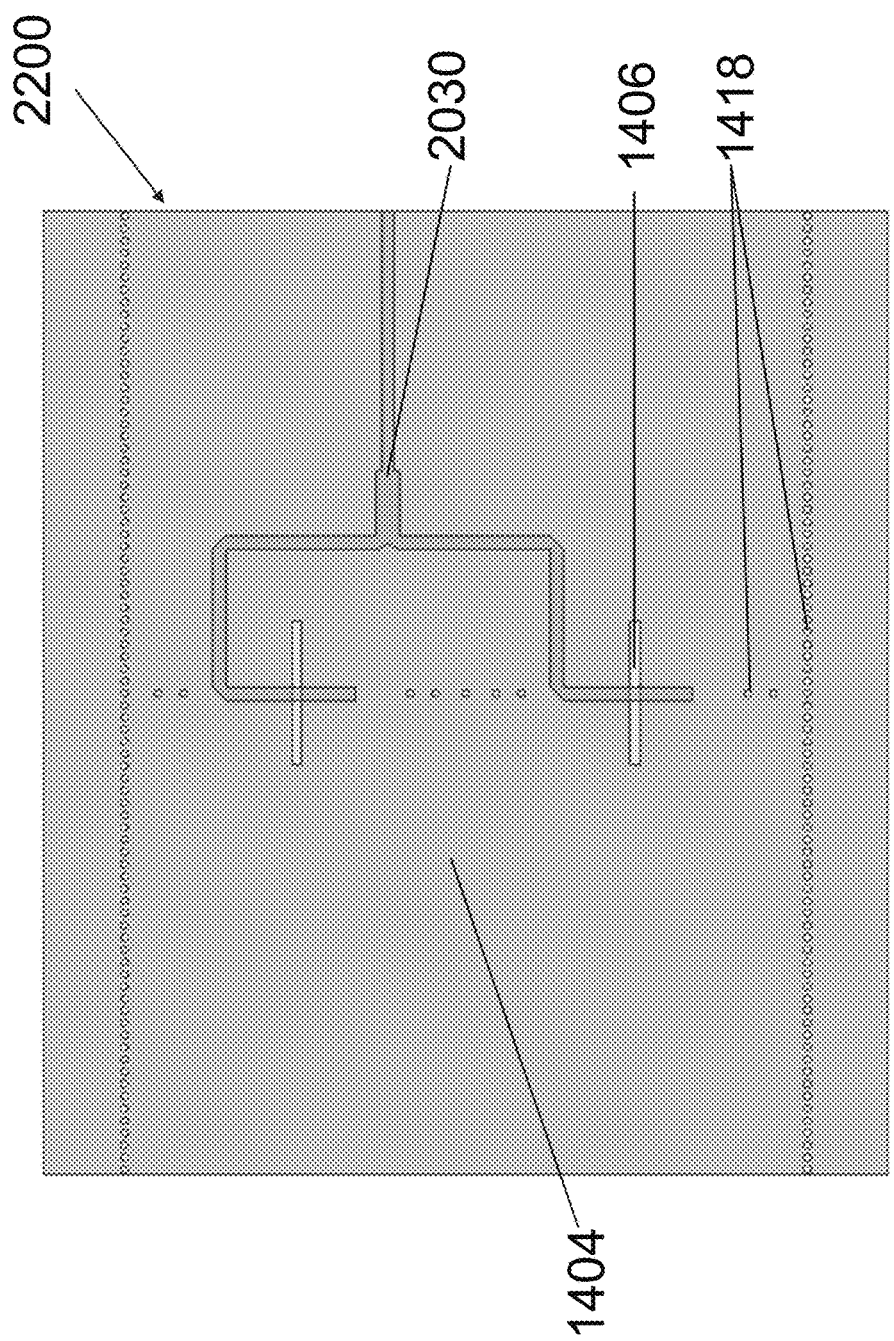
FIG. 22B is a top view of the apparatus for electromagnetic signal transition of FIG. 22A.
Figure 23A:
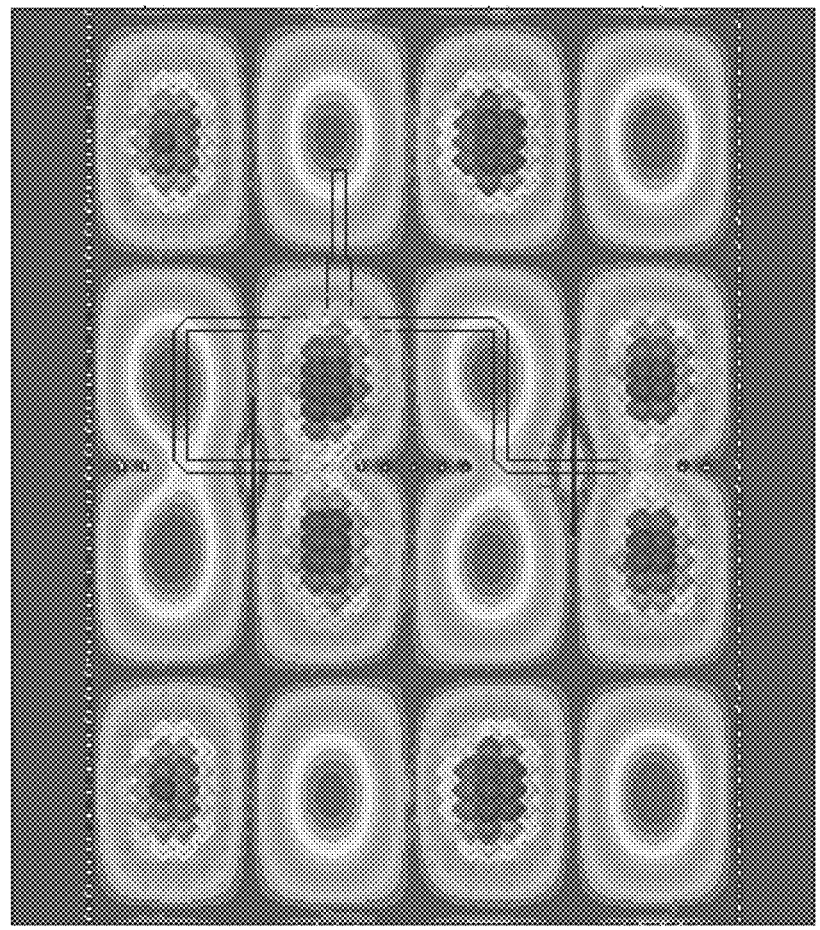
FIG. 23A is a plot showing electric distributions in an SIW of an apparatus for electromagnetic signal transition of FIG. 22A at 7 GHz.
Figure 23A:
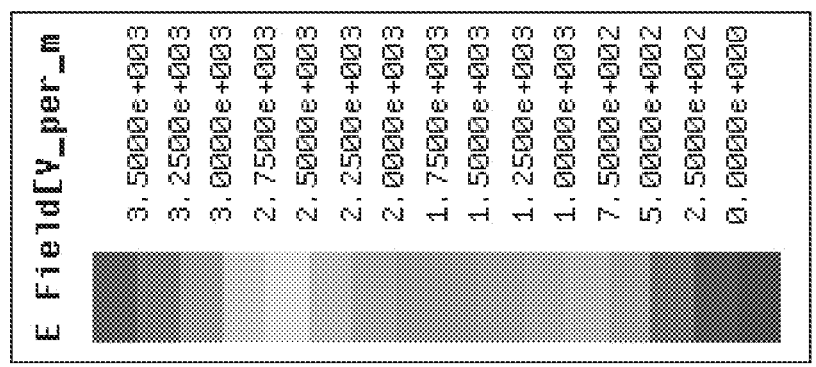
Figure 23B:
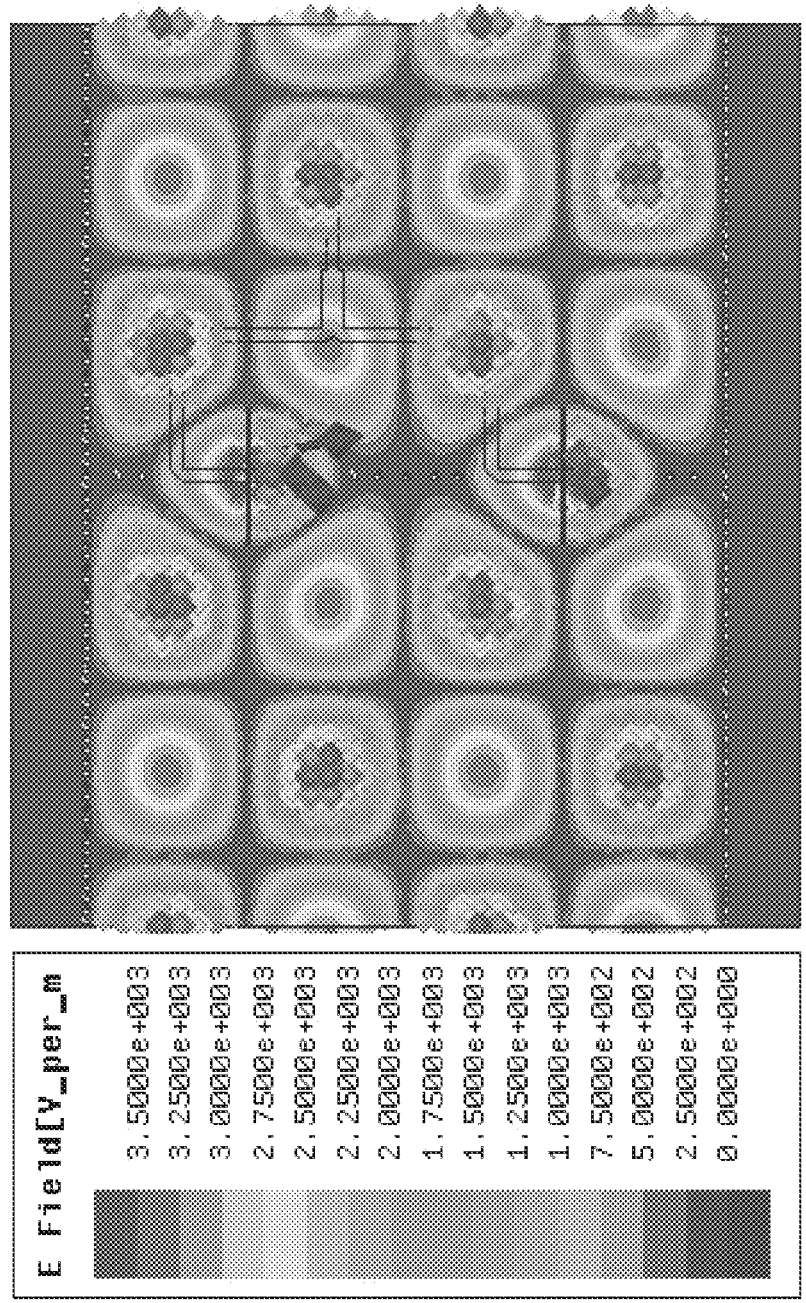
FIG. 23B is a plot showing electric distributions in an SIW of an apparatus for electromagnetic signal transition of FIG. 22A at 8 GHz.
Figure 23C:
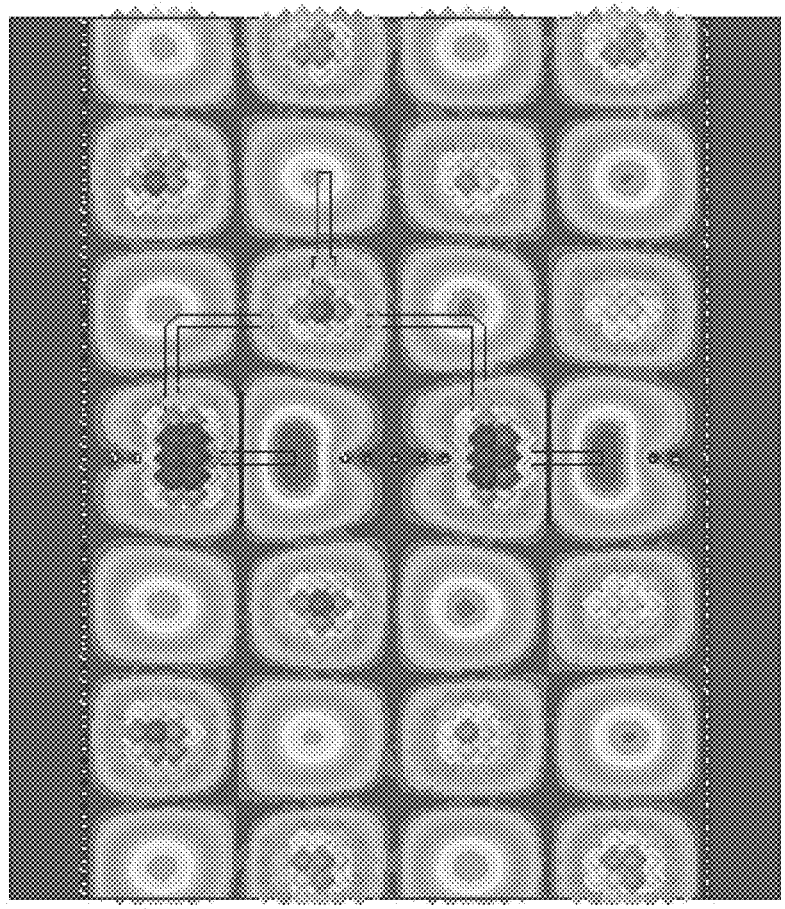
FIG. 23C is a plot showing electric distributions in an SIW of an apparatus for electromagnetic signal transition of FIG. 22A at 9 GHz.
Figure 23C:
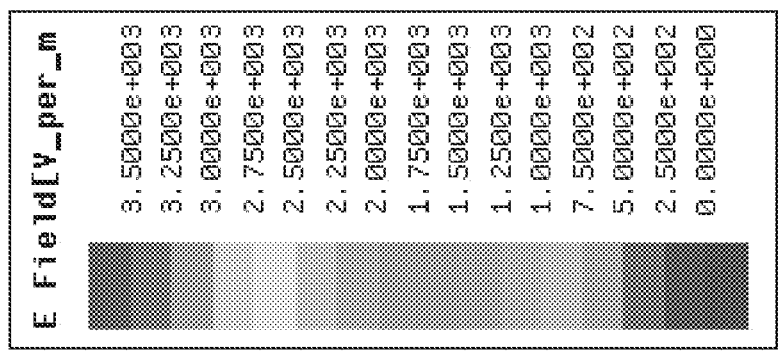
Figure 23D:
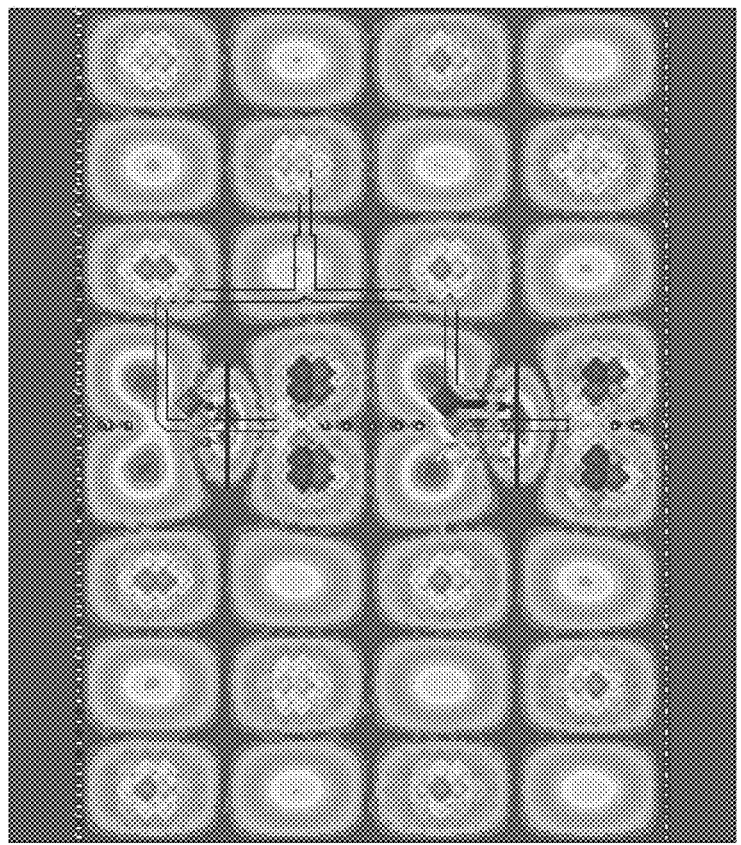
FIG. 23D is a plot showing electric distributions in an SIW of an apparatus for electromagnetic signal transition of FIG. 22A at 10 GHz.
Figure 23D:
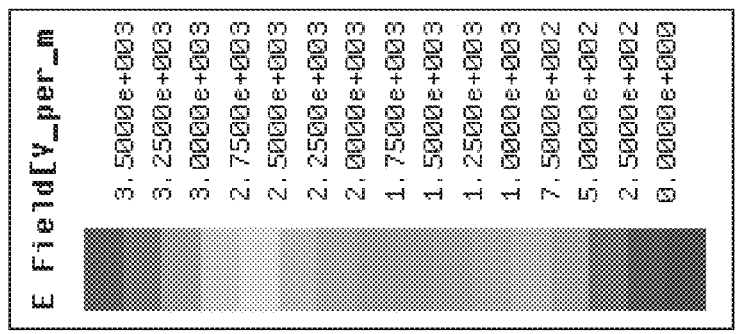

Referring to FIGS. 22A and 22B, there is provided another embodiment of an apparatus 2200 for $TE_{40}$ SIW mode transition. In this embodiment, the 2-Way microstrip divider 2030 is positioned at about a central position in the apparatus 2200 and the SIW 1404, and coupled to the slots 1406 on the SIW 1404. Similar to the apparatus 2000, such structure may also be considered as two parallel transitions apparatus as shown in the previous embodiments working with $TE_{20}$ SIW mode.

With reference to FIGS. 23A to 23D, there are provided the electric field distributions of the apparatus 2000 at the frequency of 7 GHz, 8 GHz, 9 GHz and 10 GHz respectively. The excellent performance of the transition has been demonstrated directly. Only the $TE_{40}$ mode has been excited and transmitted in the SIW 2204 within a broad bandwidth.

Figure 24A:
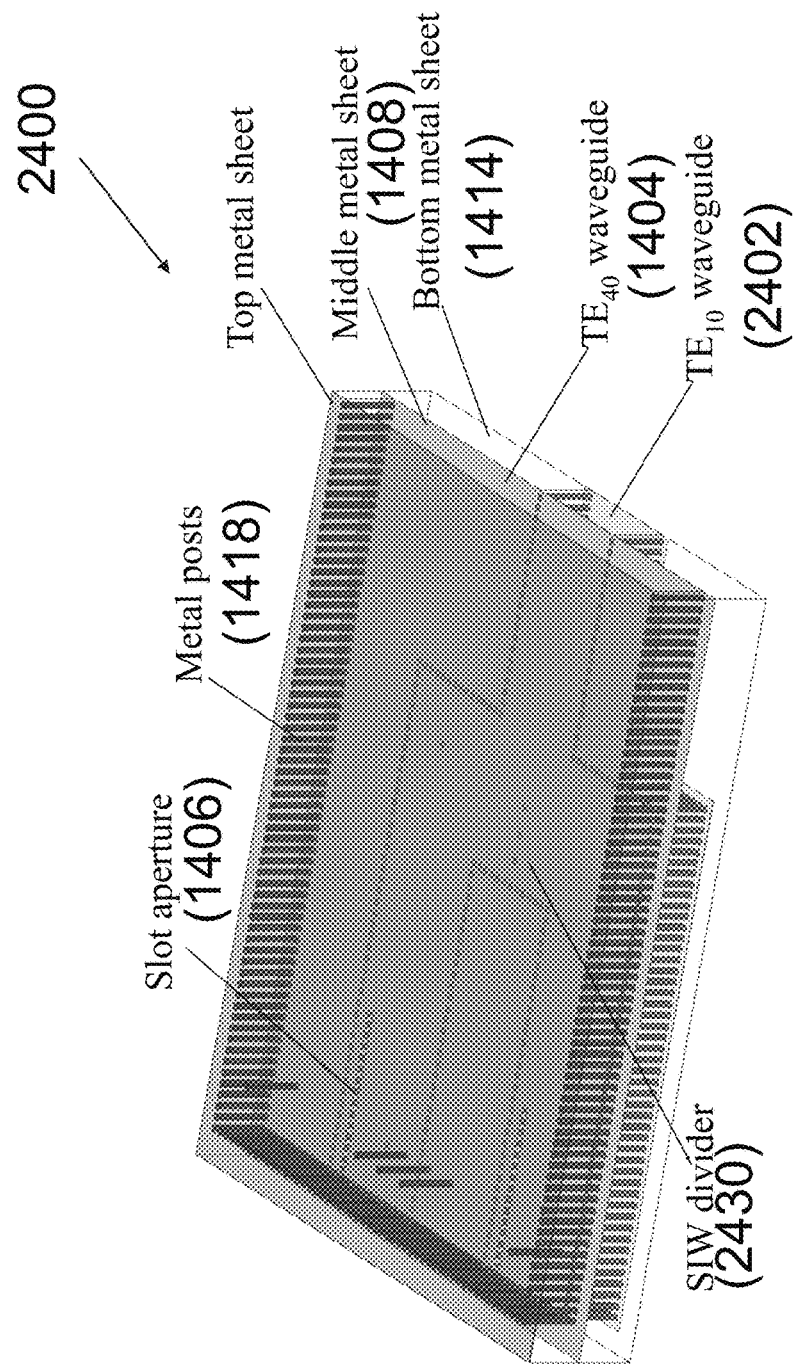
FIG. 24A is a perspective view of an apparatus for electromagnetic signal transition in accordance with an embodiment of the present invention.
Figure 24B:
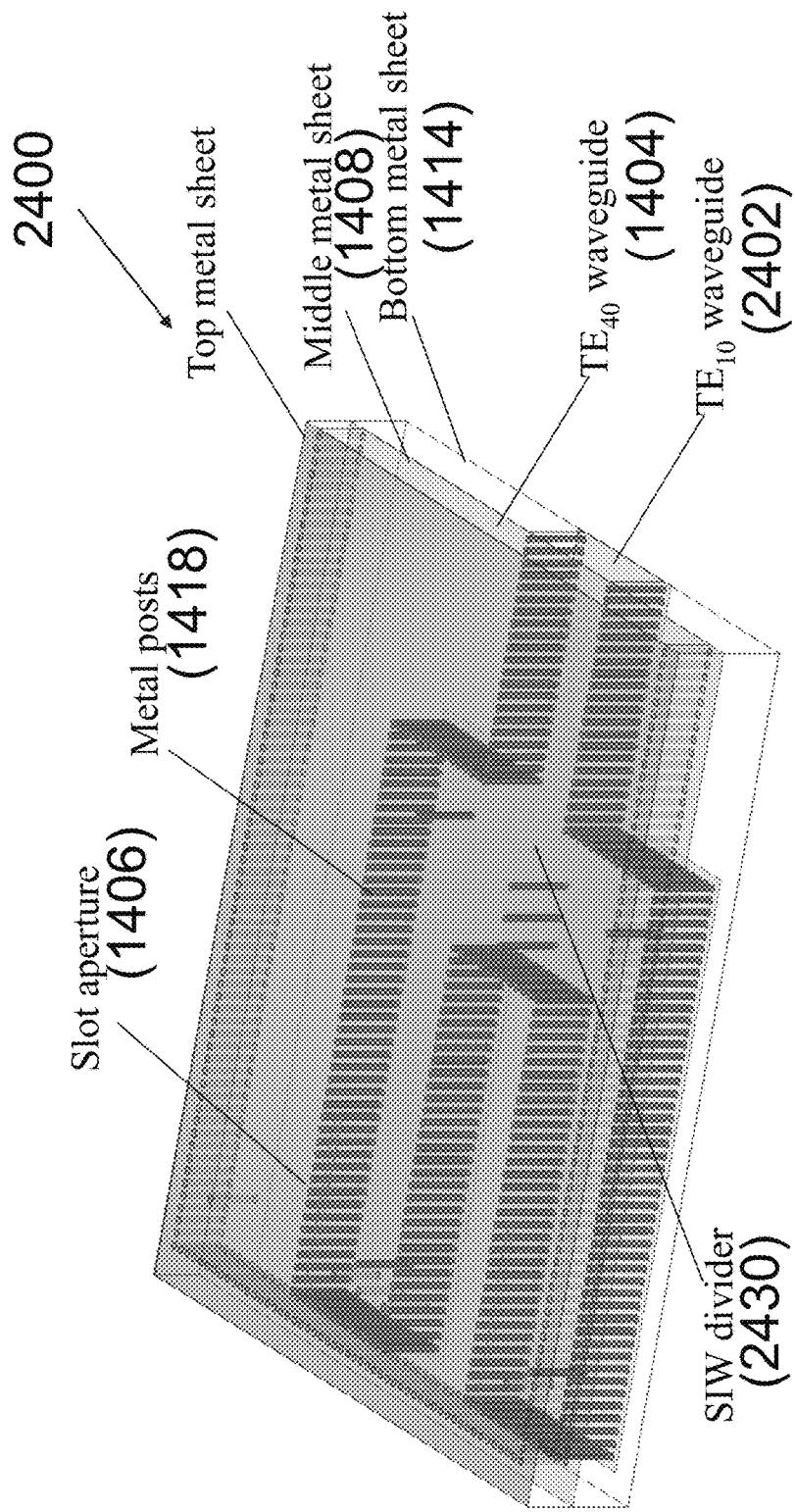
FIG. 24B is another perspective view of the apparatus for electromagnetic signal transition of FIG. 24A.
Figure 24C:
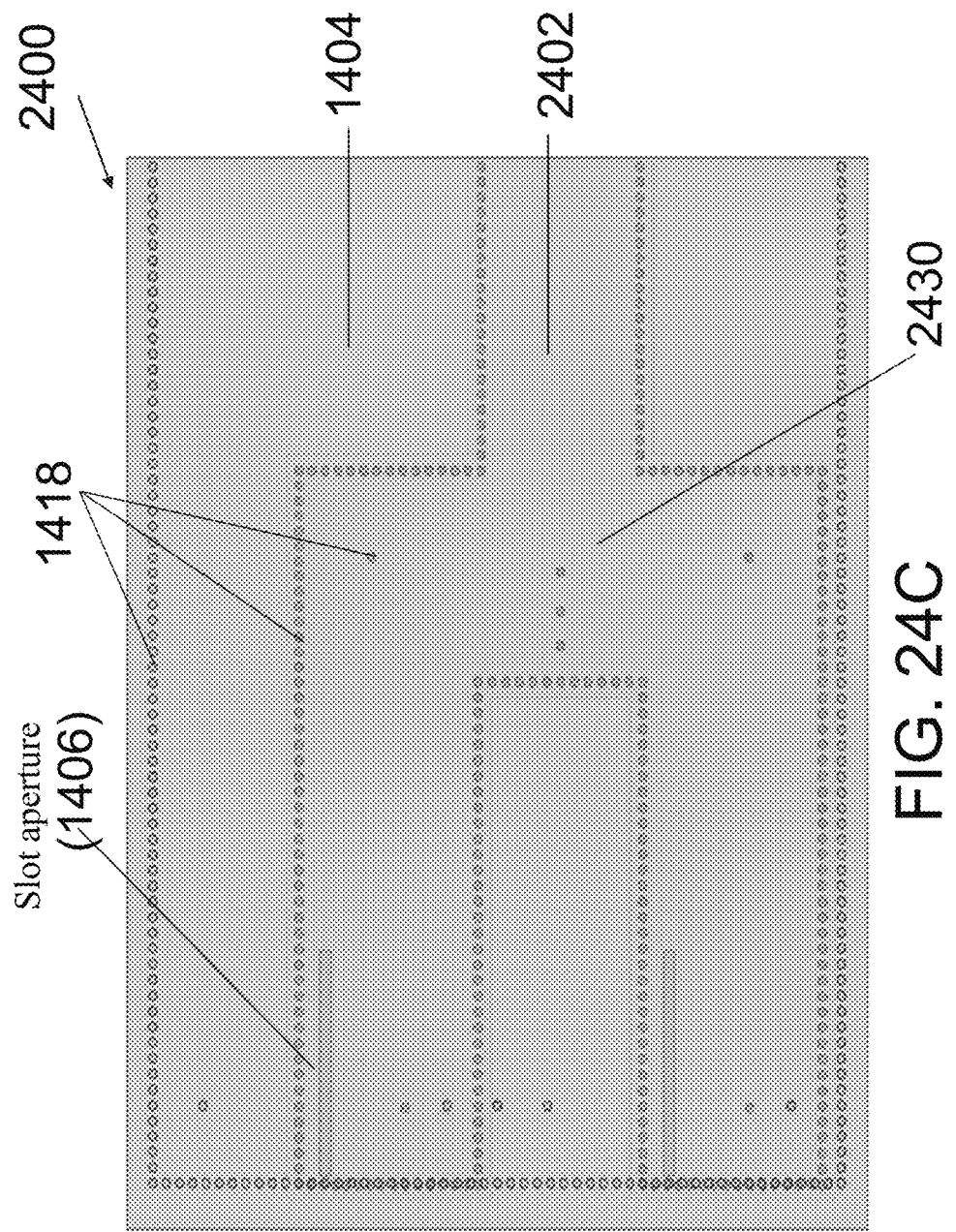
FIG. 24C is a top view of the apparatus for electromagnetic signal transition of FIG. 24A.
Figure 25:
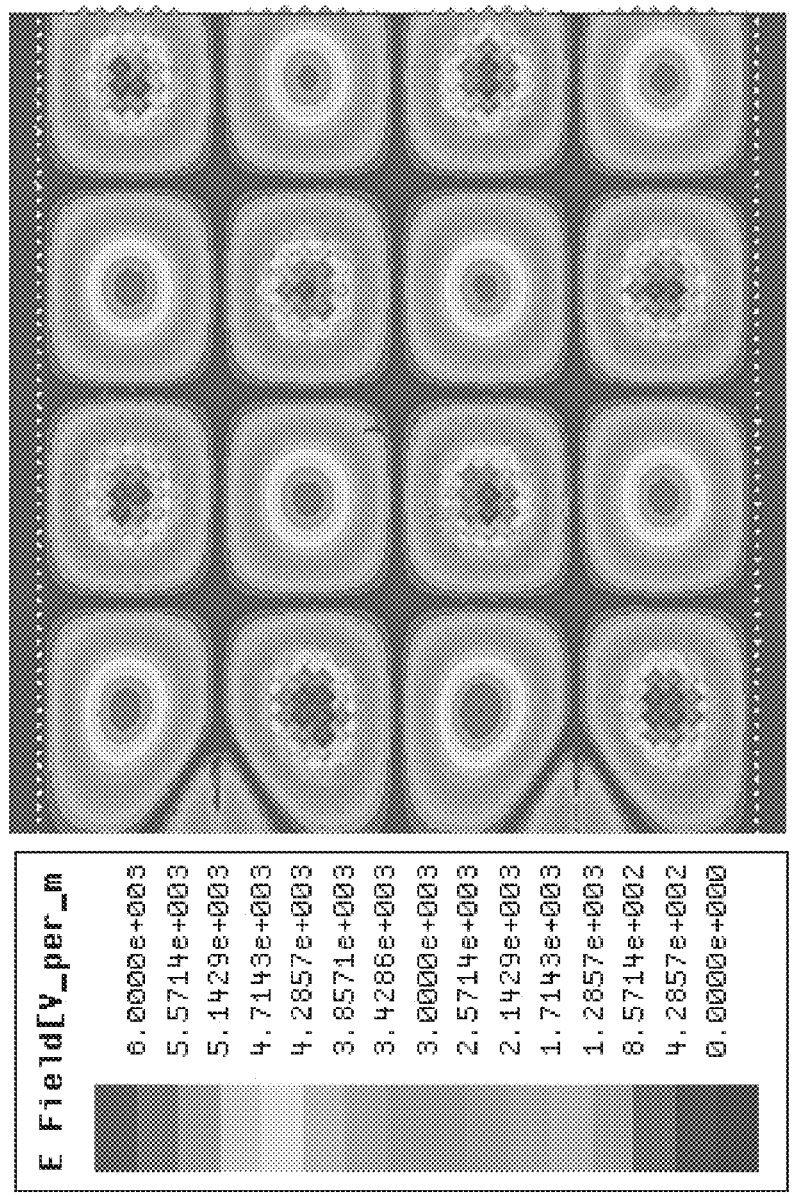
FIG. 25 is a plot showing electric distributions in an SIW of an apparatus for electromagnetic signal transition of FIG. 24A at 10 GHz.
Figure 26:
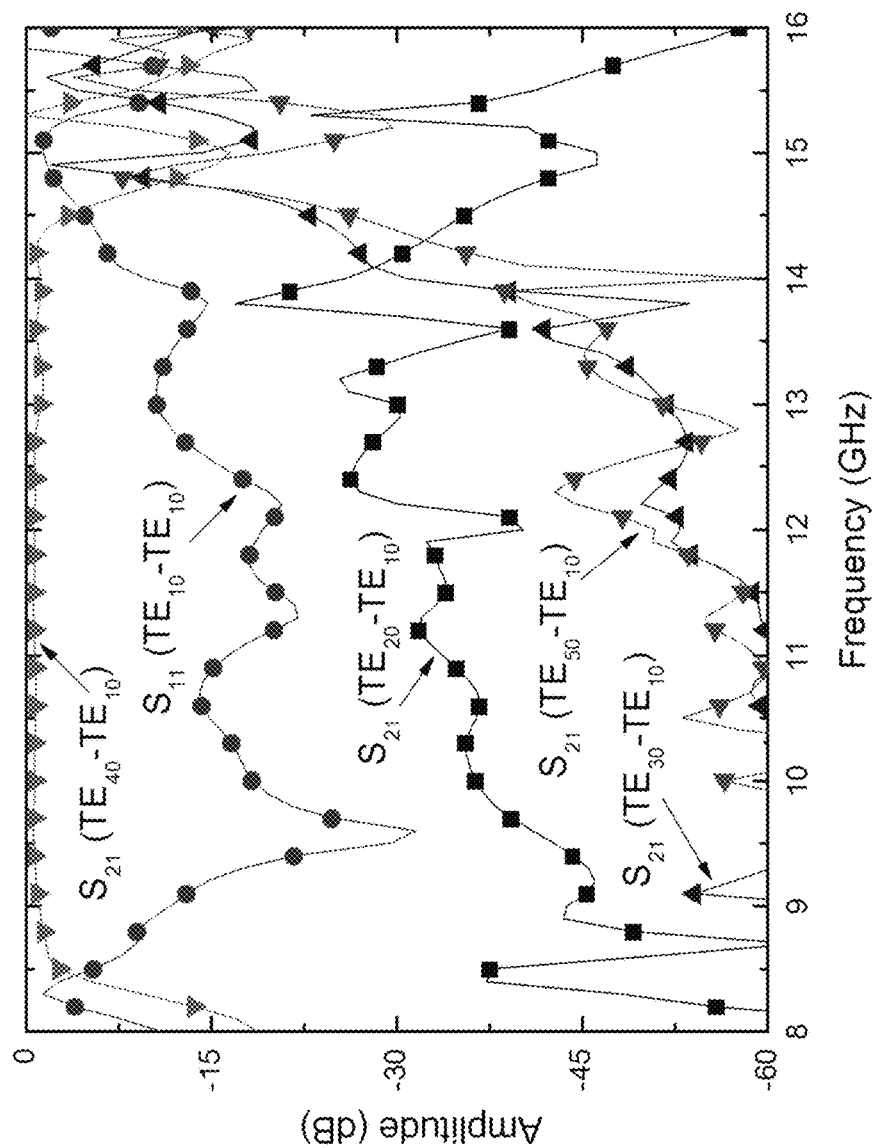
FIG. 26 is a plot showing the excitation performance of an SIW of the apparatus for electromagnetic signal transition of FIG. 24A.

Preferably, the microstrip line in embodiments as shown in FIGS. 20A to 23D can be replaced by SIW and a direct transition between fundamental mode ($TE_{10}$ mode) SIW 2402 and higher order mode SIW would be realized. In an example embodiment, as shown in FIGS. 24A, 24B, and 24C, the $TE_{40}$ SIW mode is excited by using a 2-Way SIW divider 2430 in the apparatus 2400. Similarly, such structure may be considered as two parallel transitions apparatus as shown in the previous embodiments working with $TE_{20}$ SIW mode, and therefore, the $TE_{2N,0}$ SIW mode can be excited by a N-Way SIW divider FIG. 25 shows the excitation performance and electric field distributions of the apparatus 2400 at the frequency of 10 GHz. The excellent performance of the transition has been demonstrated directly. Only the $TE_{40}$ mode has been excited and transmitted in the SIW within a broad bandwidth. The excitation performance is shown in FIG. 26.

Figure 27A:
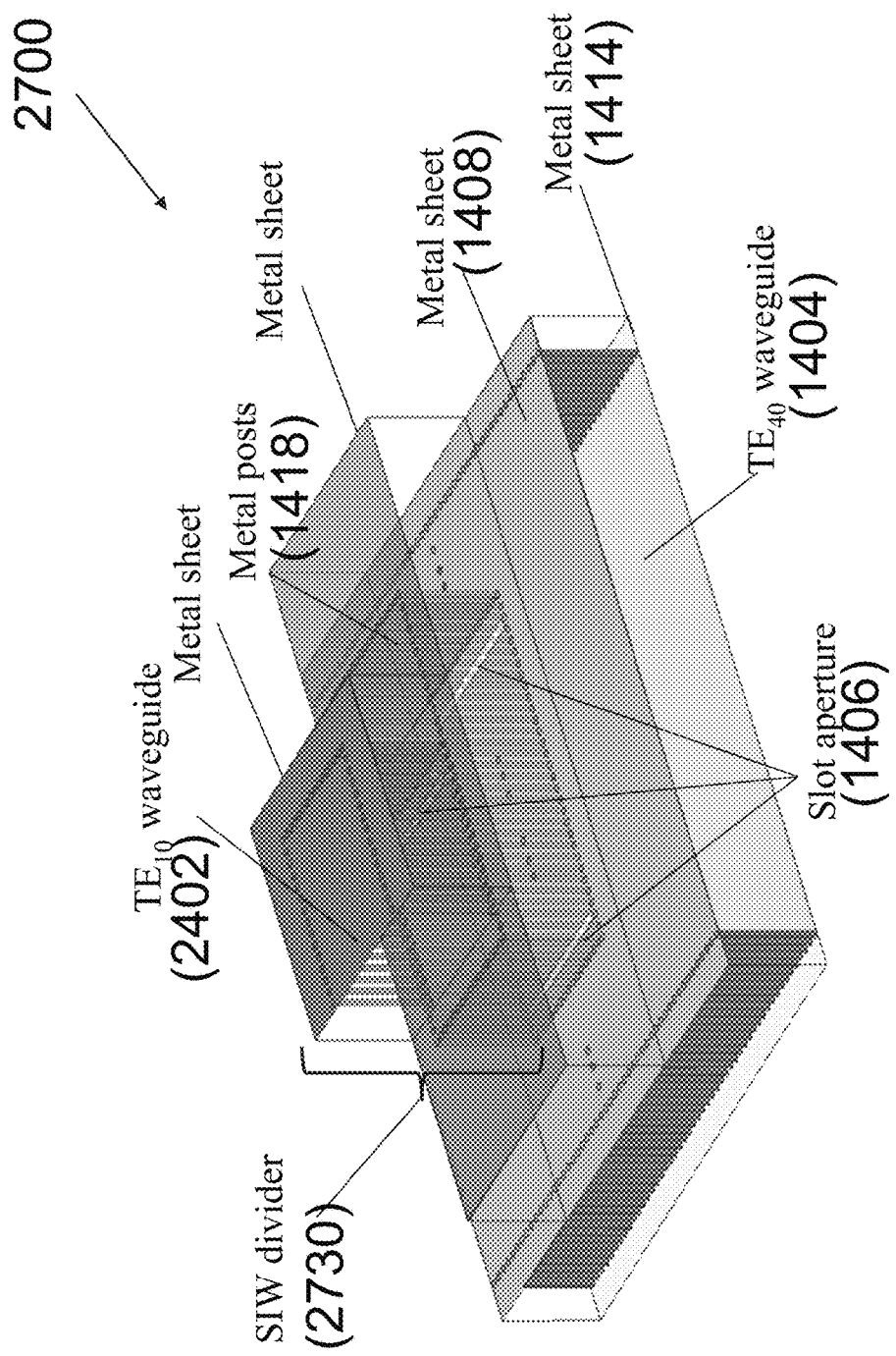
FIG. 27A is a perspective view of an apparatus for electromagnetic signal transition in accordance with an embodiment of the present invention.
Figure 27B:
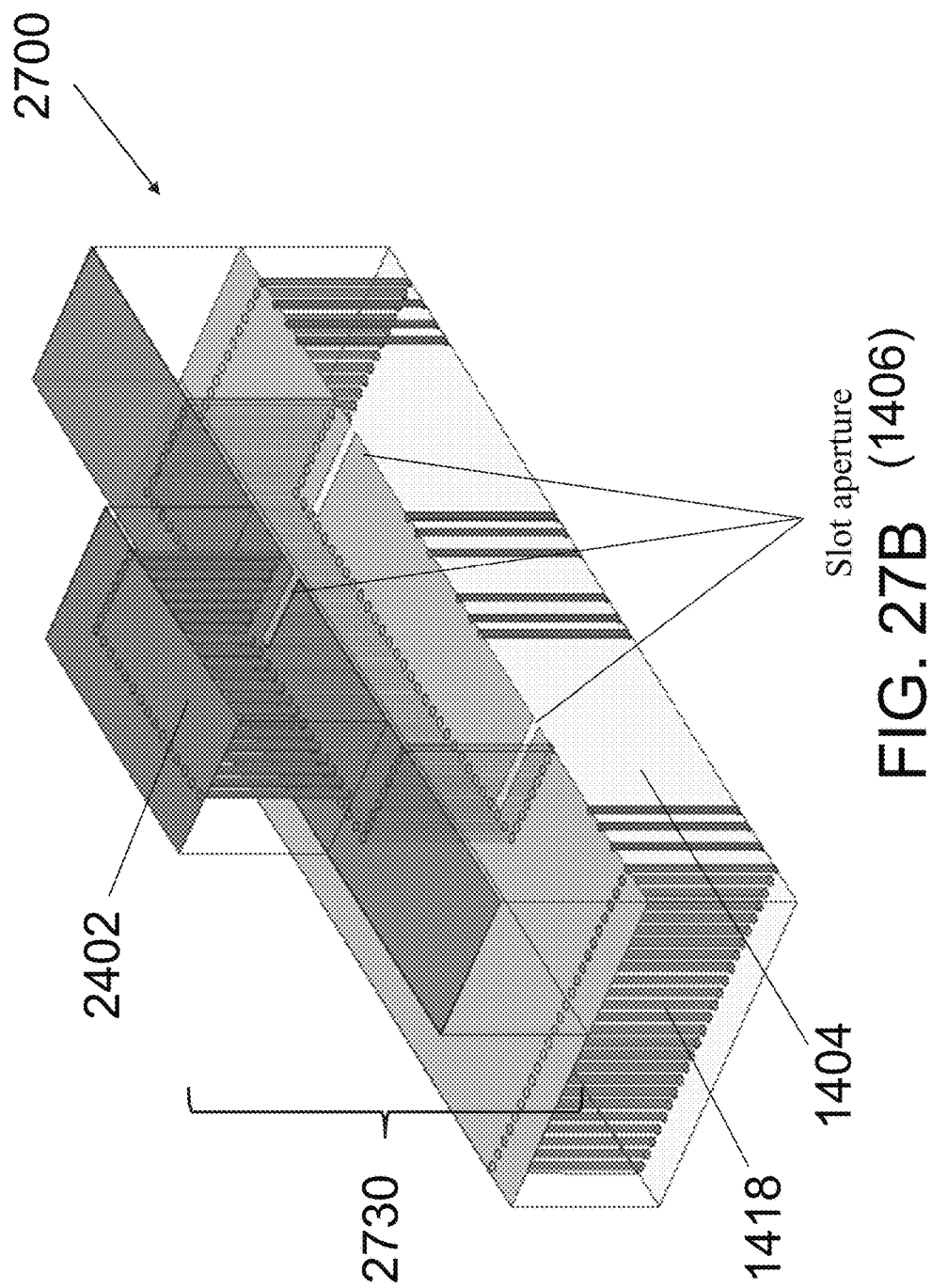
FIG. 27B is another perspective view of the apparatus for electromagnetic signal transition of FIG. 27A.
Figure 27C:
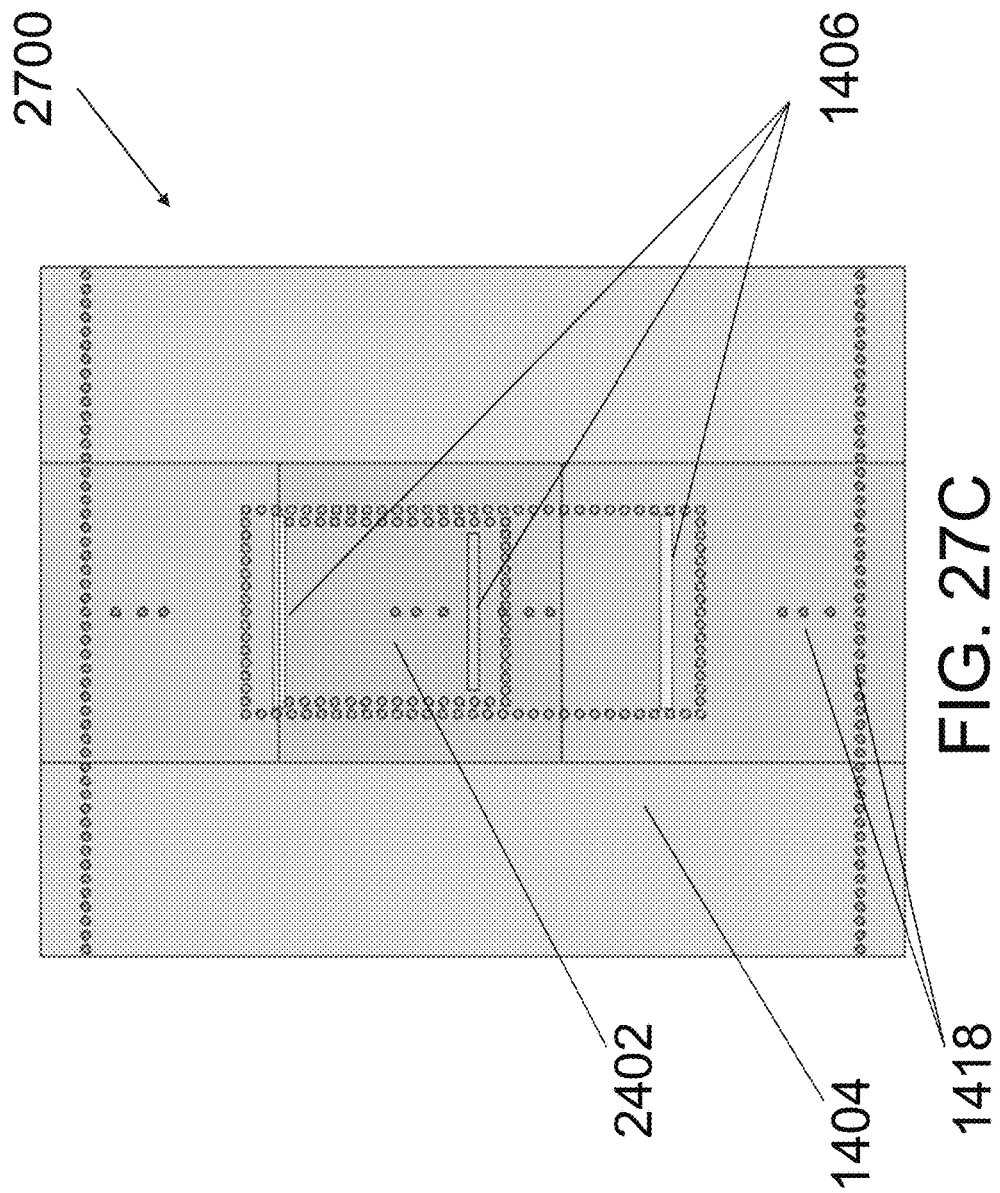
FIG. 27C is a top view of the apparatus for electromagnetic signal transition of FIG. 27A.

Alternatively, the 2-Way SIW divider 2730 may be positioned at about a central position in the apparatus 2700 and the SIW 1404, and coupled to the slots 1406 on the SIW 1404 as shown in FIGS. 27A to 27C, which replaces the 2-Way microstrip divider 2730 in apparatus 2200 as shown in FIGS. 22A and 22B. Similar to the apparatus 2000, such structure may also be considered as two parallel transitions apparatus as shown in the previous embodiments working with $TE_{20}$ SIW mode.

Without deviating from the spirit of the invention, the apparatus for electromagnetic signal transition may be used in various applications of filters, power dividers/combiners, couplers and antennas. In some embodiments, the $TE_{20}$ mode excitation technology and the balun based on the transition may be used in microwave and millimeter wave circuits and antenna feed networks.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A method for electromagnetic signal transition, comprising the steps of:
   receiving an electromagnetic signal having a first physical characteristic arranged to be compatible for the electromagnetic signal to be transmitted on a transmission structure; and
   transmitting the electromagnetic signal to a substrate integrated waveguide, wherein during the transmission of the electromagnetic signal to the substrate integrated waveguide, the first physical characteristic is converted to a second physical characteristic arranged to be compatible for the electromagnetic signal to be transmitted on the substrate integrated waveguide, wherein:
   the substrate integrated waveguide comprises a first metal sheet positioned at a first side of a substrate, and a second metal sheet positioned at a second side opposite to the first side of the substrate,
   the first metal sheet comprises at least one slot thereon, the at least one slot is elongated in shape and includes opposite sides, and
   wherein the electromagnetic signal at the opposite sides of each of the at least one slots are 180° out-of-phase.

2. A method for electromagnetic signal transition in accordance with claim 1, wherein the first physical characteristic and the second physical characteristic are a polarization or a field distribution or both a polarization and a field distribution of the electromagnetic signal.

3. A method for electromagnetic signal transition in accordance claim 2, wherein the first physical characteristic is a first polarization of the electromagnetic signal and the second physical characteristic is a second polarization of the electromagnetic signal, and in said step of transmitting the electromagnetic signal, the first polarization is converted to the second polarization, and the second polarization is perpendicular to the first polarization.

4. A method for electromagnetic signal transition in accordance with claim 1, wherein the electromagnetic signal is excited or transmitted in a higher-order transverse electric mode or both excited and transmitted in a higher-order transvers electric mode.

5. A method for electromagnetic signal transition in accordance with claim 1, wherein the electromagnetic signal is excited or transmitted in a Transverse Electric ($TE_{m0}$) mode or both excited and transmitted in a Transverse Electric ($TE_{m0}$) mode, and m equals to a positive even number.

6. A method for electromagnetic signal transition in accordance with claim 5, wherein the electromagnetic signal is excited by a N-way divider, and N is equal to m divided by two.

7. A method for electromagnetic signal transition in accordance with claim 1, wherein the at least one slot is positioned along a mid line in a longitudinal direction of the first metal sheet.

8. A method for electromagnetic signal transition in accordance with claim 1, wherein the at least one slot includes a slot length less than or equal to two wave-lengths of a center frequency of the electromagnetic field.

9. A method for electromagnetic signal transition in accordance with claim 1, wherein the first metal sheet and the second metal sheet are connected with at least one metal via through the first side and the second side of the substrate.

10. A method for electromagnetic signal transition in accordance with claim 9, wherein a distance between adjacent vias of the at least one metal via is associated with an impedance matching of the electromagnetic signal transition.

11. A method for electromagnetic signal transition in accordance with claim 1, wherein the electromagnetic signal is excited by and received from a microstrip line coupled to the at least one slot of the substrate integrated waveguide.

12. A method for electromagnetic signal transition in accordance with claim 1, wherein the electromagnetic signal is excited by and received from a fundamental mode substrate integrated waveguide coupled to the at least one slot of the substrate integrated waveguide.

13. A method for electromagnetic signal transition in accordance with claim 1, wherein the electromagnetic signal is excited by and received from a slotline feed.

14. A method for electromagnetic signal transition in accordance with claim 13, wherein the slotline feed is connected to the first metal sheet of the substrate integrated waveguide.

15. A method for electromagnetic signal transition in accordance with claim 14, wherein the at least one slot extends from the substrate integrated waveguide to an entire length of the slotline feed.

16. A method for electromagnetic signal transition in accordance with claim 13, wherein the at least one slot is positioned at one end of the first metal sheet.

17. A method for electromagnetic signal transition in accordance with claim 1, wherein the substrate integrated waveguide is embedded in the substrate.

18. An apparatus for electromagnetic signal transition, comprising:
a signal receiving structure arranged to receive an electromagnetic signal having a first physical characteristic arranged to be compatible for the electromagnetic signal to be transmitted on a transmission structure; and
a substrate integrated waveguide arranged to receive the electromagnetic signal transmitted from the signal receiving structure, wherein during the transmission of the electromagnetic signal to the substrate integrated waveguide, the first physical characteristic is converted to a second physical characteristic arranged to be compatible for the electromagnetic signal to be transmitted on the substrate integrated waveguide, wherein:
the substrate integrated waveguide comprises a first metal sheet positioned at a first side of a substrate, and a second metal sheet positioned at a second side opposite to the first side of the substrate,
the first metal sheet comprises at least one slot thereon,
the at least one slot is elongated in shape and includes opposite sides, and
wherein the electromagnetic signal at the opposite sides of each of the at least one slots are 180° out-of-phase.

19. An apparatus for electromagnetic signal transition in accordance with claim 18, wherein the substrate integrated waveguide is embedded in the substrate.

20. A balun device, comprising:
an apparatus for electromagnetic signal transition in accordance with claim 18; and
at least two output terminals connected with the substrate integrated waveguide arranged to transmit a converted electromagnetic signal.

21. An apparatus for electromagnetic signal transition in accordance with claim 18, wherein the signal receiving structure is a microstrip line coupled to the at least one slot of the substrate integrated waveguide, and the electromagnetic signal is excited by and received from the microstrip line.

22. An apparatus for electromagnetic signal transition in accordance with claim 18, wherein the first physical characteristic and the second physical characteristic are a polarization or a field distribution or both a polarization and a field distribution of the electromagnetic signal.

23. An apparatus for electromagnetic signal transition in accordance with claim 18, wherein the electromagnetic signal is excited or transmitted in a higher-order transverse electric mode or both excited and transmitted in a higher-order transverse electric mode.

24. An apparatus for electromagnetic signal transition in accordance with claim 22, wherein the first physical characteristic is a first polarization of the electromagnetic signal and the second physical characteristic is a second polarization of the electromagnetic signal, and in said step of transmitting the electromagnetic signal, the first polarization is converted to the second polarization, and the second polarization is perpendicular to the first polarization.

25. An apparatus for electromagnetic signal transition in accordance with claim 18, wherein the electromagnetic signal is excited or transmitted in a Transverse Electric ($TE_{m0}$) mode or both excited and transmitted in a Transverse Electric ($TE_{m0}$) mode, and m equals to a positive even number.

26. An apparatus for electromagnetic signal transition in accordance with claim 25, wherein the electromagnetic signal is excited by a N-way divider, and N is equal to m divided by two.

27. An apparatus for electromagnetic signal transition in accordance with claim 18, wherein the at least one slot is positioned along a mid line in a longitudinal direction of the first metal sheet.

28. An apparatus for electromagnetic signal transition in accordance with claim 18, wherein the at least one slot includes a slot length less than or equal to two wave-lengths of a center frequency of the electromagnetic field.

29. An apparatus for electromagnetic signal transition in accordance with claim 18, wherein the first metal sheet and the second metal sheet are connected with at least one metal via through the first side and the second side of the substrate.

30. An apparatus for electromagnetic signal transition in accordance with claim 29, wherein a distance between adjacent vias of the at least one metal via is associated with an impedance matching of the electromagnetic signal transition.

31. An apparatus for electromagnetic signal transition in accordance with claim 18, wherein the signal receiving structure is a fundamental mode substrate integrated waveguide coupled to the at least one slot of the substrate integrated waveguide, and the electromagnetic signal is excited by and received from the fundamental mode substrate integrated waveguide.

32. An apparatus for electromagnetic signal transition in accordance with claim 18, wherein the signal receiving structure is a slotline feed, and the electromagnetic signal is excited by and received from the slotline feed.

33. An apparatus for electromagnetic signal transition in accordance with claim 32, wherein the slotline feed is connected to the first metal sheet of the substrate integrated waveguide.

34. An apparatus for electromagnetic signal transition in accordance with claim 33, wherein the at least one slot extends from the substrate integrated waveguide to an entire length of the slotline feed.

35. An apparatus for electromagnetic signal transition in accordance with claim 32, wherein the at least one slot is positioned at one end of the first metal sheet.

* * * * *